(12) United States Patent
Choi et al.

(10) Patent No.: US 12,376,463 B2
(45) Date of Patent: Jul. 29, 2025

(54) DISPLAY DEVICE

(71) Applicant: Samsung Display Co., Ltd., Yongin-si (KR)

(72) Inventors: Chung Sock Choi, Seoul (KR); Sunyoung Jung, Suwon-si (KR); Sunmi Kang, Cheonan-si (KR); Juhoon Kang, Hwaseong-si (KR); Hyunho Kim, Hwaseong-si (KR); Hyungkeun Park, Seoul (KR); Cheol Jang, Uiwang-si (KR); Sanghwan Cho, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 493 days.

(21) Appl. No.: 17/502,747

(22) Filed: Oct. 15, 2021

(65) Prior Publication Data

US 2022/0123264 A1 Apr. 21, 2022

(30) Foreign Application Priority Data

Oct. 16, 2020 (KR) .................. 10-2020-0134667

(51) Int. Cl.
*H10K 59/131* (2023.01)
*G02B 5/18* (2006.01)
(Continued)

(52) U.S. Cl.
CPC ......... *H10K 59/131* (2023.02); *G02B 5/1866* (2013.01); *G06F 3/0412* (2013.01);
(Continued)

(58) Field of Classification Search
CPC ...... H10K 50/85; H10K 59/40; H10K 59/122; H10K 59/35; H10K 59/50; H10K 59/12;
(Continued)

(56) References Cited

U.S. PATENT DOCUMENTS 10,050,234 B2 * 8/2018 Kim ................ H10K 59/8791
10,644,083 B2 5/2020 Lee et al.
(Continued)

FOREIGN PATENT DOCUMENTS

| KR | 10-2016-0072858 | 6/2016 |
| KR | 10-2018-0133024 | 12/2018 |
| KR | 10-2019-0016635 A | 2/2019 |
| KR | 10-2021-0048972 | 5/2021 |

*Primary Examiner* — Bitew A Dinke
(74) *Attorney, Agent, or Firm* — Womble Bond Dickinson (US) LLP

(57) ABSTRACT

A display device includes a display panel and a diffraction pattern layer. The display panel includes pixels. The diffraction pattern layer includes diffraction patterns arranged on the display panel and configured to diffract at least a portion of light from the pixels. The pixels include a first unit pixel and a second unit pixel. The diffraction patterns include first unit diffraction patterns and second unit diffraction patterns. The first unit diffraction patterns are arranged on the first unit pixel. The second unit diffraction patterns are arranged on the second unit pixel. The second unit diffraction patterns have a different planar arrangement than the first unit diffraction patterns.

17 Claims, 36 Drawing Sheets

(51) Int. Cl.
*G06F 3/041* (2006.01)
*G06F 3/044* (2006.01)
*H10K 50/85* (2023.01)
*H10K 59/40* (2023.01)
*H10K 59/80* (2023.01)
*H10K 59/12* (2023.01)
*H10K 59/122* (2023.01)
*H10K 59/35* (2023.01)

(52) U.S. Cl.
CPC .......... *G06F 3/0445* (2019.05); *H10K 50/85* (2023.02); *H10K 59/40* (2023.02); *H10K 59/875* (2023.02); *H10K 59/879* (2023.02); *G06F 3/0446* (2019.05); *G06F 2203/04112* (2013.01); *H10K 59/12* (2023.02); *H10K 59/122* (2023.02); *H10K 59/35* (2023.02)

(58) Field of Classification Search
CPC ............ H10K 50/8426; H10K 59/121; H10K 50/858; G02B 5/1866; G06F 3/0412; G06F 3/0445; G06F 3/0446; G06F 2203/04112; G06F 3/147
See application file for complete search history.

(56) References Cited

U.S. PATENT DOCUMENTS

| | | | |
|---|---|---|---|
| 11,462,718 B2 * | 10/2022 | Choi | H10K 50/854 |
| 11,594,172 B2 * | 2/2023 | Gu | H10K 50/858 |
| 11,747,924 B2 * | 9/2023 | Kim | G06F 3/0412 |
| | | | 345/173 |
| 11,800,743 B2 * | 10/2023 | Choi | G06F 3/0446 |
| 2012/0286258 A1 * | 11/2012 | Naraoka | C09B 57/00 |
| | | | 257/40 |
| 2014/0183462 A1 * | 7/2014 | Lee | H10K 50/844 |
| | | | 257/40 |
| 2017/0250376 A1 * | 8/2017 | Sasaki | H10K 50/852 |
| 2018/0006272 A1 * | 1/2018 | Lee | G06F 3/0445 |
| 2018/0314067 A1 * | 11/2018 | Cho | H10K 50/85 |
| 2018/0321432 A1 * | 11/2018 | Drolet | H10K 50/858 |
| 2018/0350883 A1 * | 12/2018 | Lee | G02B 27/4233 |
| 2019/0088904 A1 * | 3/2019 | Cho | G09G 3/3208 |
| 2019/0094541 A1 * | 3/2019 | Choi | G02B 27/0955 |
| 2019/0363297 A1 * | 11/2019 | Park | G06F 3/0421 |
| 2020/0028120 A1 * | 1/2020 | Sugitani | G02F 1/0316 |
| 2020/0111995 A1 * | 4/2020 | Eom | H10K 50/858 |
| 2020/0259123 A1 * | 8/2020 | Yang | G02B 30/22 |
| 2021/0126227 A1 | 4/2021 | Choi et al. | |
| 2022/0102440 A1 * | 3/2022 | Zeng | H10K 59/40 |
| 2024/0032327 A1 * | 1/2024 | Choi | H10K 59/40 |

* cited by examiner

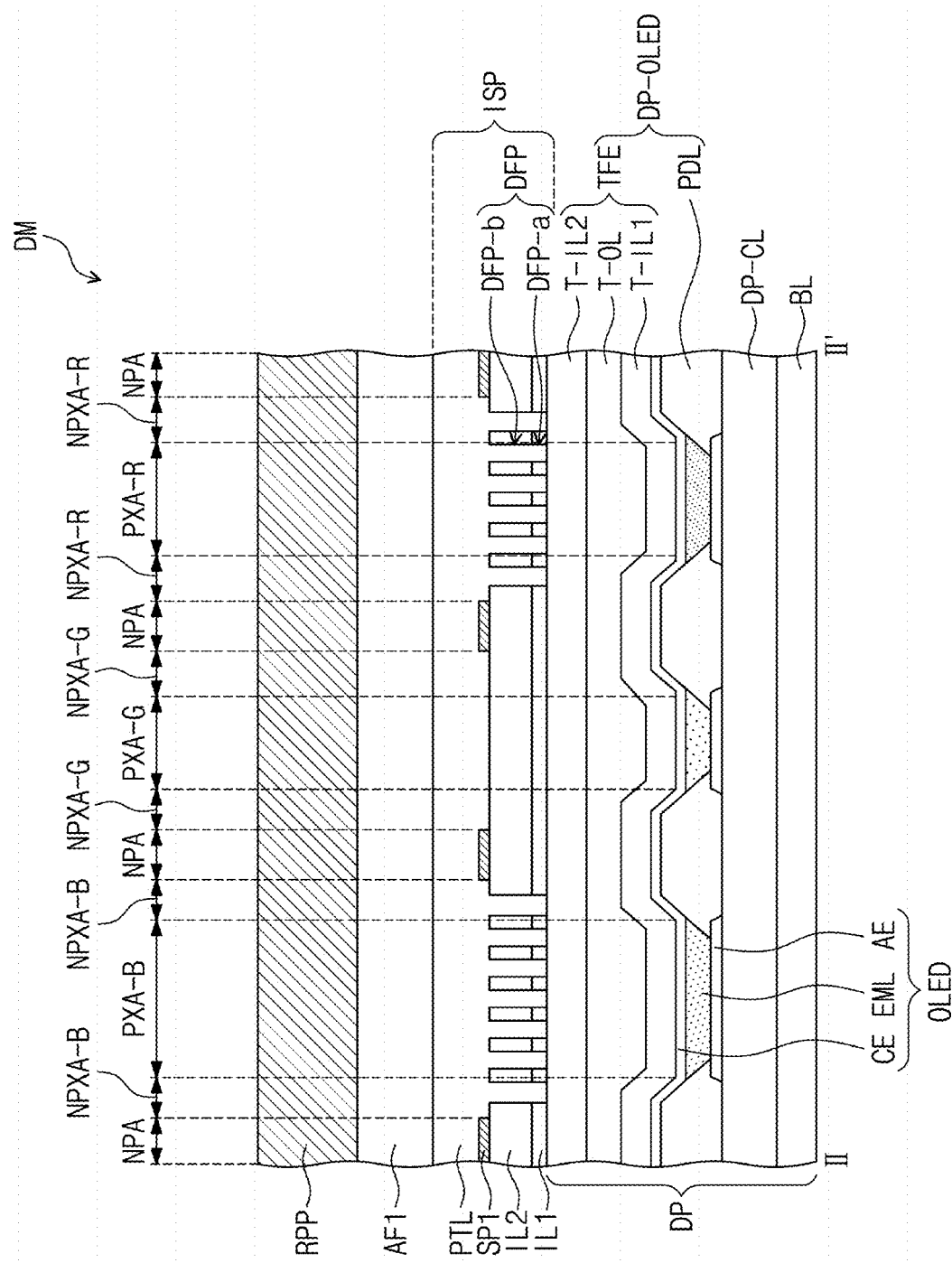

DISPLAY DEVICE

CROSS-REFERENCE TO RELATED APPLICATIONS

This application claims priority to and the benefit of Korean Patent Application No. 10-2020-0134667, filed Oct. 16, 2020, which is hereby incorporated by reference for all purposes as if fully set forth herein.

BACKGROUND

Field

Various embodiments generally relate to a display device, and more particularly, to a display device having enhanced viewing angles and improved azimuth properties.

Discussion

Electronic devices, such as a smartphone, a tablet, a laptop computer, a smart television, and the like, are being developed. These electronic devices typically include a display device for providing information. With the advancement of multimedia, display devices have increasingly become more important. In response, various types of display devices, such as a liquid crystal display (LCD) and an organic light emitting display (OLED), are being used.

An organic light emitting display typically includes an organic light emitting diode to generate light. Light emitting properties of the organic light emitting diode, however, can deteriorate at a side as compared with a front. This deterioration may lead to deterioration in a side viewing angle as compared with a front viewing angle of an organic light emitting display.

The above information disclosed in this section is only for understanding the background of the inventive concepts, and, therefore, may contain information that does not form prior art.

SUMMARY

Some aspects provide a display device capable of improving viewing angle properties, as well as reducing variations in color difference values according to azimuth.

Additional aspects will be set forth in the detailed description which follows, and, in part, will be apparent from the disclosure, or may be learned by practice of the inventive concepts.

According to an embodiment, a display device includes a display panel and a diffraction pattern layer. The display panel includes pixels. The diffraction pattern layer includes diffraction patterns arranged on the display panel and configured to diffract at least a portion of light from the pixels. The pixels include a first unit pixel and a second unit pixel. The diffraction patterns include first unit diffraction patterns and second unit diffraction patterns. The first unit diffraction patterns are arranged on the first unit pixel. The second unit diffraction patterns are arranged on the second unit pixel. The second unit diffraction patterns have a different planar arrangement than the first unit diffraction patterns.

According to an embodiment, a display device includes a display panel and an input sensing unit. The display panel includes pixels. The input sensing unit is disposed on the display panel. The input sensing unit includes a first insulating layer disposed on the display panel, a first conductive layer disposed on the first insulating layer, a second insulating layer covering the first conductive layer, and a second conductive layer disposed on the second insulating layer. The pixels include a first unit pixel and a second unit pixel. At least one of the first conductive layer and the second conductive layer includes diffraction patterns. The diffraction patterns include first unit diffraction patterns arranged on the first unit pixel and second unit diffraction patterns arranged on the second unit pixel. The second unit diffraction patterns have a different planar arrangement than the first unit diffraction patterns.

According to an embodiment, a display device includes a display panel and a diffraction pattern layer. The display panel includes first pixels configured to generate first light and second pixels configured to generate second light. The second light has a different wavelength range than the first light. The diffraction pattern layer includes first diffraction patterns arranged on the display panel and second diffraction patterns arranged on the display panel. The first diffraction patterns are configured to diffract at least a portion of the first light. The second diffraction patterns are configured to diffract at least a portion of the second light. The first pixels include a $1\text{-}1^{st}$ sub-pixel and a $1\text{-}2^{nd}$ sub-pixel. The second pixels include a $2\text{-}1^{st}$ sub-pixel and a $2\text{-}2^{nd}$ sub-pixel. The first diffraction patterns include $1\text{-}1^{st}$ sub-diffraction patterns arranged on the $1\text{-}1^{st}$ sub-pixel, and $1\text{-}2^{nd}$ sub-diffraction patterns arranged on the $1\text{-}2^{nd}$ sub-pixel. The second diffraction patterns include $2\text{-}1^{st}$ sub-diffraction patterns arranged on the is $2\text{-}1^{st}$ sub-pixel, and $2\text{-}2^{nd}$ sub-diffraction patterns arranged on the $2\text{-}2^{nd}$ sub-pixel. At least two among the $1\text{-}1^{st}$ sub-diffraction patterns, the $1\text{-}2^{nd}$ sub-diffraction patterns, the $2\text{-}1^{st}$ sub-diffraction patterns, and the $2\text{-}2^{nd}$ sub-diffraction patterns have different planar arrangements.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts. In the drawings:

FIGS. 14A, 14B, 14C, 14D, 14E, 14F, 14G, 14H, and 14I are cross-sectional views of a display module according to various embodiments.

DETAILED DESCRIPTION OF SOME EMBODIMENTS

Figure 1A:
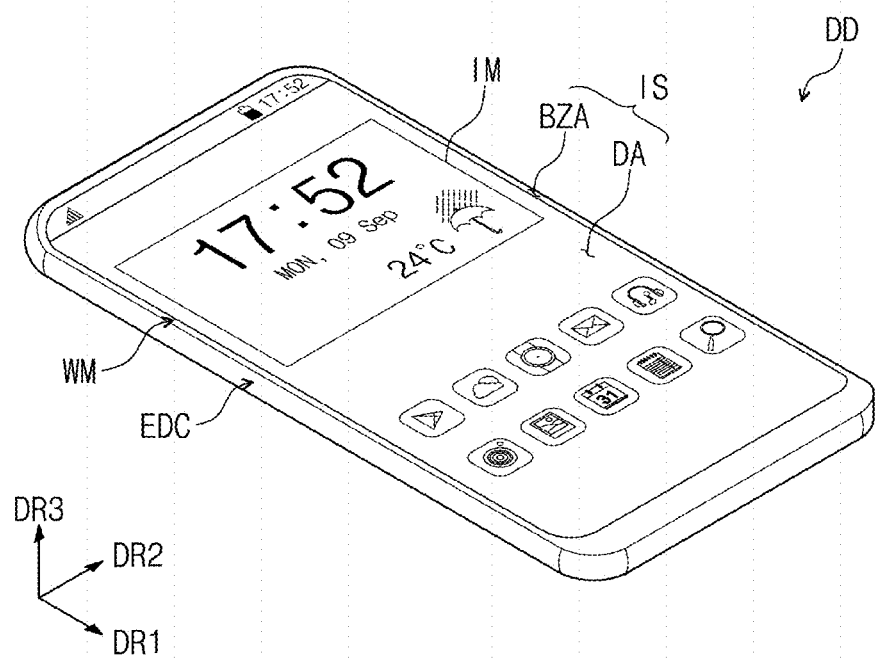
FIG. 1A is a perspective view of a display device according to an embodiment.

In the following description, for the purposes of explanation, numerous specific details are set forth in order to provide a thorough understanding of various embodiments. As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly disposed," "directly connected to," or "directly coupled to" another element, there are no intervening elements present. For instance, "directly disposed" may be used to indicate disposition of two elements without additional elements, such as an adhesive member, between the two elements. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

Figure 1B:
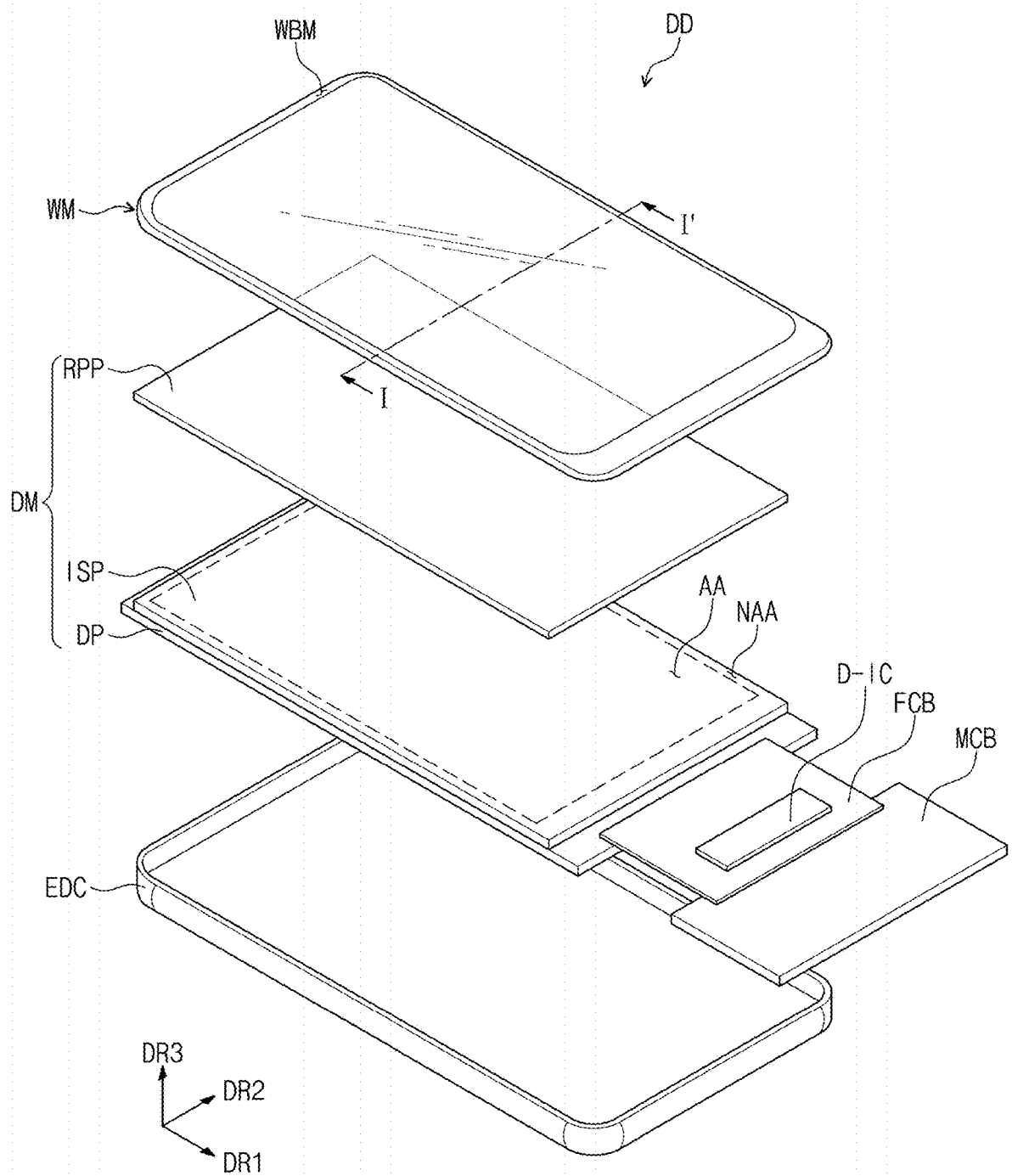
FIG. 1B is an exploded perspective view of a display device according to an embodiment.
Figure 1C:
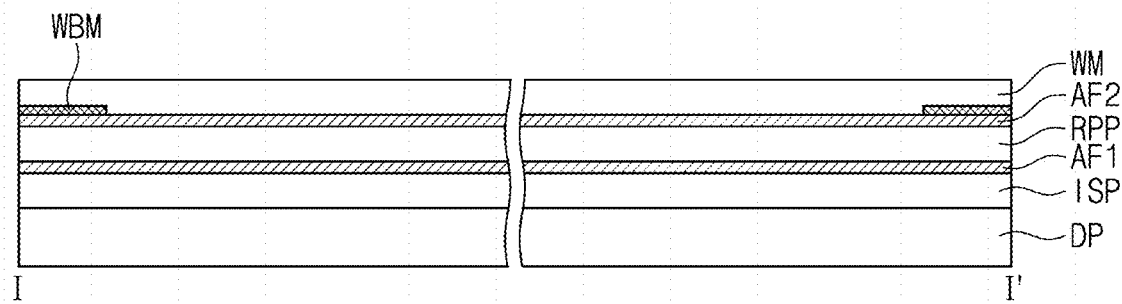
FIGS. 1C and 1D are cross-sectional views of a display device according to some embodiments.
Figure 1D:
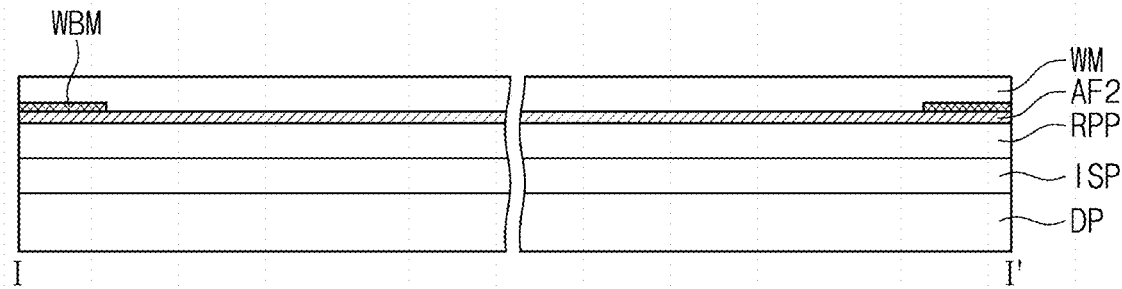

FIG. 1A is a perspective view of a display device according to an embodiment. FIG. 1B is an exploded perspective view of a display device according to an embodiment. FIGS. 1C and 1D are cross-sectional views of a display device according to some embodiments. It is noted that FIGS. 1C and 1D are cross-sectional views taken along sectional line I-I' shown in FIG. 1B according to some embodiments.

Referring to FIGS. 1A to 1D, a display device DD may be a device activated according to electrical signals. The display device DD may be utilized in association with various devices. For example, the display device DD may be applied to various electronic devices, such as a smart watch, a tablet, a laptop, a computer, a smart television, and the like.

The display device DD may display an image IM towards (or in) a third direction DR3 on a display surface IS, which may be parallel to a plane defined by a first direction DR1 and a second direction DR2, respectively. The display surface on which the image IM is displayed may correspond to a front surface IS of the display device DD. The image IM may include a still image and/or a dynamic image.

In various embodiments, a front surface IS (or an upper surface) and a rear surface (or a lower surface) of respective members are defined with respect to a direction in which the image IM is displayed. For example, the front surface IS and the rear surface may oppose each other in the third direction DR3 and the normal direction of each of the front surface IS and the rear surface may be parallel to the third direction DR3.

The separation distance between the front surface IS and the rear surface in the third direction DR3 may correspond to a thickness in the third direction DR3 of the display device DD. It is noted, however, that the directions indicated by the first to third directions DR1, DR2, and DR3 are relative concepts, and may thus, be changed to other directions.

The display device DD may detect external inputs applied from the outside. The external inputs may include various forms of inputs provided from the outside the display device DD. The external inputs applied from the outside may be provided in various forms.

For example, the external inputs may include an external input (e.g., hovering input) applied when approaching the display device DD or being adjacent by a predetermined distance, as well as contact by a part of a user's body, such as a user's hand. In addition, the external inputs may have various forms, such as force, pressure, temperature, light, etc.

The front surface IS of the display device DD may be divided into a display area DA and a bezel area BZA. The display area DA may be an area in which an image IM is displayed. Users can view the image IM through the display area DA. Although the display area DA is shown having a rectangular shape with vertices being rounded, this is merely illustrative. The display area DA may have various shapes and is not limited to any one embodiment.

The bezel area BZA is adjacent to the display area DA. The bezel area BZA may have a predetermined color. The bezel area BZA may surround the display area DA. As such, the shape of the display area DA may be substantially defined by the bezel area BZA; however, this is merely illustrative. The bezel area BZA may be disposed adjacent to only one side of the display area DA, or may be omitted. The display device DD according to an embodiment may include various embodiments and is not limited to any one embodiment.

As shown in FIGS. 1B and 1D, the display device DD may include a window WM, an external case EDC, and a display module DM. The display module DM may include a display panel DP, an input sensing unit ISP, and an anti-reflection unit RPP.

The window WM may be formed of a transparent material capable of allowing images to be transmitted therethrough. For example, the window WM may be formed of at least one of glass, sapphire, plastic, etc. Although the window WM is shown as a single layer, the window WM is not limited thereto and may include a plurality of layers. The bezel area BZA of the display device DD may be provided as an area in which a material including a predetermined color is substantially printed on an area of the window WM. In an embodiment, the window WM may include a bezel pattern WBM for defining the bezel area BZA. The bezel pattern WBM is a colored organic film and may be formed, for example, through a coating method.

The display panel DP according to an embodiment may be a light emitting display panel, and is not particularly limited. For example, the display panel DP may be an organic light emitting display panel, a quantum dot light emitting display panel, etc. An emission layer of the organic light emitting display panel may include an organic light emitting material. An emission layer of the quantum dot light emitting display panel may include one or more of quantum dots, quantum rods, etc. Hereinafter, the display panel DP will be described as an organic light emitting display panel.

The input sensing unit ISP may be disposed directly on the display panel DP. According to an embodiment, the input sensing unit ISP may be formed on the display panel DP through a continuous process. As such, when the input sensing unit ISP is disposed directly on the display panel DP, an adhesive film is not disposed between the input sensing unit ISP and the display panel DP.

The display panel DP generates images, and the input sensing unit ISP acquires coordinate information of external inputs (e.g., a touch event).

The anti-reflection unit RPP reduces reflectance of external light incident from an upper side of the window WM. The anti-reflection unit RPP according to an embodiment may include a retarder and a polarizer. The retarder may be a film type or a liquid crystal coating type, and may include a λ/2 retarder and/or a λ/4 retarder. The polarizer may also be a film type or a liquid crystal coating type. The film type may include a stretchable synthetic resin film, and the liquid crystal coating type may include liquid crystals arranged in a predetermined arrangement. The retarder and the polarizer may be implemented as one polarizing film. The anti-reflection unit RPP may further include a protective film disposed above or below the polarizing film.

The anti-reflection unit RPP according to an embodiment may include color filters. The color filters may have a predetermined arrangement. In the anti-reflection unit RPP, the arrangement of color filters may be determined in consideration of emission colors of pixels included in the display panel DP. In addition, the anti-reflection unit RPP may further include a black matrix adjacent to the color filters.

The anti-reflection unit RPP according to an embodiment may include a destructive interference structure. For example, the destructive interference structure may include a first reflection layer and a second reflection layer disposed on different layers. First reflection light and second reflection light, which are respectively reflected from the first reflection layer and the second reflection layer, may destructively interfere with each other, thereby reducing reflectance of the external light.

The anti-reflection unit RPP may be disposed on the input sensing unit ISP. For example, the anti-reflection unit RPP may be disposed between the input sensing unit ISP and the window WM. The input sensing unit ISP, the anti-reflection unit RPP, and the window WM may be bonded to one another through an adhesive film. A first adhesive film AF1 is disposed between the input sensing unit ISP and the anti-reflection unit RPP, and a second adhesive film AF2 is disposed between the anti-reflection unit RPP and the window WM. Accordingly, the anti-reflection unit RPP is bonded to the input sensing unit ISP through the first adhesive film AF1, and the window WM is bonded to the anti-reflection unit RPP through the second adhesive film AF2. In an embodiment, the first adhesive film AF1 and the second adhesive film AF2 may include an optically clear adhesive film (OCA). However, the first adhesive film AF1 and the second adhesive film AF2 are not limited thereto, and may include a conventional adhesive or a gluing agent. For example, the first adhesive film AF1 and the second adhesive film AF2 may include an optically clear resin (OCR) or a pressure sensitive adhesive film (PSA).

In some embodiments, at least one of the first adhesive film AF1 and the second adhesive film AF2 may be omitted. For example, as shown in FIG. 1D, the first adhesive film may be omitted, and the anti-reflection unit RPP may be disposed directly on the input sensing unit ISP. When the anti-reflection unit RPP is disposed directly on the input sensing unit ISP, the anti-reflection unit RPP may include color filters and a black matrix adjacent to the color filters.

The display module DM may display images according to electrical signals and transmit/receive information on external inputs. The display module DM may include an active area AA and a peripheral area NAA. The active area AA may be defined as an area for outputting images provided from the display module DM.

The peripheral area NAA is adjacent to the active area AA. For example, the peripheral area NAA may surround the active area AA. However, this is merely illustrative, and the peripheral area NAA may be defined in various forms, and is not limited to any one embodiment. According to an embodiment, the active area AA of the display module DM may correspond to at least a portion of the display area DA.

The display module DM may further include a main circuit board MCB, a flexible circuit board FCB, and a driving chip D-IC.

The main circuit board MCB may be connected to the flexible circuit board FCB to be electrically connected to the display panel DP. The main circuit board MCB may include a plurality of driving elements. The plurality of driving elements may include a circuit unit for driving the display panel DP.

The flexible circuit board FCB is connected to the display panel DP to electrically connect the display panel DP and the main circuit board MCB. The driving chip D-IC may be mounted on the flexible circuit board FCB.

The driving chip D-IC may include driving elements, for example, a data driving circuit, for driving pixels of the display panel DP. The flexible circuit board FCB according to an embodiment is shown as one unit, but is not limited thereto, and may be provided in plurality to be connected to the display panel DP.

FIG. 1B illustrates a structure in which the driving chip D-IC is mounted on the flexible circuit board FCB, but embodiments are not limited thereto. For example, the driving chip D-IC may be directly mounted on the display panel DP. In this case, the portion on which the driving chip D-IC of the display panel DP is mounted may be bent and disposed on a rear surface of the display module DM.

The input sensing unit ISP may be electrically connected to the main circuit board MCB through the flexible circuit board FCB. However, embodiments are not limited thereto. For example, the display module DM may additionally include a separate flexible circuit board for electrically connecting the input sensing unit ISP with the main circuit board MCB.

The outer case EDC accommodates the display module DM. The outer case EDC may combine with the window WM to define an exterior of the display device DD. The outer case EDC absorbs shocks applied from the outside and prevents foreign substances/moisture from penetrating into the display module DM to protect the components received in the outer case EDC. In an embodiment, the outer case EDC may be provided in a form in which storage members combine with one another.

The display device DD according to an embodiment may further include an electronic module containing various functional modules for operating the display module DM, a power supply module for supplying power for the overall operation of the display device DD, and a bracket combining with the display module DM and/or the outer case EDC to separate a space inside the display device DD.

Figure 2:
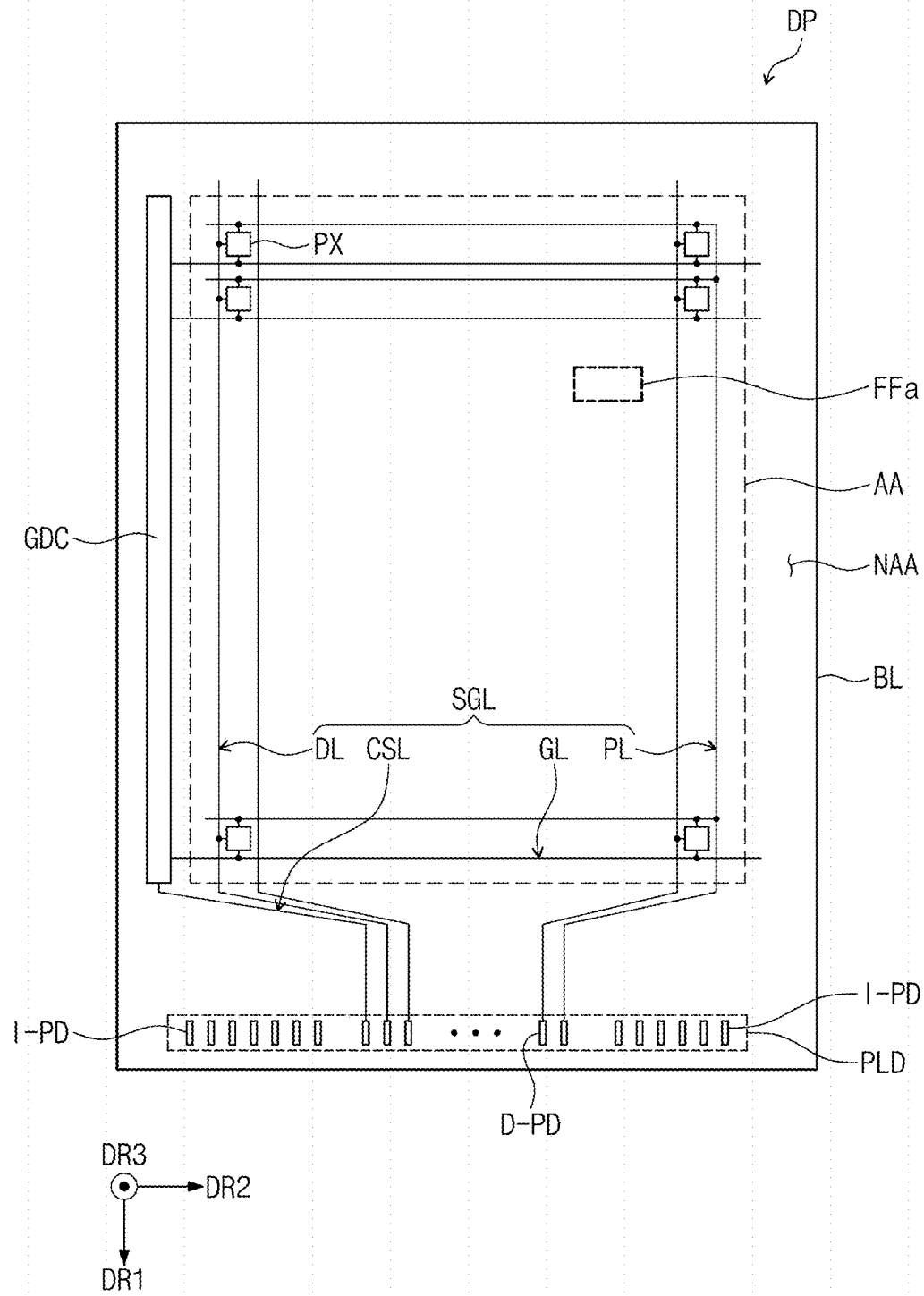
FIG. 2 is a plan view of a display panel according to an embodiment.
Figure 3:
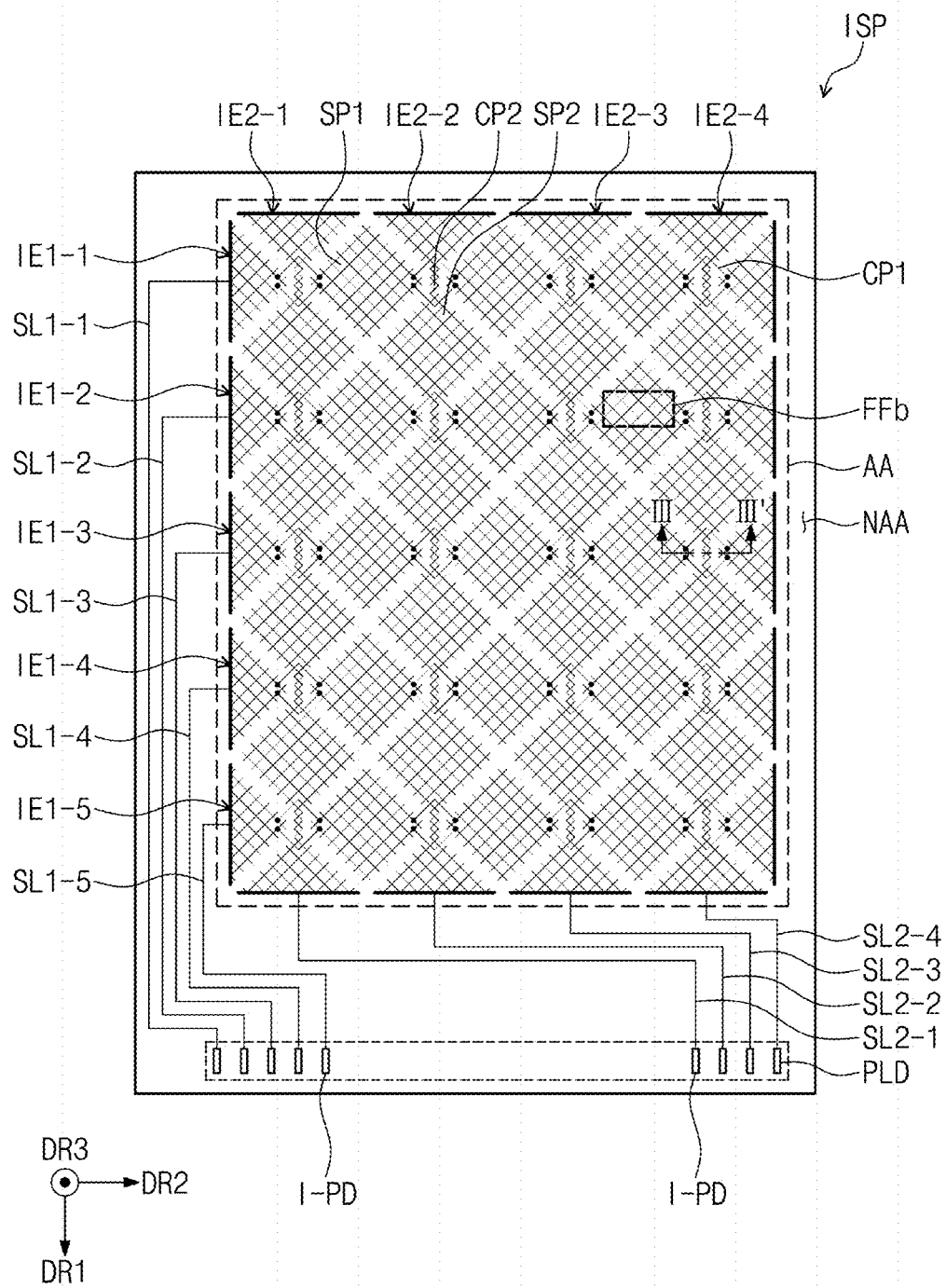
FIG. 3 is a plan view of an input sensing unit according to an embodiment.

FIG. 2 is a plan view of a display panel according to an embodiment. FIG. 3 is a plan view of an input sensing unit according to an embodiment.

Referring to FIG. 2, the display panel DP may include a driving circuit GDC, a plurality of signal lines SGL, and a plurality of pixels PX. The display panel DP may further include a pad portion PLD disposed in the peripheral area NAA. The pad portion PLD includes pixel pads D-PD connected to a corresponding signal line among the plurality of signal lines SGL.

The pixels PX are disposed in the active area AA. Each of the pixels PX includes an organic light emitting diode OLED (see, e.g., FIG. 12A) and a pixel driving circuit connected thereto. The driving circuit GDC, the signal lines SGL, the pad portion PLD, and the pixel driving circuit may be included in a display circuit layer DP-CL shown in, for instance, FIG. 12A.

The driving circuit GDC may include a gate driving circuit. The gate driving circuit generates a plurality of gate signals (hereinafter, gate signals) and sequentially outputs the gate signals to a plurality of gate lines GL (hereinafter, gate lines) that will be described later. The gate driving circuit may further output another control signal to the pixel driving circuit.

The signal lines SGL include gate lines GL, data lines DL, a power line PL, and a control signal line CSL. One gate line GL of the gate lines GL is connected to a corresponding pixel PX among the pixels PX, respectively, and one data line DL of the data lines DL is connected to a corresponding pixel PX among the pixels PX, respectively. The power line PL is connected to the pixels PX. The control signal line CSL may provide control signals to the gate driving circuit. The signal lines SGL overlap the active area AA and the peripheral area NAA.

The pad portion PLD is a portion to which the flexible circuit board FCB (shown in FIG. 1B) is connected, and may include pixel pads D-PD for connecting the flexible circuit board FCB to the display panel DP, and input pads I-PD for connecting the flexible circuit board FCB to the input sensing unit ISP. The pixel pads D-PD and the input pads I-PD may be provided when some of the lines disposed in the display circuit layer DP-CL are exposed from an insulating layer included in the display circuit layer DP-CL.

The pixel pads D-PD are connected to corresponding pixels PX through the signal lines SGL. In addition, the driving circuit GDC may be connected to any one of the pixel pads D-PD.

Referring to FIG. 3, the input sensing unit ISP according to an embodiment may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4. In an embodiment, the input sensing unit ISP may further include third signal lines connected to the second sensing electrodes IE2-1 to IE2-4. In this case, the second signal lines SL2-1 to SL2-4 may be connected to one end of the second sensing electrodes IE2-1 to IE2-4, and the third signal lines may be connected to the other end of the second sensing electrodes IE2-1 to IE2-4.

The first sensing electrodes IE1-1 to IE1-5 and the second sensing electrodes IE2-1 to IE2-4 cross one another. The first sensing electrodes IE1-1 to IE1-5 are arranged (or spaced apart) in the first direction DR1, and each extend in the second direction DR2.

The first sensing electrodes IE1-1 to IE1-5 each include first sensor units SP1 and first connection units CP1 disposed in the active area AA. The second sensing electrodes IE2-1 to IE2-4 each include second sensor units SP2 and second connection units CP2 disposed in the active area AA. Two first sensor units disposed on both ends of a first electrode among the first sensor units SP1 may have a smaller size, for example, a half size, compared to the first sensor unit disposed at the center. Two second sensor units disposed at both ends of a second electrode among the second sensor units SP2 may have a smaller size, for example, a half size, compared to the second sensor unit disposed at the center.

FIG. 3 shows the first sensing electrodes IE1-1 to IE1-5 and the second sensing electrodes IE2-1 to IE2-4 according to an embodiment, but the configuration is not limited thereto. In an embodiment, the first sensing electrodes IE1-1 to IE1-5 and the second sensing electrodes IE2-1 to IE2-4 may have a shape without separation between the sensor unit and the connection unit (e.g., a bar shape). Although the first sensor units SP1 and the second sensor units SP2 having a rhombus shape are illustrated as an example, embodiments are not limited thereto. For instance, the first sensor units SP1 and the second sensor units SP2 may have different polygonal shapes.

The first sensor units SP1 in one first sensing electrode are arranged along the second direction DR2, and the second sensor units SP2 in one second sensing electrode are arranged along the first direction DR1. Each of the first connection units CP1 connect adjacent first sensor units SP1, and each of the second connection units CP2 connect adjacent second sensor units SP2.

The first sensing electrodes IE1-1 to IE1-5 and the second sensing electrodes IE2-1 to IE2-4 may have a mesh shape. The first sensing electrodes IE1-1 to IE1-5 and the second sensing electrodes IE2-1 to IE2-4 have a mesh shape, and parasitic capacitance with the electrodes of the display panel DP (see FIG. 2) may thus be reduced. In addition, as described later, the first sensing electrodes IE1-1 to IE1-5 and the second sensing electrodes IE2-1 to IE2-4 do not overlap light emitting areas PXA-R, PXA-B, and PXA-G (FIG. 4A), and may thus not be viewed by users of the display device DD.

The mesh-shaped first sensing electrodes IE1-1 to IE1-5 and second sensing electrodes IE2-1 to IE2-4 may include at least one of silver, aluminum, copper, chromium, nickel, titanium, molybdenum, etc. for a low-temperature process, but is not limited thereto. Even when the input sensing unit ISP is formed through a continuous process with the display panel DP, damage to the organic light emitting diodes OLED (see FIG. 12A) may be prevented.

The first signal lines SL1-1 to SL1-5 are connected to one end of the first sensing electrodes IE1-1 to IE1-5, respectively. In an embodiment, the input sensing unit ISP may further include signal lines connected to the other ends of the first sensing electrodes IE1-1 to IE1-5.

The first signal lines SL1-1 to SL1-5 and the second signal lines SL2-1 to SL2-4 may be disposed in the peripheral area NAA. The input sensing unit ISP may include input pads I-PD extending from one end of the first signal lines SL1-1 to SL1-5 and the second signal lines SL2-1 to SL2-4 and disposed in the peripheral area NAA.

Figure 4A:
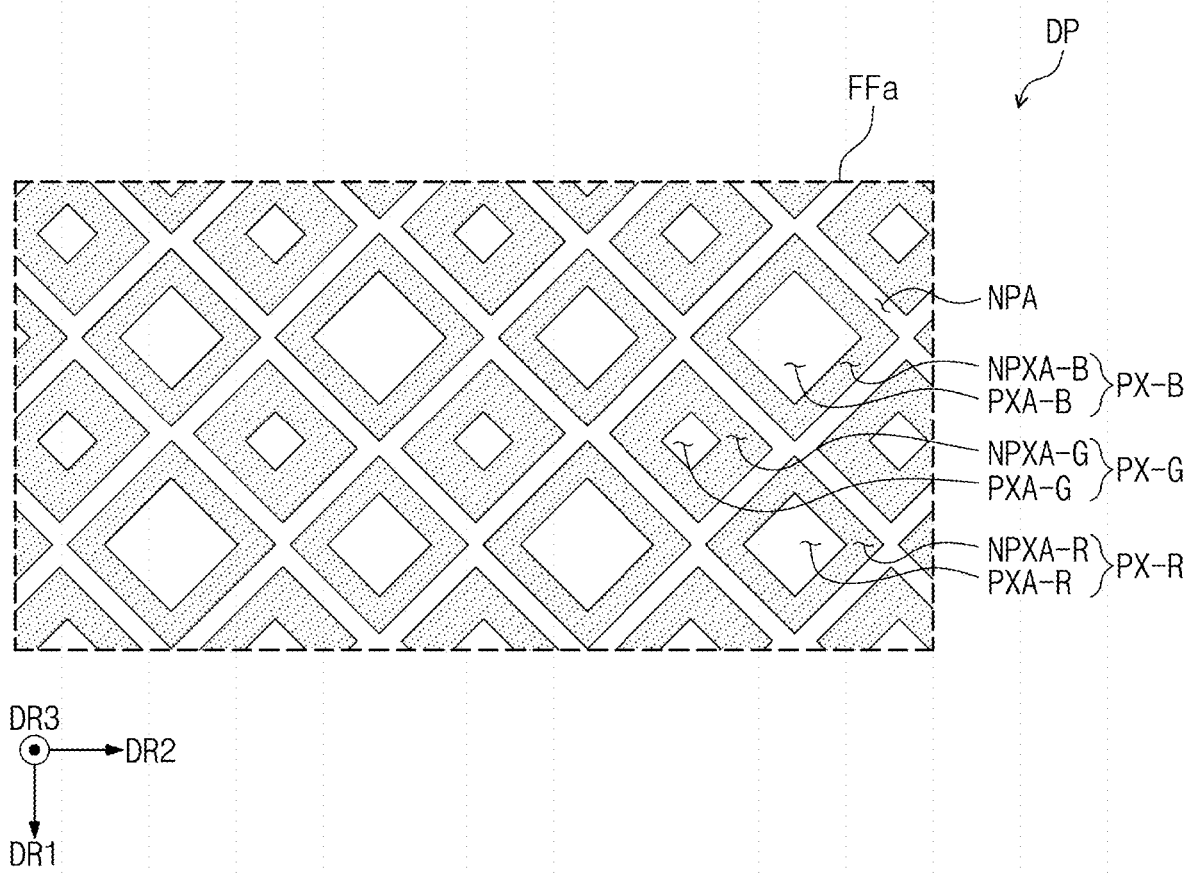
FIG. 4A is a plan view of an enlarged portion of a display panel according to an embodiment.
Figure 4B:
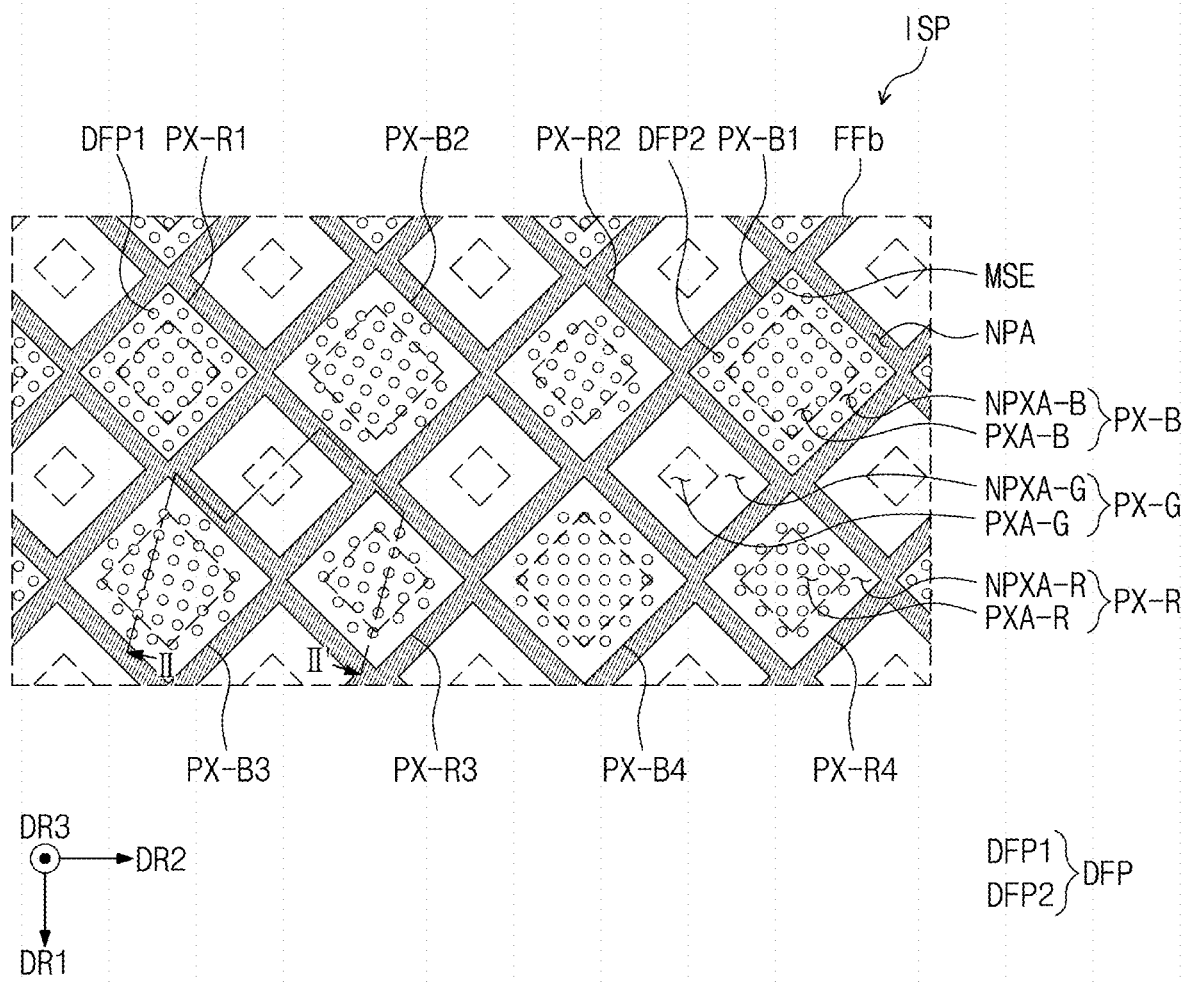
FIG. 4B is a plan view of an enlarged portion of an input sensing unit according to an embodiment.
Figure 5A:
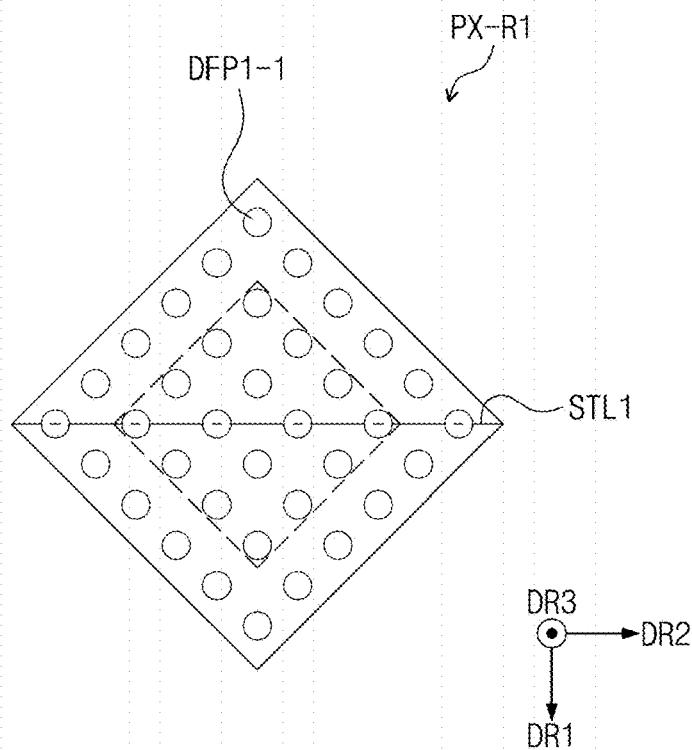
FIGS. 5A, 5B, 5C, and 5D are plan views of enlarged portions of an input sensing unit according to some embodiments.
Figure 5B:
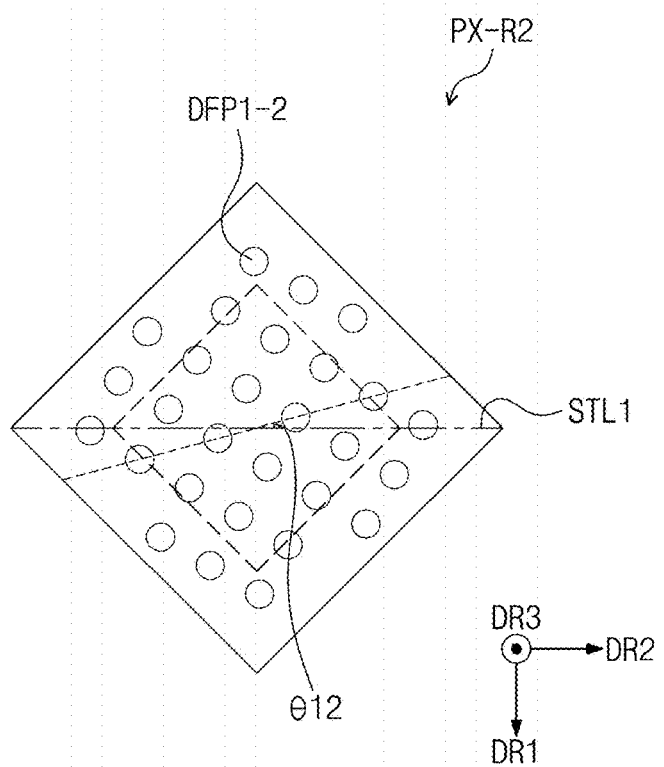
Figure 5C:
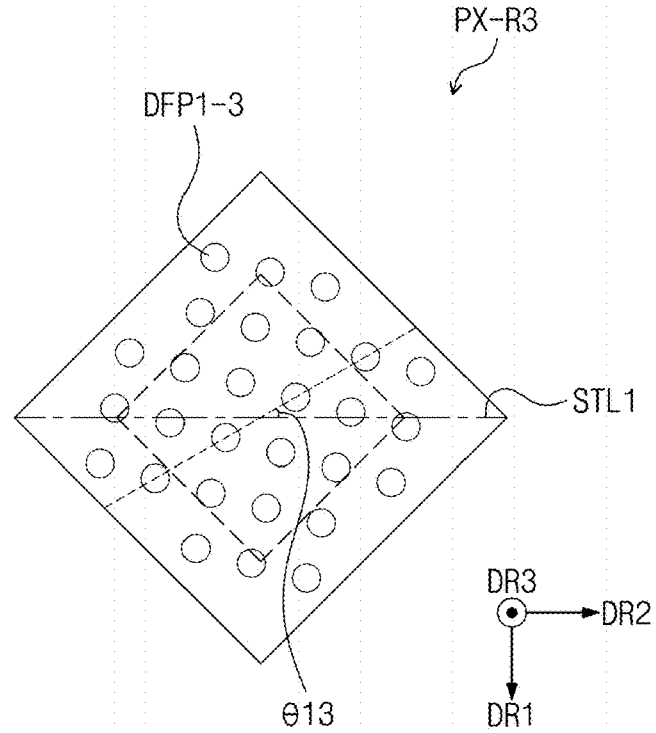
Figure 5D:
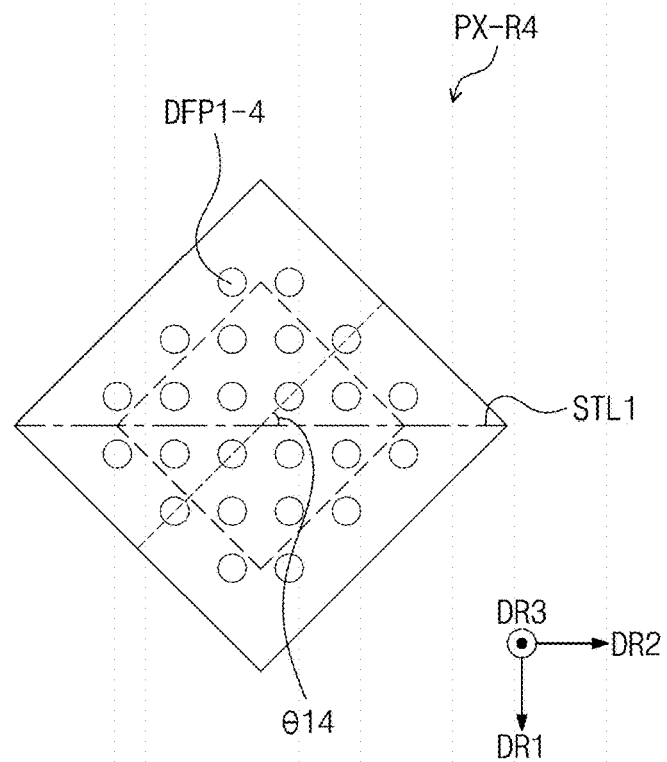
Figure 6A:
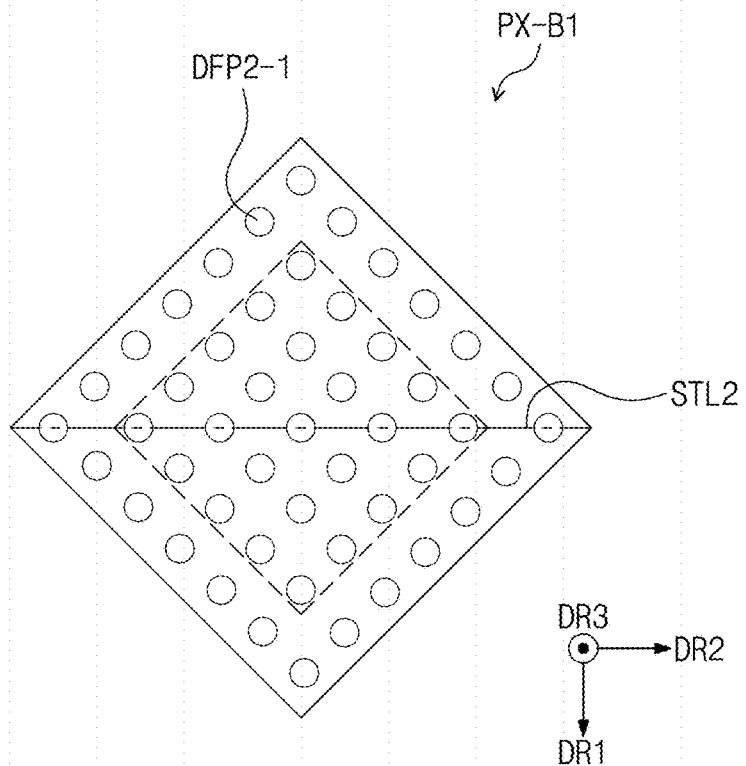
FIGS. 6A, 6B, 6C, and 6D are plan views of enlarged portions of an input sensing unit according to some embodiments.
Figure 6B:
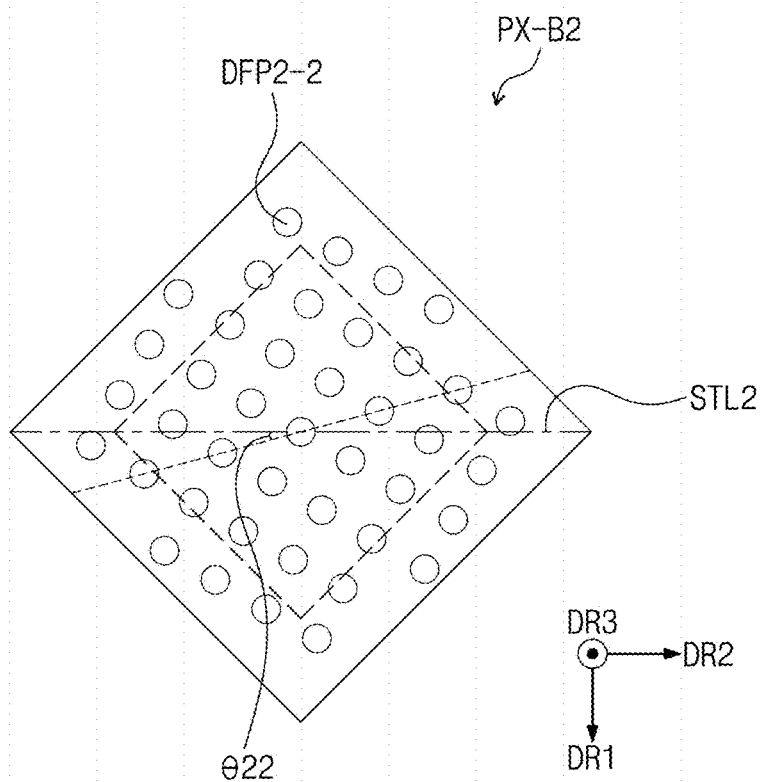
Figure 6C:
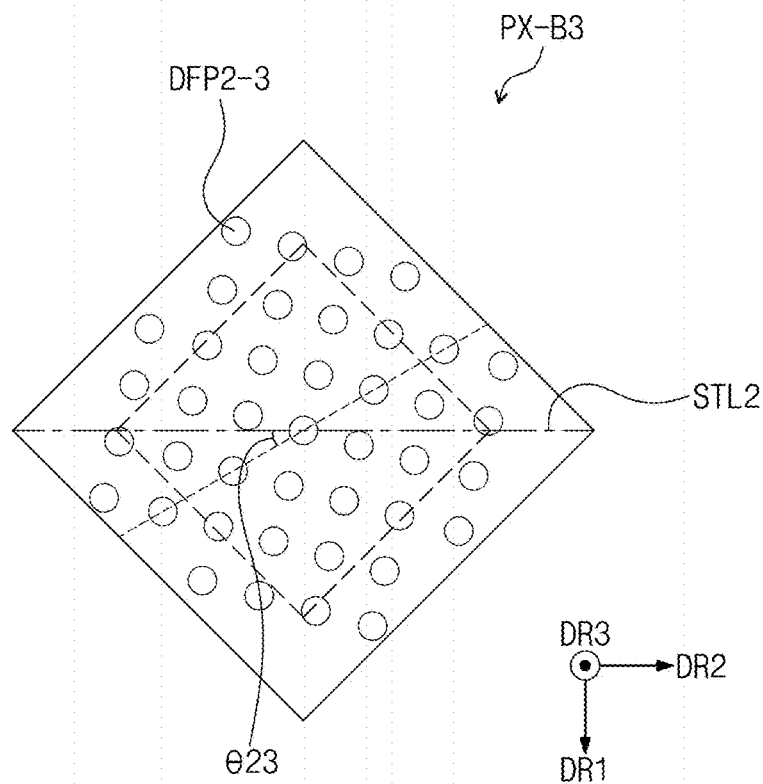
Figure 6D:
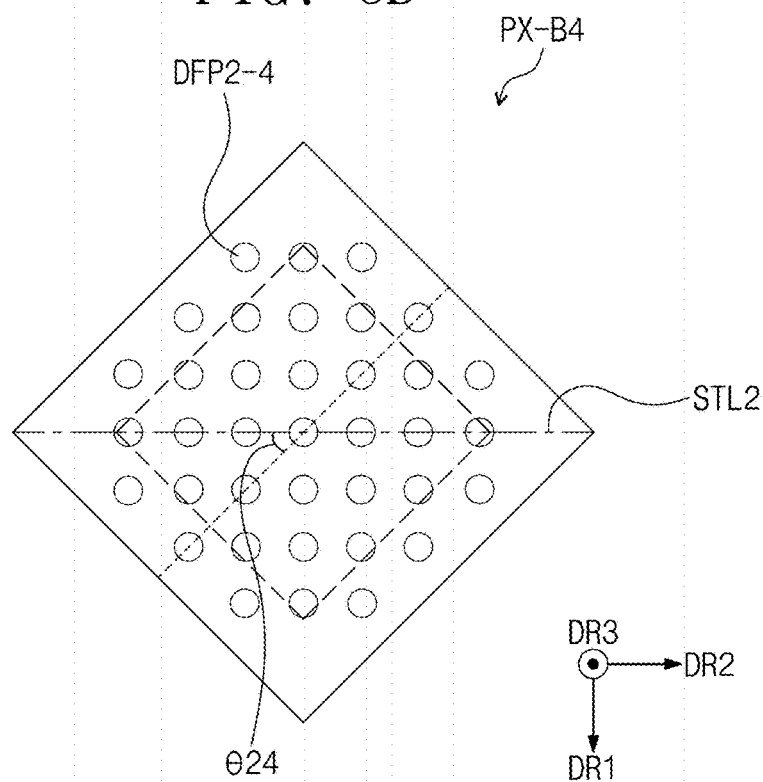

FIG. 4A is a plan view of an enlarged portion of a display panel according to an embodiment. FIG. 4B is a plan view of an enlarged portion of an input sensing unit according to an embodiment. FIGS. 5A to 5D are plan views of enlarged portions of an input sensing unit according to some embodiments. FIGS. 6A to 6D are plan views of enlarged portions of an input sensing unit according to some embodiments. It is noted that FIG. 4A is an enlarged plan view of a display panel corresponding to area FFa shown in FIG. 2, and FIG. 4B is an enlarged plan view of area FFb of the input sensing unit shown in FIG. 3. It is also noted that FIGS. 5A to 5D are plan views of enlarged sub-pixels of the first pixels shown in FIG. 4B, and FIGS. 6A to 6D are plan views of enlarged sub-pixels of the second pixels shown in FIG. 4B.

Referring to FIG. 4A, the display panel DP includes a plurality of pixels. In an embodiment, the plurality of pixels may include a plurality of first pixels PX-R, a plurality of second pixels PX-B, and a plurality of third pixels PX-G. The plurality of first pixels PX-R, the plurality of second pixels PX-B, and the plurality of third pixels PX-G may be different in size. For example, the third pixels PX-G may have a smaller size than the first pixels PX-R and the second pixels PX-B, and the first pixels PX-R may have a smaller size than the second pixels PX-B. In an embodiment, the first pixels PX-R may be pixels outputting red light, the second pixels PX-B may be pixels outputting blue light, and the third pixels PX-G may be pixels outputting green light.

The first pixels PX-R may be arranged along the first direction DR1 and the second direction DR2. The first pixels PX-R and the second pixels PX-B may be alternately placed and arranged along the first direction DR1 and the second direction DR2. A non-pixel area NPA may be provided among the first to third pixels PX-R, PX-B, and PX-G. The plurality of pixels includes a plurality of unit pixels defined by the non-pixel area NPA.

The arrangement structure of the first to third pixels PX-R, PX-B, and PX-G shown in FIG. 4A is illustrated as an example, but embodiments are not limited thereto. For example, according to another embodiment, the first pixel PX-R, the second pixel PX-B, and the third pixel PX-G may be alternately arranged along the second direction DR2. In addition, it is illustrated that the first to third pixels PX-R, PX-B, and PX-G each have a rectangular shape, but embodiments are not limited thereto. For instance, the first to third pixels PX-R, PX-B, and PX-G each may be variously modified into the forms of polygons, circles, ellipses, etc. As another example, the first to third pixels PX-R, PX-B, and PX-G may be different in shape from each other. For instance, the third pixel PX-G may have a hexagonal or octagonal shape, and the first and second pixels PX-R and PX-B may have a rectangular shape.

In addition, FIG. 4A illustrates that the third pixels PX-G have a smaller size than the first pixels PX-R and the second pixels PX-B, but embodiments are not limited thereto. For example, in another embodiment, the first to third pixels PX-R, PX-B, and PX-G may be the same in size.

The first pixels PX-R each include a first light emitting area PXA-R outputting light and a first non-light emitting area NPXA-R formed around the first light emitting area PXA-R. The second pixels PX-B each include a second light emitting area PXA-B outputting light and a second non-light emitting area NPXA-B formed around the second light emitting area PXA-B. The third pixels PX-G each include a third light emitting area PXA-G outputting light and a third non-light emitting area NPXA-G formed around the third light emitting area PXA-G. The first to third non-light emitting areas NPXA-R, NPXA-B, and NPXA-G are defined as areas in which light is not output.

Referring to FIGS. 3, 4A, and 4B, the first sensor units SP1 of the input sensing unit ISP have a mesh shape. The first sensor units SP1 each include a mesh electrode MSE patterned in a mesh shape. The first sensor units SP1 may be disposed to correspond to the non-pixel area NPA to increase opening ratios of the first to third pixels PX-R, PX-B, and PX-G and to reduce parasitic capacitance. The mesh electrode MSE may partially overlap the first to third non-light emitting areas NPXA-R, NPXA-B, and NPXA-G.

The input sensing unit ISP is arranged to have a certain period, and includes a plurality of diffraction patterns DFP diffracting at least a portion of the light. The plurality of diffraction patterns DFP may overlap at least some of the plurality of pixels PX-R, PX-B, and PX-G. In an embodiment, the plurality of diffraction patterns DFP may overlap the first pixels PX-R and the second pixels PX-B among the plurality of pixels PX-R, PX-B, and PX-G. Diffraction patterns DFP may not be disposed on upper portions of the third pixels PX-G among the plurality of pixels PX-R, PX-B, and PX-G. However, embodiments are not limited thereto. For instance, the plurality of diffraction patterns DFP may overlap each of the first pixels PX-R, second pixels PX-B, and third pixels PX-G among the plurality of pixels PX-R, PX-B, and PX-G, or overlap only the first pixels PX-R.

The plurality of diffraction patterns DFP may overlap at least some of the light emitting areas PXA-R, PXA-B, and PXA-G of each pixel PX-R, PX-B, and PX-G. In an embodiment, the plurality of diffraction patterns DFP may overlap the light emitting areas PXA-R, PXA-B, and PXA-G and non-light emitting areas NPXA-R, NPXA-G, and NPXA-B of each pixel PX-R, PX-B, and PX-G. For example, the plurality of diffraction patterns DFP may partially overlap the non-light emitting areas NPXA-R, NPXA-G, and NPXA-B.

The plurality of diffraction patterns DFP may not overlap the non-pixel area NPA. For instance, the plurality of diffraction patterns DFP may be provided not to overlap the mesh electrode MSE.

In an embodiment, the plurality of diffraction patterns DFP may have a circular shape when viewed on a plane. However, the shape of the plurality of diffraction patterns DFP is not limited thereto. The plurality of diffraction patterns DFP each may be variously modified into the forms of polygons, ellipses, stripes, etc.

The display device DD according to an embodiment includes the plurality of diffraction patterns DFP disposed on the display panel DP, and a color difference between a front direction and a side direction may thus be reduced, and accordingly, viewing angle properties of the display device DD may, as a whole, be enhanced. Enhancement of the viewing angle properties according to the diffraction of the plurality of diffraction patterns DFP will be described later in the descriptions of FIG. 12C.

The first pixels PX-R include a plurality of first sub-pixels PX-R1, PX-R2, PX-R3, and PX-R4. The first pixels PX-R may include a $1\text{-}1^{st}$ sub-pixel PX-R1, a $1\text{-}2^{nd}$ sub-pixel PX-R2, a $1\text{-}3^{rd}$ sub-pixel PX-R3, and a $1\text{-}4^{th}$ sub-pixel PX-R4.

The second pixels PX-B include a plurality of second sub-pixels PX-B1, PX-B2, PX-B3, and PX-B4. The second pixels PX-B may include a 2-1$^{st}$ sub-pixel PX-B1, a 2-2$^{nd}$ sub-pixel PX-B2, a 2-3$^{rd}$ sub-pixel PX-B3, and a 2-4$^{th}$ sub-pixel PX-B4.

The third pixels PX-G include a plurality of third sub-pixels.

In an embodiment, the plurality of pixels included in the display panel DP include a plurality of unit pixels. The plurality of unit pixels included in the display panel DP may refer to the plurality of first sub-pixels PX-R1, PX-R2, PX-R3, and PX-R4, the plurality of second sub-pixels PX-B1, PX-B2, PX-B3, and PX-B4, and the plurality of third sub-pixels respectively included in the first pixels PX-R, the second pixels PX-B, and the third pixels PX-G.

The plurality of diffraction patterns DFP include a plurality of first diffraction patterns DFP1 disposed on each of the plurality of first sub-pixels PX-R1, PX-R2, PX-R3, and PX-R4 included in the first pixels PX-R. In an embodiment, the plurality of first diffraction patterns DFP1 may include a plurality of 1-1$^{st}$ sub-diffraction patterns DFP1-1 disposed on the 1-1$^{st}$ sub-pixel PX-R1 and a plurality of 1-2$^{nd}$ sub-diffraction patterns DFP1-2 disposed on the 1-2$^{nd}$ sub-pixel PX-R2. In an embodiment, the plurality of first diffraction patterns DFP1 may include a plurality of 1-3$^{rd}$ sub-diffraction patterns DFP1-3 disposed on the 1-3$^{rd}$ sub-pixel PX-R3 and a plurality of 1-4$^{th}$ sub-diffraction patterns DFP1-4 disposed on the 1-4$^{th}$ sub-pixel PX-R4.

The plurality of diffraction patterns DFP include a plurality of second diffraction patterns DFP2 disposed on each of the plurality of second sub-pixels PX-B1, PX-B2, PX-B3, and PX-B4 included in the second pixels PX-B. In an embodiment, the plurality of second diffraction patterns DFP2 may include a plurality of 2-1$^{st}$ sub-diffraction patterns DFP2-1 disposed on the 2-1$^{st}$ sub-pixel PX-B1 and a plurality of 2-2$^{nd}$ sub-diffraction patterns DFP2-2 disposed on the 2-2$^{nd}$ sub-pixel PX-B2. In an embodiment, the plurality of second diffraction patterns DFP2 may include a plurality of 2-3$^{rd}$ sub-diffraction patterns DFP2-3 disposed on the 2-3$^{rd}$ sub-pixel PX-B3 and a plurality of 2-4$^{th}$ sub-diffraction patterns DFP2-4 disposed on the 2-4$^{th}$ sub-pixel PX-B4.

The plurality of pixels includes a first unit pixel and a second unit pixel, and, among the plurality of diffraction patterns DFP, the plurality of first unit diffraction patterns arranged in the first unit pixel and the plurality of second unit diffraction patterns arranged in the second unit pixel are differently arranged on a plane.

In an embodiment, the first unit pixel and the second unit pixel may be any two of the plurality of first sub-pixels PX-R1, PX-R2, PX-R3, and PX-R4, and, among the plurality of first diffraction patterns DFP1 disposed in each of the plurality of first sub-pixels PX-R1, PX-R2, PX-R3, and PX-R4, the two disposed on the pixels corresponding to the first unit pixel and the second unit pixel may be differently arranged on a plane. For example, the 1-1$^{st}$ sub-pixel PX-R1 and the 1-2$^{nd}$ sub-pixel PX-R2 are the first unit pixel and the second unit pixel, and the plurality of 1-2$^{nd}$ sub-diffraction patterns DFP1-2 may be differently arranged from the 1-1$^{st}$ sub-diffraction patterns DFP1-1 on a plane.

Alternately, the first unit pixel and the second unit pixel may be any two of the plurality of second sub-pixels PX-B1, PX-B2, PX-B3, and PX-B4, and, among the plurality of second diffraction patterns DFP2 disposed in each of the plurality of second sub-pixels PX-B1, PX-B2, PX-B3, and PX-B4, the two disposed on the pixels corresponding to the first unit pixel and the second unit pixel may be differently arranged on a plane. For example, the 2-1$^{st}$ sub-pixel PX-B1 and the 2-2$^{nd}$ sub-pixel PX-B2 are the first unit pixel and the second unit pixel, and the plurality of 2-2$^{nd}$ sub-diffraction patterns DFP2-2 may be differently arranged from the 2-1$^{st}$ sub-diffraction patterns DFP2-1 on a plane.

Alternatively, the first unit pixel and the second unit pixel each may display different colors of light. For example, the first unit pixel may be any one of the plurality of first sub-pixels PX-R1, PX-R2, PX-R3, and PX-R4, and the second unit pixel may be any one of the plurality of second sub-pixels PX-B1, PX-B2, PX-B3, and PX-B4. For example, the 1-1$^{st}$ sub-pixel PX-R1 and the 2-2$^{nd}$ sub-pixel PX-B2 are the first unit pixel and the second unit pixel, and the plurality of 2-2$^{nd}$ sub-diffraction patterns DFP2-2 may be differently arranged from the 1-1$^{st}$ sub-diffraction patterns DFP1-1 on a plane.

In an embodiment, the plurality of pixels may further include a third unit pixel and a fourth unit pixel. Among the plurality of diffraction patterns DFP, the plurality of third unit diffraction patterns arranged in the third unit pixel may be differently arranged from the plurality of first unit diffraction patterns and the plurality of second unit diffraction patterns. Among the plurality of diffraction patterns DFP, the plurality of fourth unit diffraction patterns arranged in the fourth unit pixel may be differently arranged from the plurality of first unit diffraction patterns to the plurality of third unit diffraction patterns.

For example, the 1-3$^{rd}$ sub-pixel PX-R3 may be the third unit pixel, and the plurality of 1-3$^{rd}$ sub-diffraction patterns DFP1-3 may be differently arranged from each of the plurality of 1-1$^{st}$ sub-diffraction patterns DFP1-1 and the plurality of the 1-2$^{nd}$ sub-diffraction patterns DFP1-2 on a plane. For example, the 1-4$^{th}$ sub-pixel PX-R4 may be the fourth unit pixel, and the plurality of 1-4$^{th}$ sub-diffraction patterns DFP1-4 may be differently arranged from each of the plurality of 1-1$^{st}$ sub-diffraction patterns DFP1-1 and the plurality of the 1-3$^{rd}$ sub-diffraction patterns DFP1-3 on a plane.

Alternately, the 2-3$^{rd}$ sub-pixel PX-B3 may be the third unit pixel, and the plurality of 2-3$^{rd}$ sub-diffraction patterns DFP2-3 may be differently arranged from each of the plurality of 2-1$^{st}$ sub-diffraction patterns DFP2-1 and the plurality of the 2-2$^{nd}$ sub-diffraction patterns DFP2-2 on a plane. The 2-4$^{th}$ sub-pixel PX-B4 may be the fourth unit pixel, and the plurality of 2-4$^{th}$ sub-diffraction patterns DFP2-4 may be differently arranged from each of the plurality of 2-1$^{st}$ sub-diffraction patterns DFP2-1 and the plurality of the 2-3$^{rd}$ sub-diffraction patterns DFP2-3 on a plane.

Among the plurality of diffraction patterns DFP, the plurality of first unit diffraction patterns arranged in the first unit pixel and the plurality of second unit diffraction patterns arranged in the second unit pixel may be oriented to have different tilt angles along a reference line crossing each of the plurality of pixels along one direction.

As shown in FIGS. 5A to 5D, a first reference line STL1 extending in the second direction DR2, which is one direction, may be defined in each of the plurality of first sub-pixels PX-R1, PX-R2, PX-R3, and PX-R4 included in the first pixels PX-R. At least any two of the plurality of first diffraction patterns DFP1 disposed in each of the plurality of first sub-pixels PX-R1, PX-R2, PX-R3, and PX-R4 may be oriented to have different tilt angles with respect to the first reference line STL1.

In an embodiment, the plurality of 1-1$^{st}$ sub-diffraction patterns DFP1-1 disposed on the 1-1$^{st}$ sub-pixel PX-R1 and the plurality of 1-2$^{nd}$ sub-diffraction patterns DFP1-2 disposed on the 1-2$^{nd}$ sub-pixel PX-R2 may be oriented to have different tilt angles with respect to the first reference line STL1. The plurality of 1-1$^{st}$ sub-diffraction patterns DFP1-1 are oriented to have a 1-1$^{st}$ tilt angle along the first reference line STL1, and the plurality of 1-2$^{nd}$ sub-diffraction patterns DFP1-2 are oriented to have a 1-2$^{nd}$ tilt angle θ12 along the first reference line STL1, and the 1-1$^{st}$ tilt angle and the 1-2$^{nd}$ tilt angle θ12 may be different from each other. In an embodiment, the 1-1$^{st}$ tilt angle may be 0. For instance, the plurality of 1-1$^{st}$ sub-diffraction patterns DFP1-1 may be arranged in parallel with the first reference line STL1. In an embodiment, the 1-2$^{nd}$ tilt angle θ12 may be 15 degrees. For example, the plurality of 1-2$^{nd}$ sub-diffraction patterns DFP1-2 may be arranged in a direction tilting by 15 degrees from the first reference line STL1.

The plurality of 1-3$^{rd}$ sub-diffraction patterns DFP1-3 disposed on the 1-3$^{rd}$ sub-pixel PX-R3 may be oriented to have different tilt angles respectively from the plurality of 1-1$^{st}$ sub-diffraction patterns DFP1-1 disposed on the 1-1$^{st}$ sub-pixel PX-R1 and the plurality of 1-2$^{nd}$ sub-diffraction patterns DFP1-2 disposed on the 1-2$^{nd}$ sub-pixel PX-R2 with respect to the first reference line STL1. The plurality of 1-3$^{rd}$ sub-diffraction patterns DFP1-3 are oriented to have a 1-3$^{rd}$ tilt angle θ13 along the first reference line STL1, and the 1-3$^{rd}$ tilt angle θ13 may be different from each of the 1-1$^{st}$ tilt angle and the 1-2$^{nd}$ tilt angle θ12. In an embodiment, the 1-3$^{rd}$ tilt angle θ13 may be 30 degrees. For instance, the plurality of 1-3$^{rd}$ sub-diffraction patterns DFP1-3 may be arranged in a direction tilting by 30 degrees from the first reference line STL1.

The plurality of 1-4$^{th}$ sub-diffraction patterns DFP1-4 disposed on the 1-4$^{th}$ sub-pixel PX-R4 may be oriented to have different tilt angles respectively from the plurality of 1-1$^{st}$ sub-diffraction patterns DFP1-1 disposed on the 1-1$^{st}$ sub-pixel PX-R1, the plurality of 1-2$^{nd}$ sub-diffraction patterns DFP1-2 disposed on the 1-2$^{nd}$ sub-pixel PX-R2, and the plurality of 1-3$^{rd}$ sub-diffraction patterns DFP1-3 disposed on the 1-3$^{rd}$ sub-pixel PX-R3 with respect to the first reference line STL1. The plurality of 1-4$^{th}$ sub-diffraction patterns DFP1-4 may be oriented to have a 1-4$^{th}$ tilt angle θ14 along the first reference line STL1, and the 1-4$^{th}$ tilt angle θ14 may be different from each of the 1-1$^{st}$ tilt angle, the 1-2$^{nd}$ tilt angle θ12, and the 1-3$^{rd}$ tilt angle θ13. In an embodiment, the 1-4$^{th}$ tilt angle θ14 may be 45 degrees. For instance, the plurality of 1-4$^{th}$ sub-diffraction patterns DFP1-4 may be arranged in a direction tilting by 45 degrees from the first reference line STL1.

As shown in FIGS. 6A to 6D, a second reference line STL2 extending in the second direction DR2, which is one direction, may be defined in each of the plurality of second sub-pixels PX-B1, PX-B2, PX-B3, and PX-B4 included in the second pixels PX-R. The second reference line STL2 may extend in the same direction as the first reference line STL1 shown in IGS. 5A to 5D. At least any two of the plurality of second diffraction patterns DFP2 disposed on each of the plurality of second sub-pixels PX-B1, PX-B2, PX-B3, and PX-B4 may have different tilt angles with respect to the second reference line STL2.

In an embodiment, the plurality of 2-1$^{st}$ sub-diffraction patterns DFP2-1 disposed on the 2-1$^{st}$ sub-pixel PX-B1 and the plurality of 2-2$^{nd}$ sub-diffraction patterns DFP2-2 disposed on the 2-2$^{nd}$ sub-pixel PX-B2 may be oriented to have different tilt angles with respect to the second reference line STL2. The plurality of 2-1$^{st}$ sub-diffraction patterns DFP2-1 are oriented to have a 2-1$^{st}$ tilt angle along the second reference line STL2, and the plurality of 2-2$^{nd}$ sub-diffraction patterns DFP2-2 are oriented to have a 2-2$^{nd}$ tilt angle θ22 along the second reference line STL2, and the 2-1$^{st}$ tilt angle and the 2-2$^{nd}$ tilt angle θ22 may be different from each other. In an embodiment, the 2-1$^{st}$ tilt angle may be 0. For instance, the plurality of 2-1$^{st}$ sub-diffraction patterns DFP2-1 may be arranged in parallel with the second reference line STL2. In an embodiment, the 2-2$^{nd}$ tilt angle θ22 may be 15 degrees. For example, the plurality of 2-2$^{nd}$ sub-diffraction patterns DFP2-2 may be arranged in a direction tilting by 15 degrees from the second reference line STL2.

The plurality of 2-3$^{rd}$ sub-diffraction patterns DFP2-3 disposed on the 2-3$^{rd}$ sub-pixel PX-B3 may be oriented to have different tilt angles respectively from the plurality of 2-1$^{st}$ sub-diffraction patterns DFP2-1 disposed on the 2-1$^{st}$ sub-pixel PX-B1 and the plurality of 2-2$^{nd}$ sub-diffraction patterns DFP2-2 disposed on the 2-2$^{nd}$ sub-pixel PX-B2 with respect to the second reference line STL2. The plurality of 2-3$^{rd}$ sub-diffraction patterns DFP2-3 are oriented to have a 2-3$^{rd}$ tilt angle θ23 along the second reference line STL2, and the 2-3$^{rd}$ tilt angle θ23 may be different from each of the 2-1$^{st}$ tilt angle and the 2-2$^{nd}$ tilt angle θ22. In an embodiment, the 2-3$^{rd}$ tilt angle θ23 may be 30 degrees. For example, the plurality of 2-3$^{rd}$ sub-diffraction patterns DFP2-3 may be arranged in a direction tilting by 30 degrees from the second reference line STL2.

The plurality of 2-4$^{th}$ sub-diffraction patterns DFP2-4 disposed on the 2-4$^{th}$ sub-pixel PX-B4 may be oriented to have different tilt angles respectively from the plurality of 2-1$^{st}$ sub-diffraction patterns DFP2-1 disposed on the 2-1$^{st}$ sub-pixel PX-B1, the plurality of 2-2$^{nd}$ sub-diffraction patterns DFP2-2 disposed on the 2-2$^{nd}$ sub-pixel PX-B2, and the plurality of 2-3$^{rd}$ sub-diffraction patterns DFP2-3 disposed on the 2-3$^{rd}$ sub-pixel PX-B3 with respect to the second reference line STL2. The plurality of 2-4$^{th}$ sub-diffraction patterns DFP2-4 may be oriented to have a 2-4$^{th}$ tilt angle θ24 along the second reference line STL2, and the 2-4$^{th}$ tilt angle θ24 may be different from each of the 2-1$^{st}$ tilt angle, the 2-2$^{nd}$ tilt angle θ22, and the 2-3$^{rd}$ tilt angle θ23. In an embodiment, the 2-4$^{th}$ tilt angle θ24 may be 45 degrees. For instance, the plurality of 2-4$^{th}$ sub-diffraction patterns DFP2-4 may be arranged in a direction tilting by 45 degrees from the second reference line STL2.

In various embodiments, a plurality of diffraction patterns disposed on a plurality of pixels are included, and in particular, for a plurality of unit pixels included in the plurality of pixels, the planar arrangements of the plurality of first unit diffraction patterns disposed on the first unit pixel and the plurality of second unit diffraction patterns disposed on the second unit pixel among the plurality of unit pixels are different from each other. For example, the plurality of first unit diffraction patterns disposed on the first unit pixel and the plurality of second unit diffraction patterns disposed on the second unit pixel are oriented to have different tilt angles along a reference line crossing the plurality of unit pixels. For example, a plurality of first sub-diffraction patterns may be disposed in each of the plurality of first sub-pixels included in the first pixel, and at least any two of the plurality of second sub-diffraction patterns may have different planar arrangements. At least any two of the plurality of first sub-diffraction patterns may be oriented to have different tilt angles based on the first reference line crossing the plurality of first sub-pixels. In addition, a plurality of second sub-diffraction patterns may be disposed in each of the plurality of second sub-pixels included in the second pixel, and at least any two of the plurality of second sub-diffraction patterns may have different planar arrangements. At least any two of the plurality of second sub-diffraction patterns may be oriented to have different tilt angles based on the second reference line crossing the plurality of second sub-pixels. In some embodiments, any one of the plurality of first sub-diffraction patterns and any one of the plurality of second sub-diffraction patterns may have different planar arrangements. In various embodiments, viewing angle properties of the display device are enhanced, as well as an issue that variations in color difference values are caused according to azimuth may be prevented.

For example, when the plurality of diffraction patterns arranged on upper portions of each of the plurality of unit pixels included in the plurality of pixels have the same planar arrangement, a color difference caused with an increase in viewing angles may be reduced through diffraction by the diffraction patterns, thereby improving viewing angle properties of the display device, but causing patterns having perceptible variations in color difference values according to azimuth due to the diffraction patterns having the same arrangement. In a display device according to various embodiments, the plurality of unit diffraction patterns are disposed on upper portions of each of the plurality of unit pixels, and at least any two of the plurality of unit diffraction patterns have different planar arrangements, thereby preventing patterns having significant variations in color difference values according to azimuth from being caused, and accordingly, enhancing viewing angle and azimuth properties of the display device.

Figure 7A:
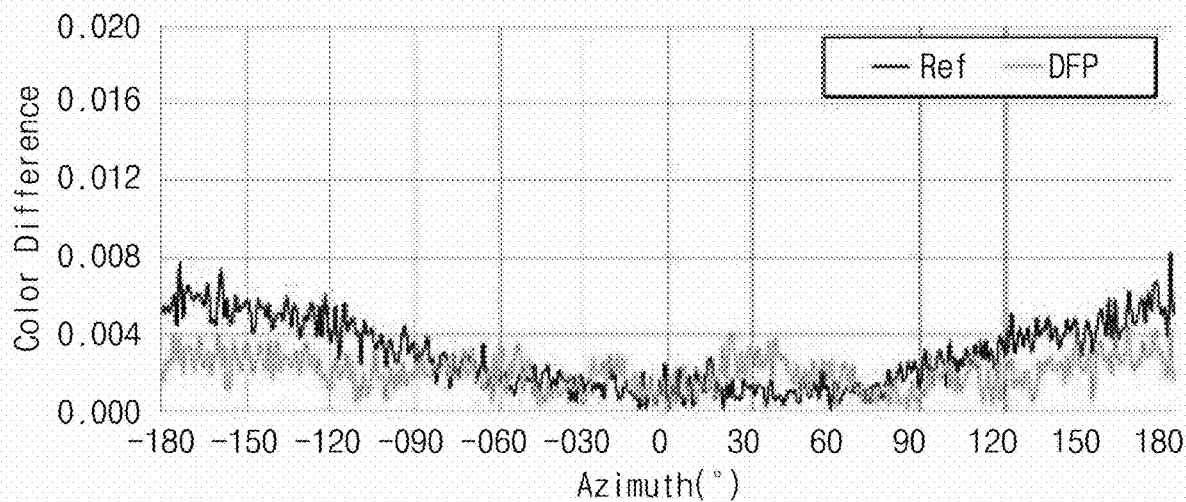
FIGS. 7A, 7B, and 7C are graphs showing a color difference according to azimuth for a display device according to some embodiments.
Figure 7B:
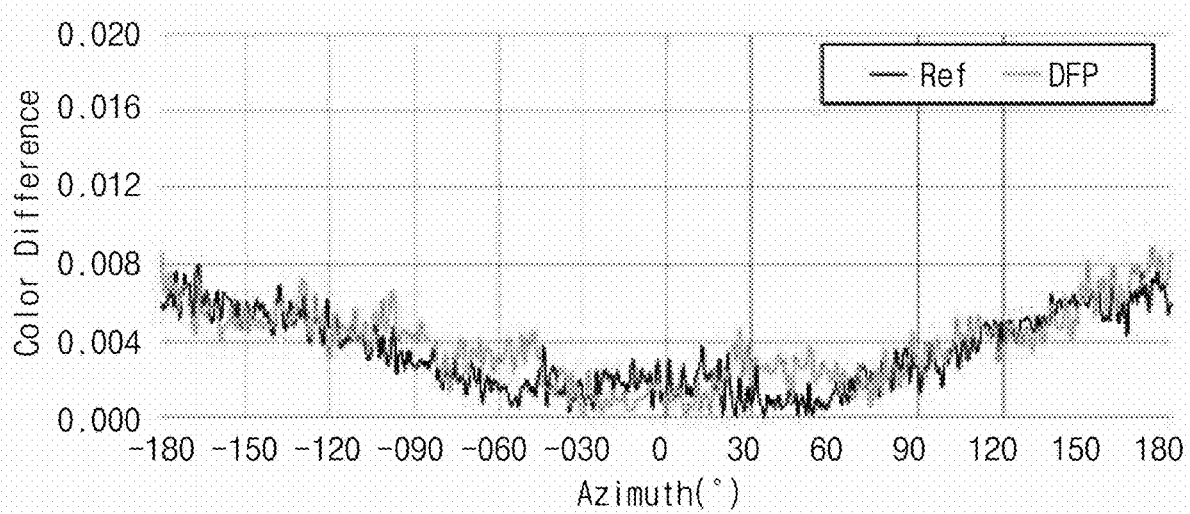
Figure 7C:
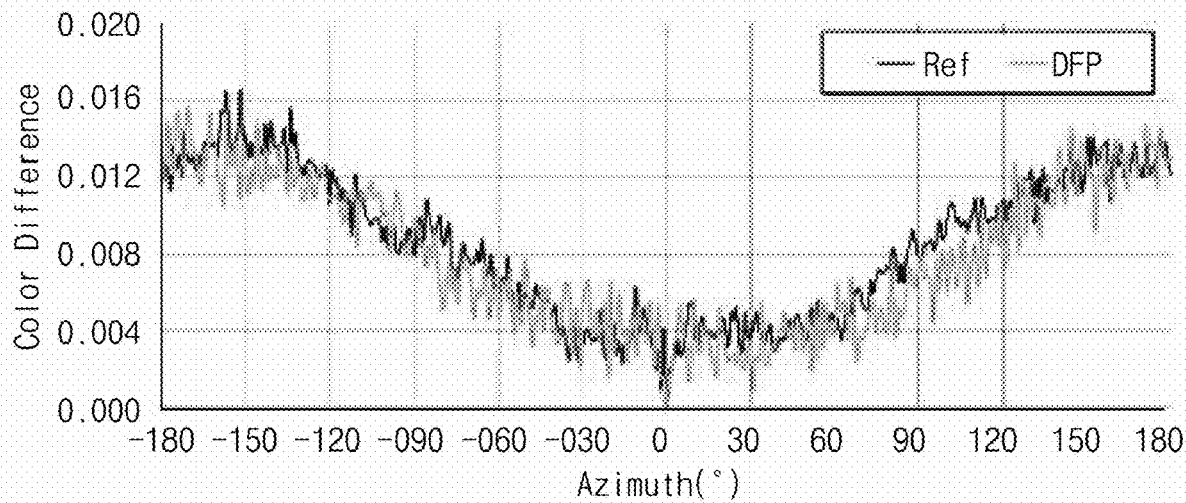
Figure 8A:
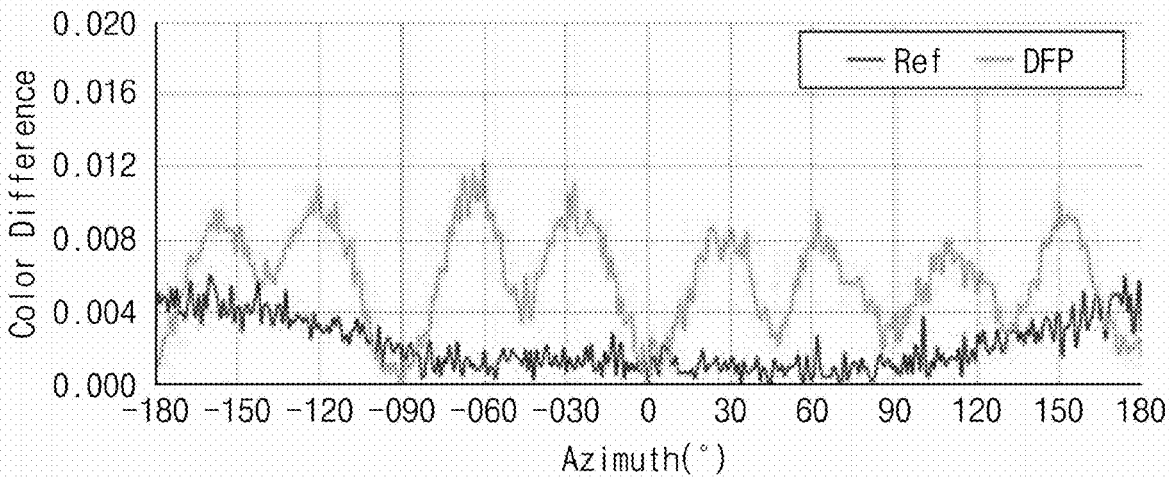
FIGS. 8A, 8B, and 8C are graphs showing a color difference according to azimuth for a display device according to a comparative example.
Figure 8B:
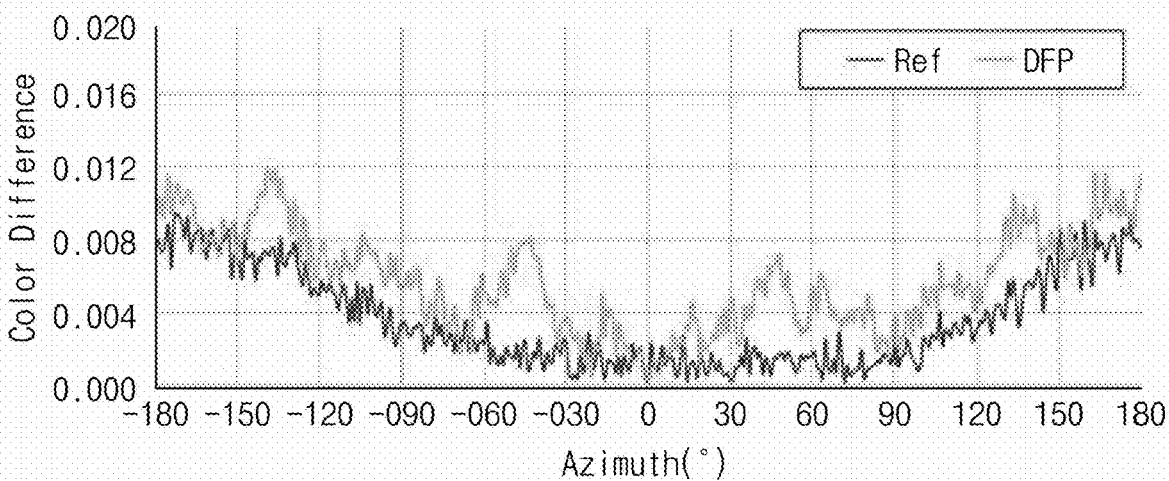
Figure 8C:
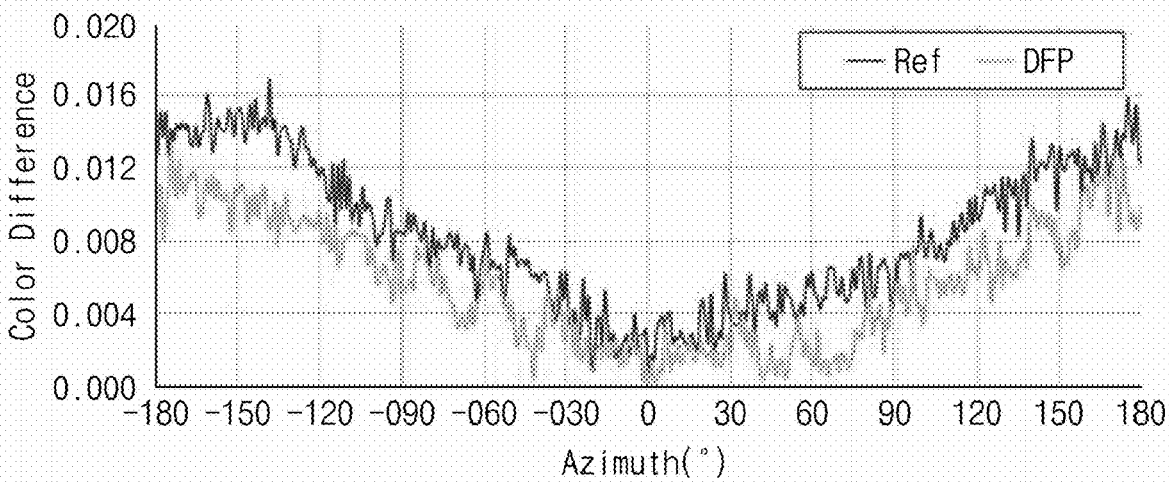

FIGS. 7A to 7C are graphs showing a color difference (Δu'v') according to azimuth for a display device according to some embodiments. FIGS. 8A to 8C are graphs showing a color difference (Δu'v') according to azimuth for a display device according to a comparative example. In FIGS. 7A to 7C and 8A to 8C, a graph of DFP is a graph when a plurality of diffraction patterns arranged on a plurality of pixels are included, and a graph of Ref is a graph when a plurality of diffraction patterns arranged on a plurality of pixels are omitted. In FIGS. 7A to 7C, as shown in FIGS. 4B, 5A to 5D, and 6A to 6B, color differences according to azimuth are shown for the display device of an embodiment in which the plurality of diffraction patterns arranged on upper portions of each of the plurality of pixels are oriented to have different tilt angles along a reference line. In FIGS. 8A to 8C, color differences according to azimuth for the display device of a comparative example in which each of the arrangements of the plurality of diffraction patterns arranged on upper portions of the plurality of pixels are the same.

FIG. 7A shows a color difference for each azimuth at a viewing angle of 30 degrees for a display device according to some embodiments, and FIG. 7B shows a color difference for each azimuth at a viewing angle of 45 degrees in a display device according to some embodiments. FIG. 7C shows a color difference for each azimuth at a viewing angle of 60 degrees in a display device according to some embodiments. FIG. 8A shows a color difference for each azimuth at a viewing angle of 30 degrees in a display device according to a comparative example, and FIG. 8B shows a color difference for each azimuth at a viewing angle of 45 degrees in a display device according to a comparative example. FIG. 8C shows a color difference for each azimuth at a viewing angle of 60 degrees in a display device according to a comparative example.

When comparing the graphs illustrated in FIGS. 7A to 7C with the graphs illustrated in FIGS. 8A to 8C, as in a comparative example, when all of the arrangements of the plurality of diffraction patterns arranged on upper portions of the plurality of pixels are the same, a pattern having perceptible variations in color difference values for each azimuth is caused while, as in various embodiments, when at least some of the arrangements of the plurality of diffraction patterns arranged on upper portions of the plurality of pixels are different, it is seen that variations in color difference values for each azimuth are not significant. For example, in the display device according to some embodiments, it is confirmed that at least some of the arrangements of the plurality of diffraction patterns arranged on upper portions of the plurality of pixels are configured to be different, and a pattern having significant variations in color difference values for each azimuth may thus be prevented.

Figure 9:
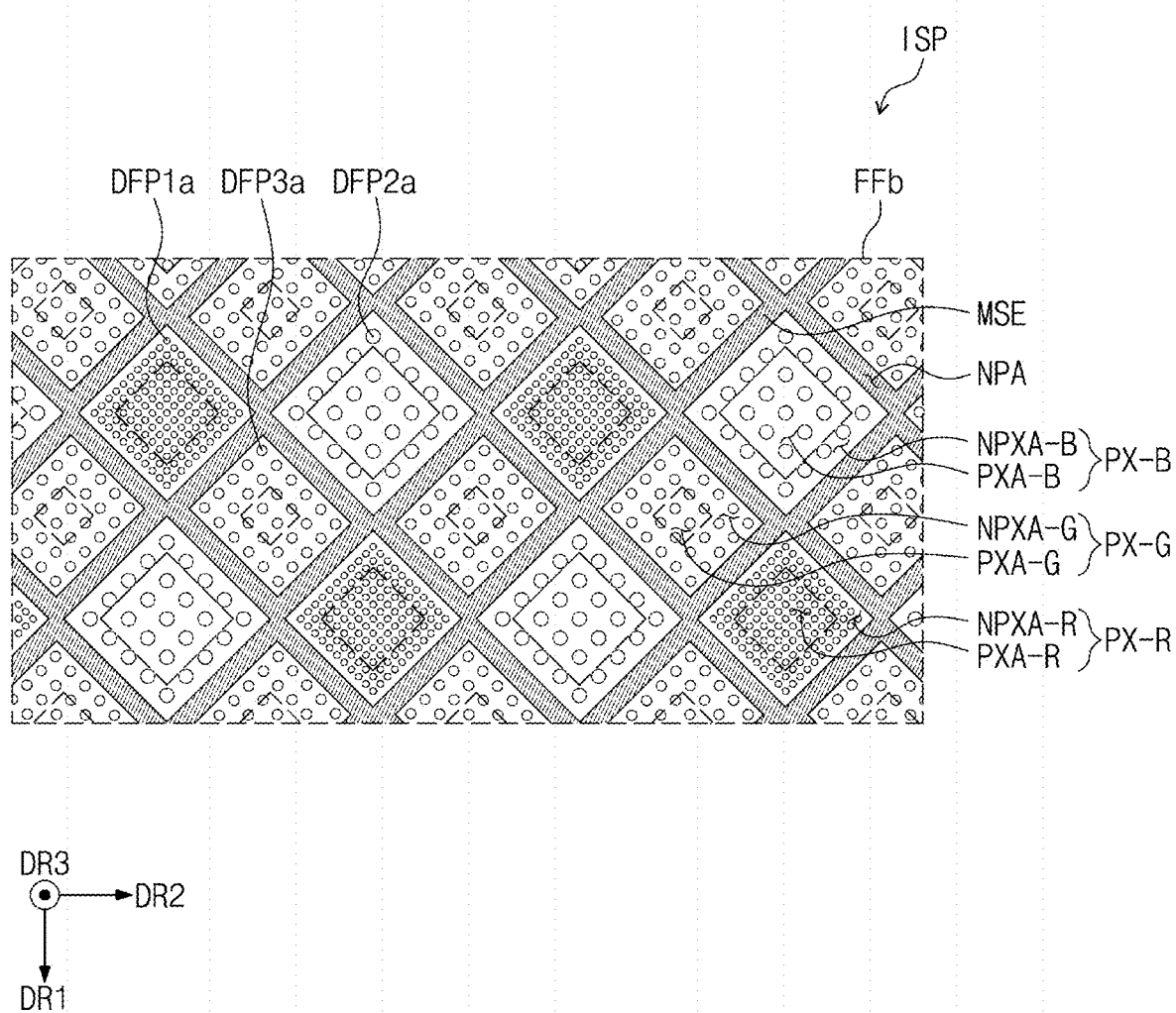
FIGS. 9, 10, and 11 are plan views of enlarged portions of an input sensing unit according to some embodiments.
Figure 10:
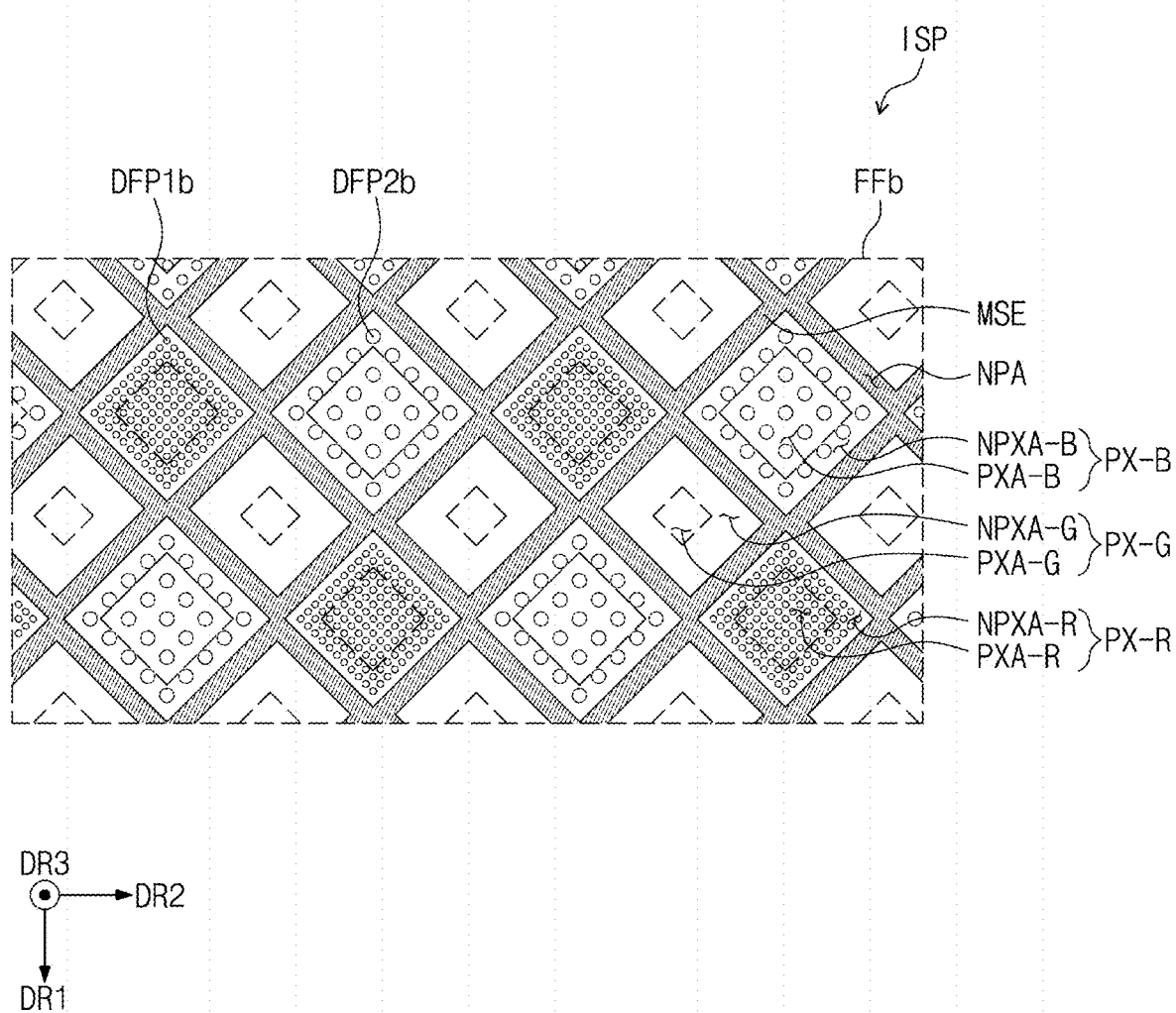
Figure 11:
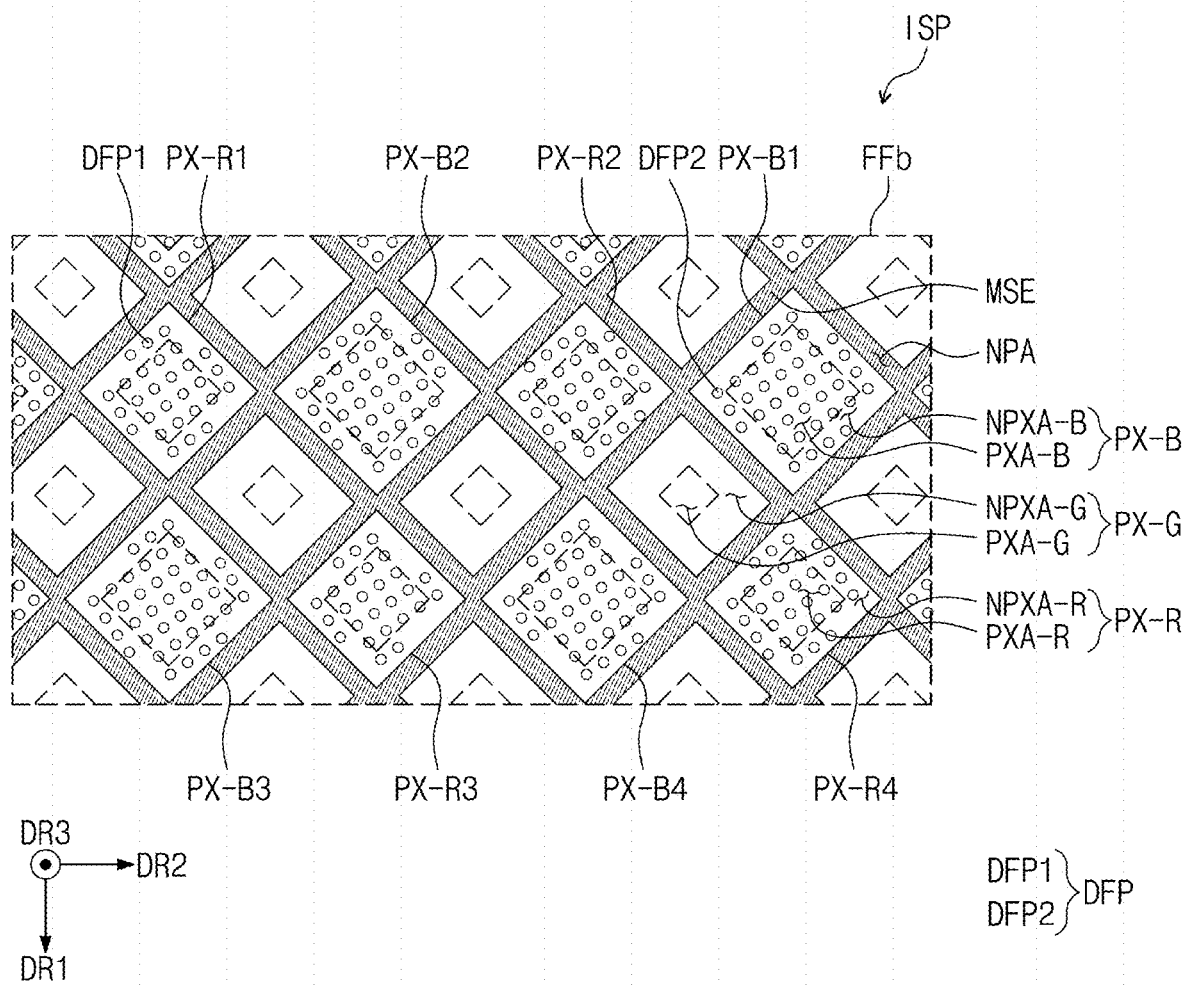

FIGS. 9 to 11 are plan views of enlarged portions of an input sensing unit according to some embodiments. Hereinafter, in describing the arrangements of diffraction patterns of the input sensing unit according to embodiments with reference to FIGS. 9 to 11, the same reference numerals are given for the same components as those described above, and duplicative detailed descriptions are omitted.

Referring to FIG. 9, the input sensing unit ISP according to an embodiment may be arranged to have a certain period, and may include a plurality of diffraction patterns DFP1*a*, DFP2*a*, and DFP3*a* diffracting at least a portion of the light, and the plurality of diffraction patterns DFP1*a*, DFP2*a*, and DFP3*a* may include a plurality of first diffraction patterns DFP1*a* disposed on upper portions of each of the first pixels PX-R, a plurality of second diffraction patterns DFP2*a* disposed on upper portions of each of the second pixels PX-B, and a plurality of third diffraction patterns DFP3*a* disposed on upper portions of each of the third pixels PX-G.

At least some of the plurality of diffraction patterns DFP1*a*, DFP2*a*, and DFP3*a* disposed on upper portions of each of the first pixels PX-R, the second pixels PX-B, and the third pixels PX-G may have different widths on a plane. In an embodiment, the plurality of first diffraction patterns DFP1*a* disposed on upper portions of each of the first pixels PX-R, the plurality of second diffraction patterns DFP2*a* disposed on upper portions of each of the second pixels PX-B, and the plurality of third diffraction patterns DFP3*a* disposed on upper portions of each of the third pixels PX-G may have different widths on a plane. The plurality of first diffraction patterns DFP1*a* may have a first width on a plane, the plurality of second diffraction patterns DFP2*a* may have a second width on a plane, and the plurality of third diffraction patterns DFP3*a* may have a third width on a plane. The first width may be less than the second width and the third width. The second width may be greater than the third width.

At least some of the plurality of diffraction patterns DFP1*a*, DFP2*a*, and DFP3*a* disposed on upper portions of each of the first pixels PX-R, the second pixels PX-B, and the third pixels PX-G may have different arrangement periods. In an embodiment, the plurality of first diffraction patterns DFP1*a* disposed on upper portions of each of the first pixels PX-R, the plurality of second diffraction patterns DFP2*a* disposed on upper portions of each of the second pixels PX-B, and the plurality of third diffraction patterns DFP3*a* disposed on upper portions of each of the third pixels PX-G may have different arrangement periods. The plurality of first diffraction patterns DFP1*a* each may be arranged to be spaced apart with a first period on a plane, the plurality of second diffraction patterns DFP2*a* each may be arranged to be spaced apart with a second period on a plane, and the plurality of third diffraction patterns DFP3*a* each may be arranged to be spaced apart with in a third period on a plane.

The first period may be less than the second period and the third period, and the second period may be greater than the third period.

In an embodiment, the plurality of pixels includes a first unit pixel and a second unit pixel, and, among the plurality of diffraction patterns DFP, a plurality of first unit diffraction patterns arranged in the first unit pixel and a plurality of second unit diffraction patterns arranged in the second unit pixel are differently arranged on a plane. The plurality of pixels may further include a third unit pixel, among the plurality of diffraction patterns DFP, the plurality of third unit diffraction patterns arranged in the third unit pixel may be differently arranged on a plane from the plurality of first unit diffraction patterns and the plurality of second unit diffraction patterns.

In an embodiment, the first unit pixel may be any one of the first pixels PX-R, and the second unit pixel may be any one of the second pixels PX-B. The plurality of first diffraction patterns DFP1*a* disposed on the first pixels PX-R and the plurality of second diffraction patterns DFP2*a* disposed on the second pixels PX-B are different in width on a plane, and may thus have different arrangements on a plane. The plurality of first diffraction patterns DFP1*a* disposed on the first pixels PX-R and the plurality of second diffraction patterns DFP2*a* disposed on the second pixels PX-B are different in period, and may thus have different arrangements on a plane.

Referring to FIG. 10, the input sensing unit ISP according to an embodiment is arranged to have a certain period and includes a plurality of diffraction patterns DFP1*b* and DFP2*b* diffracting at least a portion of the light. The plurality of diffraction patterns DFP1*b* and DFP2*b* may overlap only a portion of the plurality of pixels PX-R, PX-B, and PX-G. The plurality of diffraction patterns DFP1*b* and DFP2*b* may include a plurality of first diffraction patterns DFP1*b* disposed on upper portions of each of the first pixels PX-R, and a plurality of second diffraction patterns DFP2*b* disposed on upper portions of each of the second pixels PX-B. Diffraction patterns may not be disposed on upper portions of each of the third pixels PX-G. The plurality of first diffraction patterns DFP1*b* disposed on upper portions of each of the first pixels PX-R, and the plurality of second diffraction patterns DFP2*b* disposed on upper portions of each of the second pixels PX-B are different in width on a plane, and different in arrangement period.

Referring to FIG. 11, the input sensing unit ISP according to an embodiment is arranged to have a certain period and includes a plurality of diffraction patterns DFP diffracting at least a portion of the light. The plurality of diffraction patterns DFP may overlap only a portion of the plurality of pixels PX-R, PX-B, and PX-G. The plurality of diffraction patterns DFP may include a plurality of first diffraction patterns DFP1 disposed on upper portions of each of the first pixels PX-R, and a plurality of second diffraction patterns DFP2 disposed on upper portions of each of the second pixels PX-B. Diffraction patterns may not be disposed on upper portions of each of the third pixels PX-G.

The first pixels PX-R may include a plurality of first sub-pixels PX-R1, PX-R2, PX-R3, and PX-R4, and the plurality of first diffraction patterns DFP1 disposed in each of the plurality of first sub-pixels PX-R1, PX-R2, PX-R3, and PX-R4 may have different arrangements. The second pixels PX-B may include a plurality of second sub-pixels PX-B1, PX-B2, PX-B3, and PX-B4, and the plurality of second diffraction patterns DFP2 disposed in each of the plurality of second sub-pixels PX-B1, PX-B2, PX-B3, and PX-B4 may have different arrangements.

For example, the plurality of first diffraction patterns DFP1 and the plurality of second diffraction patterns DFP2 may have the same width and arrangement period on a plane, and may be oriented to have the same tilt angle along the second direction DR2. However, the arrangement and number of the plurality of first diffraction patterns DFP1 and the plurality of second diffraction patterns DFP2 in each of the plurality of first sub-pixels PX-R1, PX-R2, PX-R3, and PX-R4 and the plurality of second sub-pixels PX-B1, PX-B2, PX-B3, and PX-B4 are different from each other, and at least some of the plurality of first diffraction patterns DFP1 and the plurality of second diffraction patterns DFP2 may thus have different arrangements.

Figure 12A:
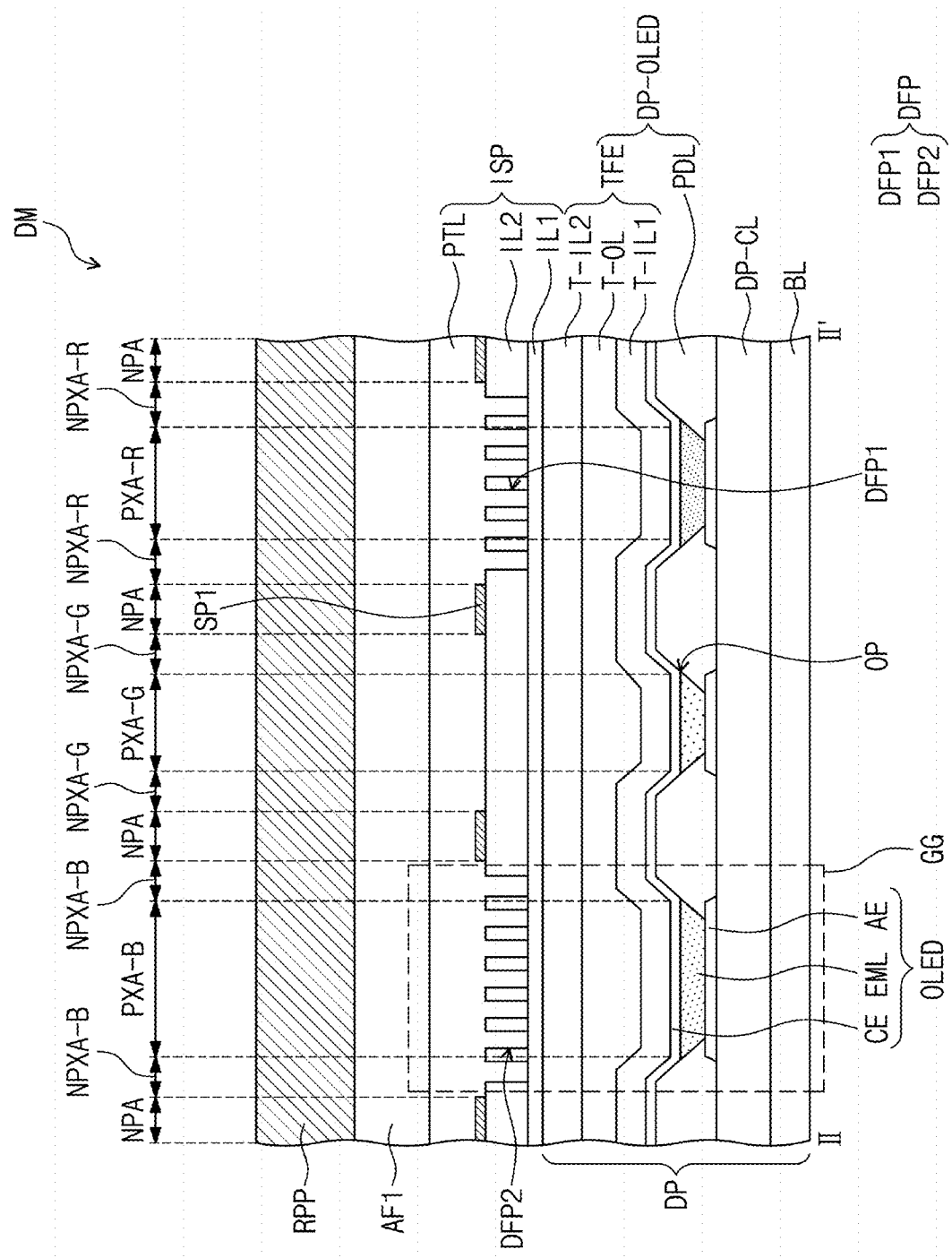
FIG. 12A is a cross-sectional view of a display module according to an embodiment.
Figure 12B:
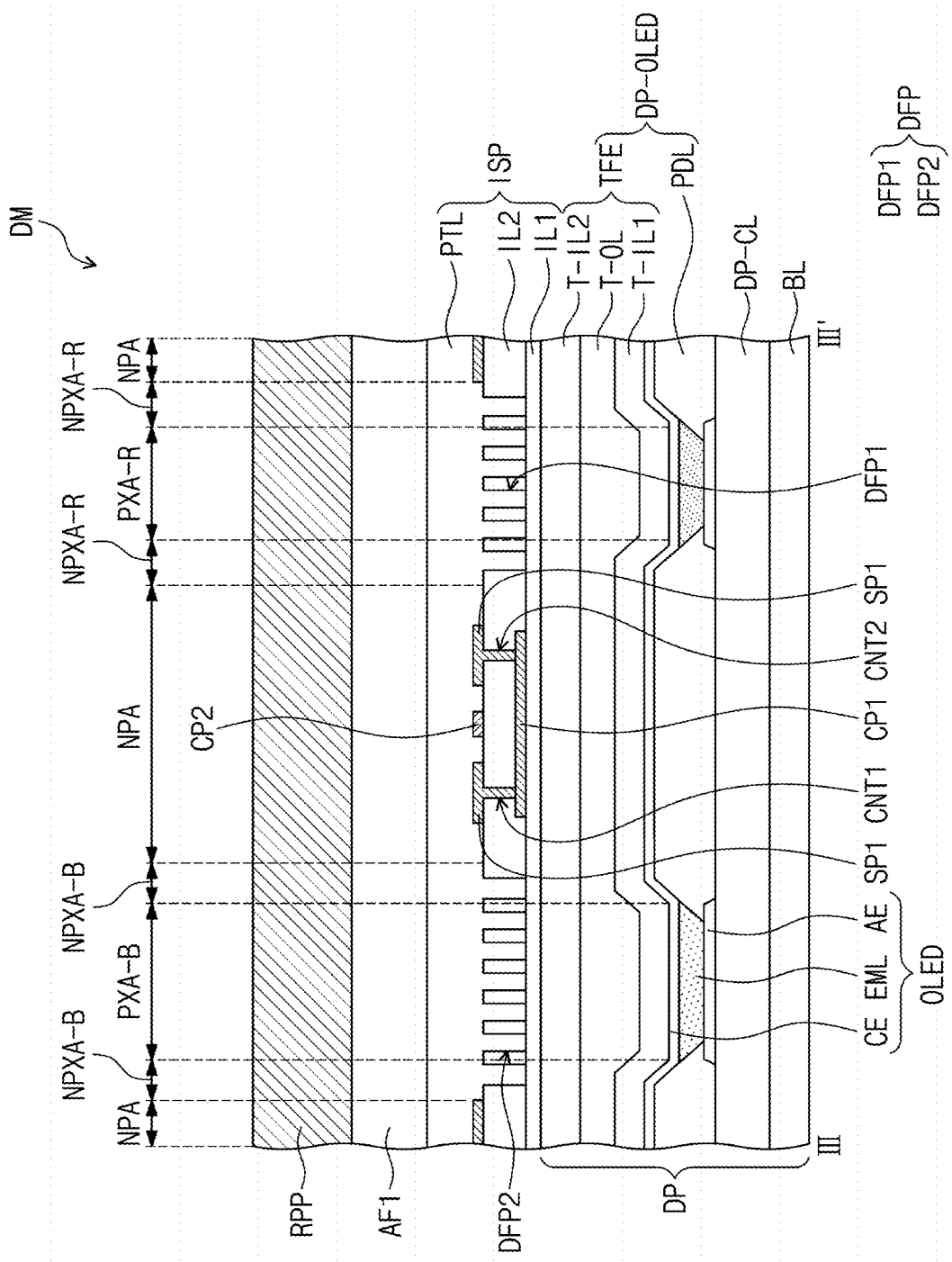
FIG. 12B is a cross-sectional view of a display module according to an embodiment.
Figure 12C:
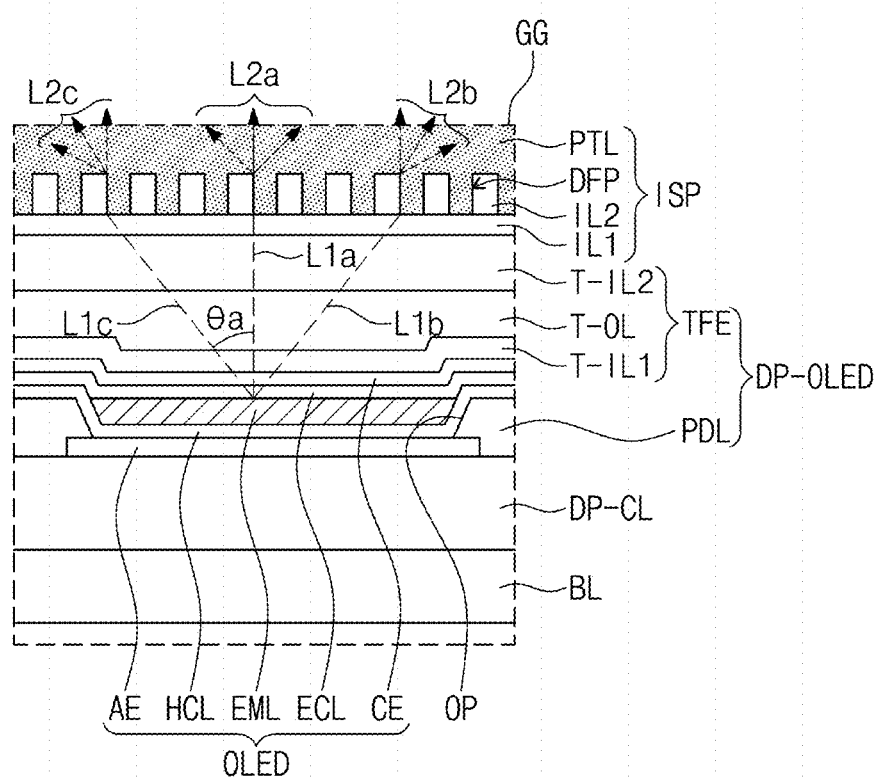
FIG. 12C is a cross-sectional view of an enlarged portion of a display module according to an embodiment.
Figure 12D:
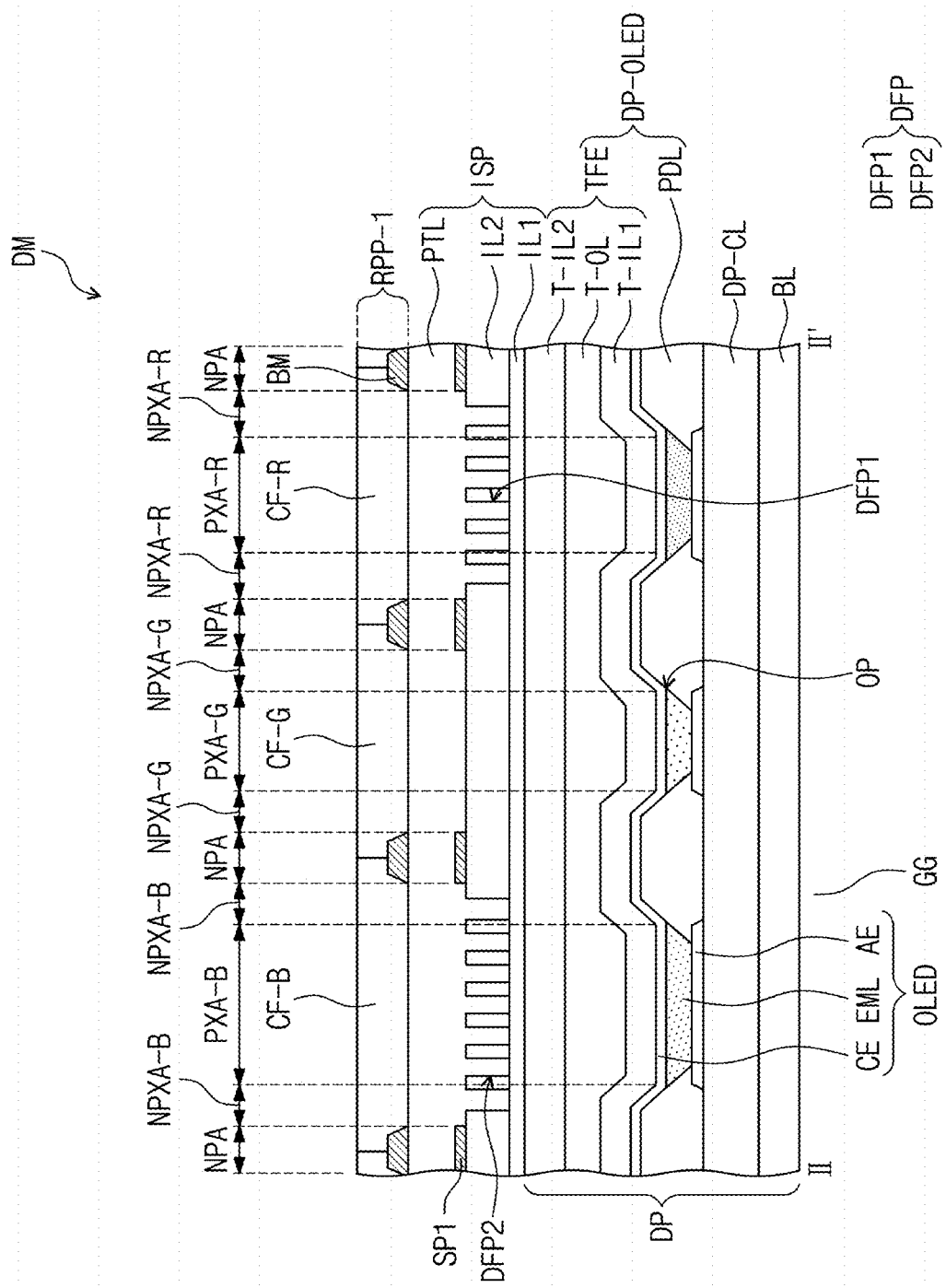
FIG. 12D is a cross-sectional view of a display module according to an embodiment.

FIG. 12A is a cross-sectional view of a display module according to an embodiment. FIG. 12B is a cross-sectional view of a display module according to an embodiment. It is noted that FIG. 12A is a cross-sectional view taken along sectional line II-II' shown in FIG. 4B according to an embodiment, and FIG. 12B is a cross-sectional view taken along sectional line shown in FIG. 3 according to an embodiment. FIG. 12C is an enlarged cross-sectional view of portion GG shown in FIG. 12A according to an embodiment. FIG. 12D is a cross-sectional view illustrating a display module according to an embodiment based on the cross-sectional view shown in FIG. 12A.

Referring to FIG. 12A, in the display module DM according to an embodiment, the display panel DP includes a base layer BL, a display circuit layer DP-CL disposed on the base layer BL, a display element layer DP-OLED, and an encapsulation layer TFE. The display panel DP may further include one or more functional layers, such as an anti-reflection layer and a refractive index control layer.

The base layer BL may include a synthetic resin layer, but embodiments are not limited thereto. A synthetic resin layer is formed on a working substrate used in manufacturing the display panel DP. Thereafter, a conductive layer and an insulating layer are formed on the synthetic resin layer. When the working substrate is removed, the synthetic resin layer corresponds to the base layer BL. The synthetic resin layer may be a polyimide resin layer, but the material is not particularly limited. In addition, the base layer BL may include a glass substrate, a metal substrate, and/or an organic/inorganic composite material substrate.

The display circuit layer DP-CL includes at least one insulating layer and a circuit element. Hereinafter, the insulating layer included in the display circuit layer DP-CL is referred to as an intermediate insulating layer. The intermediate insulating layer may include at least one intermediate inorganic layer and/or at least one intermediate organic layer. The circuit element includes signal lines, pixel driving circuits, etc. The display circuit layer DP-CL may be formed through a process of forming an insulating layer, a semiconductor layer, and a conductive layer through coating, deposition, etc., and a process of patterning the insulating layer, the semiconductor layer, and the conductive layer through a photolithography process.

The display element layer DP-OLED may include a pixel defining film PDL and an organic light emitting diode OLED. The pixel defining film PDL may include an organic material. A first electrode AE is disposed on the display circuit layer DP-CL. The pixel defining film PDL is formed over the first electrode AE. An opening OP is defined in the pixel defining film PDL. The opening OP of the pixel defining film PDL exposes at least a portion of the first electrode AE. In an embodiment, the pixel defining film PDL may be omitted.

As shown in FIGS. 4A and 12A, the display panel DP may include light emitting areas PXA-R, PXA-B, and PXA-G and non-light emitting areas NPXA-R, NPXA-G, and NPXA-B adjacent to the light emitting areas PXA-R, PXA-B, and PXA-G. Each of the non-light emitting areas NPXA-R, NPXA-G, and NPXA-B may surround the corresponding light emitting areas PXA-R, PXA-B, and PXA-G. In some embodiments, the light emitting areas PXA-R, PXA-B, and PXA-G are defined to correspond to a portion of the first electrode AE exposed through the opening OP. A non-pixel area NPA may be defined between the non-light emitting areas NPXA-R, NPXA-G, and NPXA-B. The first electrode AE may be separately formed in each of the pixels PX-R, PX-B, and PX-G.

An emission layer EML generating light is disposed on the first electrode AE. The emission layer EML may be disposed in an area corresponding to the opening OP. For instance, the emission layer EML may be separately formed in each of the pixels PX-R, PX-B, and PX-G. The emission layer EML may include an organic material and/or an inorganic material. The emission layer EML may generate a predetermined color of light. For example, the emission layer EML may generate at least one among red light, green light, and blue light.

In some embodiments, the patterned emission layer EML is illustrated as an example, but the emission layer EML may be commonly disposed in the light emitting areas PXA-R, PXA-B, and PXA-G. In this case, the emission layer EML may generate white light. In addition, the emission layer EML may have a multilayer structure referred to as a tandem structure.

As shown in FIG. 12C, a hole control layer HCL may be disposed between the emission layer EML and the first electrode AE. The hole control layer HCL may be commonly disposed in the light emitting areas PXA-R, PXA-B, and PXA-G, the non-light emitting areas NPXA-R, NPXA-G, and NPXA-B, and the non-pixel area NPA.

The second electrode CE may be disposed on the emission layer EML. The second electrode CE may be commonly disposed in the light emitting areas PXA-R, PXA-B, and PXA-G, the non-light emitting areas NPXA-R, NPXA-G, and NPXA-B, and the non-pixel area NPA.

As shown in FIG. 12C, an electron control layer ECL may be further disposed between the emission layer EML and the second electrode CE. The electron control layer ECL may be commonly formed in the light emitting areas PXA-R, PXA-B, and PXA-G, the non-light emitting areas NPXA-R, NPXA-G, and NPXA-B, and the non-pixel area NPA.

Referring to FIGS. 12A and 12C, an encapsulation layer TFE may be disposed on the second electrode CE. The encapsulation layer TFE seals the display element layer DP-OLED. The encapsulation layer TFE includes at least one insulating layer. The encapsulation layer TFE according to an embodiment may include at least one inorganic layer (hereinafter, a first encapsulation inorganic layer T-IL1). The encapsulation layer TFE according to an embodiment may further include at least one organic layer (hereinafter, an encapsulation organic layer T-OL), and at least one inorganic layer (hereinafter, a second encapsulation inorganic layer T-IL2). The encapsulation organic layer T-OL may be disposed between the first and second encapsulation inorganic layers T-IL1 and T-IL2.

The first and second encapsulation inorganic layers T-IL1 and T-IL2 protect the display element layer DP-OLED from moisture/oxygen, and the encapsulation organic layer T-OL protects the display element layer DP-OLED from foreign substances, such as dust particles. The first and second encapsulation inorganic layers T-IL1 and T-IL2 may include at least one of a silicon nitride layer, a silicon oxynitride layer, a silicon oxide layer, a titanium oxide layer, an aluminum oxide layer, and the like, but is not particularly limited thereto. The encapsulation organic layer T-OL may include an acrylic-based organic layer, but is not particularly limited thereto.

The input sensing unit ISP includes a first insulating layer IL1, a first conductive layer disposed thereon, a second insulating layer IL2 covering the first conductive layer, and a second conductive layer disposed on the second insulating layer IL2. The first insulating layer IL1 may include an inorganic material, for example, the first insulating layer IL1 may include at least one of a silicon nitride layer, a silicon oxide layer, and a silicon oxynitride layer. A layer disposed on an uppermost side of the encapsulation layer TFE, for example, the second encapsulation inorganic layer T-IL2 may also include at least one of a silicon nitride layer, a silicon oxide layer, and a silicon oxynitride layer, and the at least one of the silicon nitride layer, the silicon oxide layer, and the silicon oxynitride layer of the encapsulation layer TFE and the first insulating layer IL1 may be formed under different deposition conditions.

Referring to FIGS. 3, 4B, 12A, and 12B, the first conductive layer is disposed on the first insulating layer IL1. The first conductive layer may include a first connection unit CP1. The second conductive layer is disposed on the first conductive layer. The second conductive layer may include a first sensor unit SP1, a second sensor unit SP2, and a second connection unit CP2.

The second conductive layer IL2 is disposed between the first conductive layer and the second conductive layer. The second insulating layer IL2 separates the first conductive layer and the second conductive layer at a distance on a cross section. First and second contact holes CNT1 and CNT2 for partially exposing the first connection unit CP1 are provided in the second insulating layer IL2. The first connection unit CP1 may be connected to two first sensor units SP1 adjacent to each other, respectively, through the first and second contact holes CNT1 and CNT2. The second connection unit CP2 may be formed to pass through the separation space between the two first sensor units SP1 adjacent to each other. The second connection unit CP2 is electrically insulated from the two adjacent second sensor units SP2.

FIG. 12B illustrates that a structure in which the first conductive layer includes the first connection unit CP1, and the second conductive layer includes the first sensor unit SP1, the second sensor unit SP2, and the second connection unit CP2 but embodiments are not limited thereto. For example, the first conductive layer may include the second connection unit CP2, and the second conductive layer may include the first sensor unit SP1, the second sensor unit SP2, and the first connection unit CP1. As another example, the first conductive layer may include the first sensor unit SP1, the second sensor unit SP2, and the first connection unit CP1, and the second conductive layer may include the second connection unit CP2.

The second insulating layer IL2 may include an inorganic material. For example, the second insulating layer IL2 may include at least one of a silicon nitride layer, a silicon oxide layer, and a silicon oxynitride layer. In an embodiment, the second insulating layer IL2 may have a greater thickness than the first insulating layer IL1.

The plurality of diffraction patterns DFP may be formed on and/or in at least one of the first insulating layer IL1 and the second insulating layer IL2. FIG. 12A illustrates a structure in which the plurality of diffraction patterns DFP are formed in the second insulating layer IL2, but embodiments are not limited thereto.

The plurality of diffraction patterns DFP are arranged to have a certain period, and diffract at least a portion of the light output from the emission layer EML. For instance, the diffraction patterns DFP diffract at least a portion of the light incident on the input sensing unit ISP. The diffraction patterns DFP each are in the form of a hole passing through the second insulating layer IL2. For example, the second insulating layer IL2 may include the plurality of diffraction patterns DFP defined by a plurality of holes passing through the second insulating layer IL2 in the third direction DR3. The first insulating layer IL1 may be partially exposed through the diffraction patterns DFP.

A process of forming the plurality of diffraction patterns DFP in the second insulating layer IL2 may be performed together with a process of forming the first and second contact holes CNT1 and CNT2 in the second insulating layer IL2. For instance, the plurality of diffraction patterns DFP and the first and second contact holes CNT1 and CNT2 may be formed together through the same process. Accordingly, a separate patterning process of forming the diffraction patterns DFP may not be required, and as a result, in forming a display device, the overall number of masks and process time may be reduced or at least not increased.

The plurality of diffraction patterns DFP may not overlap the non-pixel area NPA. The first and second conductive layers SP1, SP2, CP1, and CP2 may be disposed corresponding to the non-pixel area NPA. Accordingly, the plurality of diffraction patterns DFP may be provided not to overlap the first and second conductive layers SP1, SP2, CP1, and CP2.

The input sensing unit ISP further includes a protective layer PL. The protective layer PL covers the second insulating layer IL2 and the second conductive layers SP1, SP2, and CP2. In addition, the protective layer PL may cover the first insulating layer IL1 exposed through the plurality of diffraction patterns DFP. For instance, the protective layer PL is formed to fill a space in which the plurality of diffraction patterns DFP are defined.

The protective layer PL may include an organic material. The protective layer PL may include an acrylic-based resin, but embodiments are not limited thereto. The protective layer PL may have a greater thickness than the first and second insulating layers IL1 and IL2. In addition, the protective layer PL may have a greater refractive index than the first and second insulating layers IL1 and IL2. For example, the protective layer PL may have a refractive index of about 1.6, and the first insulating layer IL1 and the second insulating layer IL2 may have a refractive index of about 1.9.

A first adhesive film AF1 and an anti-reflection unit RPP may be disposed on the protective layer PL. The anti-reflection unit RPP may be bonded to the protective layer PL through the first adhesive film AF1.

Referring to FIG. 12C, an organic light emitting diode OLED according to an embodiment generates first light L1a, L1b, and L1c. The first light L1a, L1b, and L1c generated from the organic light emitting diode OLED passes through the encapsulation layer TFE and is provided to the input sensing unit ISP. The first light L1a, L1b, and L1c generated from the organic light emitting diode OLED includes front light L1a travelling upwards along the third direction DR3 perpendicular to the front surface IS (shown in FIG. 1A), and first side light L1b and second side light L1c tilting with respect to the front light L1a. For the convenience of description, in FIG. 12C, out of the side light L1b and L1c, only the first side light L1b and the second side light L1c emitted in a direction forming a first angle ($\Theta$a) with respect to the front light L1a is illustrated.

The first light L1a, L1b, and L1c generated from the organic light emitting diode OLED is diffracted into second light L2a, L2b, and L2c by the diffraction patterns DFP provided to the input sensing unit ISP. The first light L1a, L1b, and L1c may be diffracted by the diffraction patterns DFP, but also be diffracted due to a difference in refractive indexes between the protective layer PL and the second insulating layer IL2 filled in the portion in which the diffraction patterns DFP are formed. For example, when there is a difference in refractive index between the protective layer PL and the second insulating layer IL2 compared to a case of having no difference in refractive index between the protective layer PL and the second insulating layer IL2, the diffraction by the diffraction patterns DFP described above may be greater.

The second light L2a, L2b, and L2c includes first diffraction light L2a generated according to the front light L1a being diffracted, and second diffraction light L2b and the third diffraction light L2c generated according to the first side light L1b and the second side light L1c being diffracted. The first diffraction light L2a may include a plurality of light traveling in the same or different direction as the front light L1a. For example, the front light L1a may be output not only in a front direction, but also in a side direction. In addition, the second diffraction light L2b may include a plurality of light traveling in the same or different direction as the first side light L1b, and the third diffraction light L2c may include a plurality of light traveling in the same or different direction as the second side light L1c. Accordingly, the first side light L1b and the second side light L1c may be output in the front direction as well as in a side direction.

Accordingly, the first light L1a, L1b, and L1c generated from the organic light emitting diode OLED is diffracted by the diffraction patterns DFP, and thus, an optical path is changed to the front direction and the side direction(s) to reduce a color difference between the front and side directions, and as a result, overall viewing angle properties of the display device DD may be enhanced.

FIG. 12D illustrates an embodiment in which an anti-reflection layer RPP-1 is different based on the cross section shown in FIG. 12A. In the display module DM of this embodiment, the anti-reflection layer RPP-1 may be disposed directly on the input sensing unit ISP without a separate adhesive film.

The anti-reflection layer RPP-1 may include a light blocking pattern BM, a first color filter CF-R, a second color filter CF-B, and a third color filter CF-G.

The light blocking pattern BM may overlap the non-pixel area NPA. The light blocking pattern BM may partially overlap the non-light emitting areas NPXA-G, NPXA-R, and NPXA-B. The light blocking pattern BM is a pattern in black, and may include a light blocking pattern. In an embodiment, the light blocking pattern BM may include a black coloring agent. The black coloring agent may include a black dye and/or a black pigment. The black coloring agent may include at least one of carbon black, a metal (such as chromium), and an oxide thereof.

The first color filter CF-R, the second color filter CF-B, and the third color filter CF-G correspond to the first light emitting area PXA-R, the second light emitting area PXA-B, and the third light emitting area PXA-G, respectively. The first color filter CF-R transmits first light, which is red light, the second color filter CF-B, transmits second light, which is blue light, and the third color filter CF-G transmits third light, which is green light.

The first color filter CF-R, the second color filter CF-B, and the third color filter CF-G may reduce reflectance of external light. The first color filter CF-R, the second color filter CF-B, and the third color filter CF-G each transmit light in a predetermined wavelength range, and absorb light outside the corresponding wavelength range, and may thus absorb most of natural light incident from the outside and reflect only some.

The first color filter CF-R, the second color filter CF-B, and the third color filter CF-G each include a base resin and dyes and/or pigments dispersed in the base resin. The base resin is a medium in which dyes and/or pigments are dispersed, and may be formed of various resin compositions that may be generally referred to as binders.

FIGS. 13A to 13G are plan views of some components of an input sensing unit according to some embodiments. It is noted that FIGS. 13A to 13G are plan views of enlarged portions of the second insulating layer shown in FIG. 12A according to some embodiments.

Figure 13A:
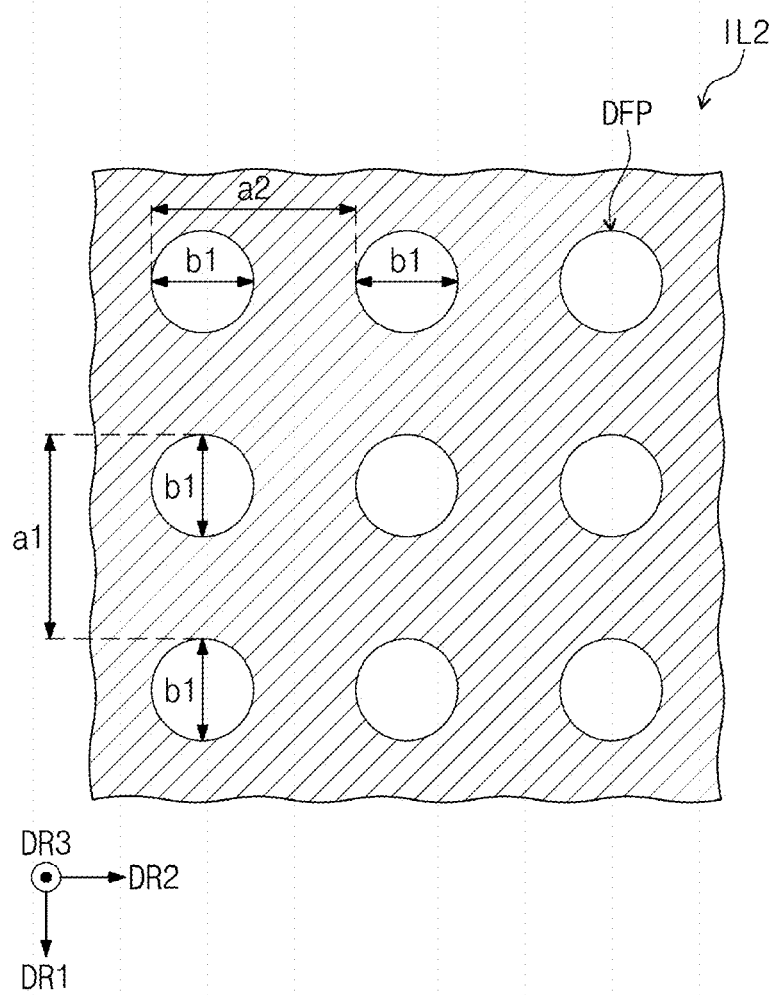
FIGS. 13A, 13B, 13C, 13D, 13E, 13F, and 13G are plan views of some components of an input sensing unit according to various embodiments.

Referring to FIGS. 12C and 13A together, the diffraction patterns DFP may be arranged with a certain period (hereinafter, an arrangement period). The diffraction patterns DFP are arranged with a first arrangement period a1 in the first direction DR1 and with a second arrangement period a2 in the second direction DR2. As shown in FIG. 13A, the first arrangement period a1 and the second arrangement period a2 may be the same, but are not limited thereto. For instance, the first arrangement period a1 and the second arrangement period a2 may have different values. The first arrangement period a1 and the second arrangement period a2 may be, for example, about 4.5 μm. The arrangement periods a1 and a2 of the plurality of diffraction patterns DFP may be less than the widths of the corresponding light emitting areas PXA-R, PXA-B, and PXA-G.

The diffraction patterns DFP each may have a regular width (e.g., diameter) b1. In an embodiment, the width b1 of each of the diffraction patterns DFP may be about 1 μm.

As shown in FIG. 13A, the diffraction patterns DFP may be in the form of a circle on a plane. In addition, the plurality of diffraction patterns DFP may be arranged in the form of a matrix. However, the form of the diffraction patterns DFP is not limited to a circle. For instance, the diffraction patterns DFP may have any one of various forms, such as ellipses, polygons, stripes, etc.

Figure 13B:
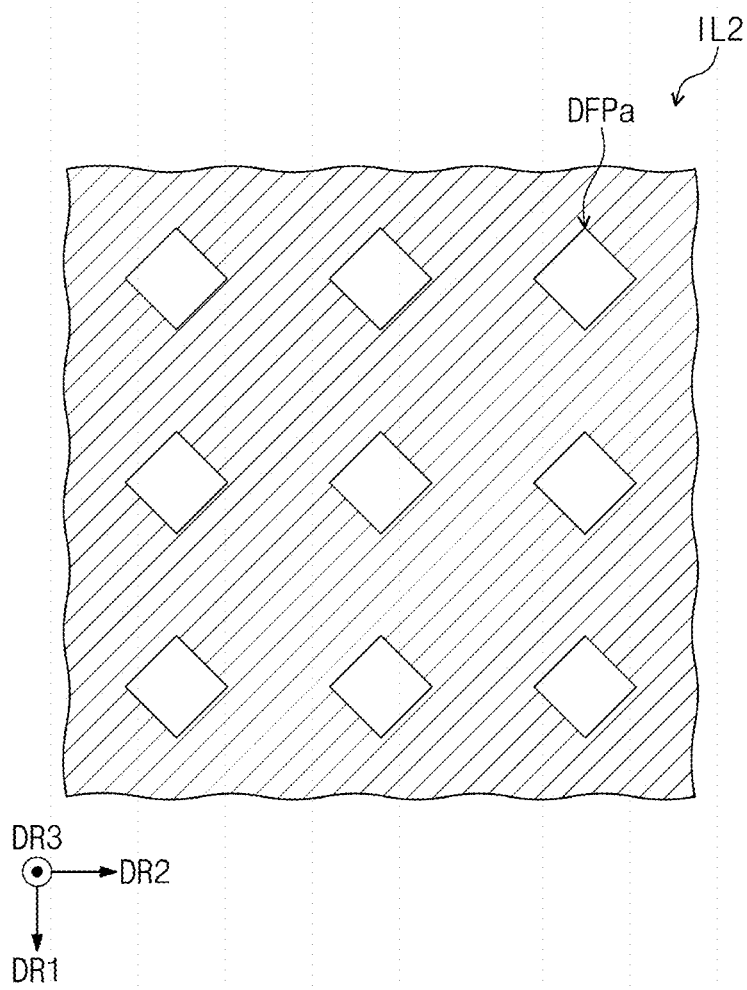
Figure 13C:
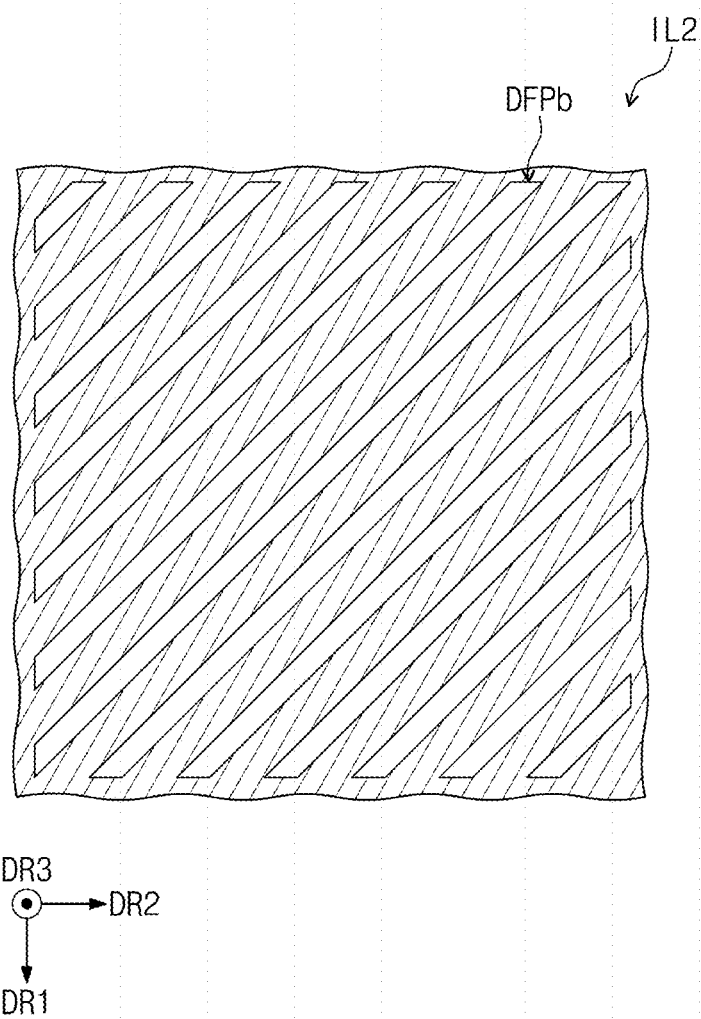

Referring to FIGS. 13A to 13C, the diffraction patterns DFP, DFPa, and DFPb may be in the form of a hole passing through the second insulating layer IL2.

As shown in FIG. 13B, the diffraction patterns DFPa according to an embodiment may have the form of a rectangular hole. The diffraction patterns DFPa may be arranged in the form of a matrix. In addition, as shown in FIG. 13C, the diffraction patterns DFPb may be in the form of a stripe extending along in a predetermined direction. The direction that the diffraction patterns DFPb extend may not be particularly limited. For example, the diffraction patterns DFPb may extend in the first and second directions DR1 and DR2 or may extend in a direction tilting from the first and second directions DR1 and DR2.

Figure 13D:
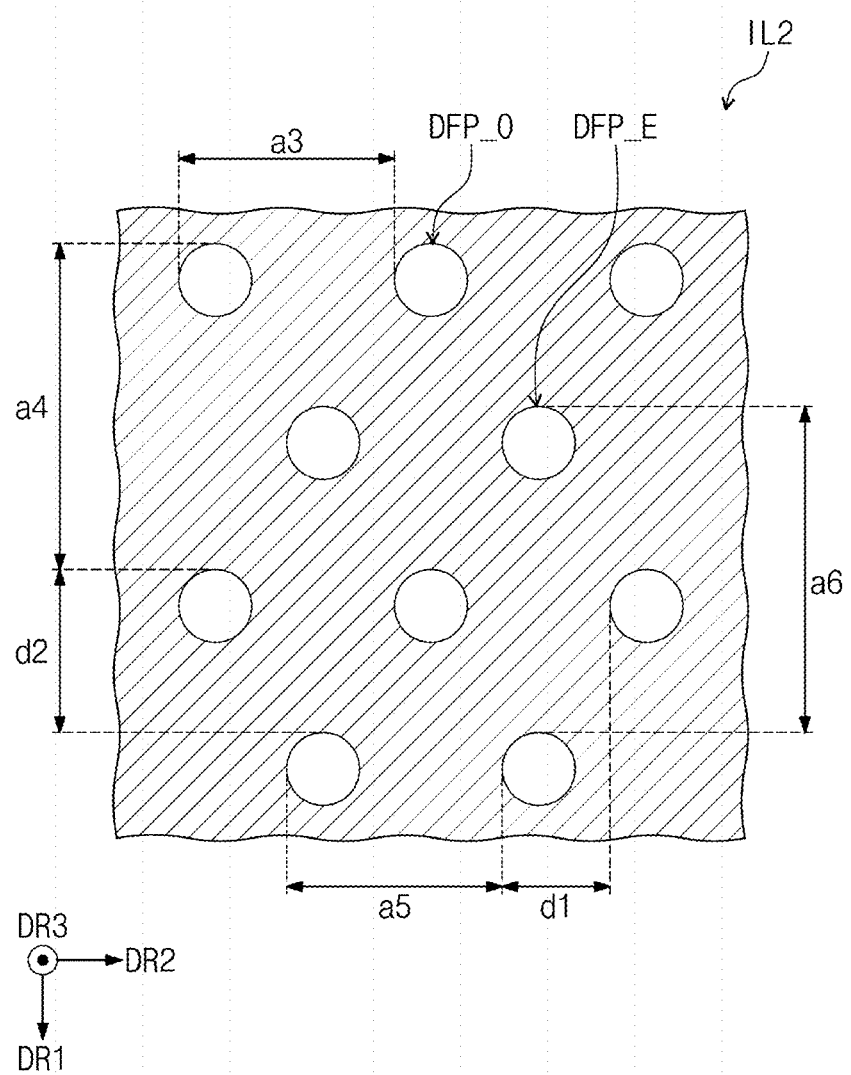

Referring to FIG. 13D, diffraction patterns DFP_O and DFP_E include diffraction patterns DFP_O arranged in odd-numbered rows and diffraction patterns DFP_E arranged in even-numbered rows. The diffraction patterns DFP_O arranged in odd-numbered rows are arranged with a third arrangement period a3 in a row direction and with a fourth arrangement period a4 in a column direction. The diffraction patterns DFP_E arranged in even-numbered rows are arranged with a fifth arrangement period a5 in a row direction and with a sixth arrangement period a6 in a column direction. The number of diffraction patterns DFP_O arranged in odd-numbered rows may be different from the number of diffraction patterns DFP_E arranged in even-numbered rows. In an embodiment, the third arrangement period a3 may have a value equal to or different from the fifth arrangement period a5, and the fourth arrangement period a4 may have a value equal to or different from the sixth arrangement period a6.

The diffraction patterns DFP_O arranged in odd-numbered columns and the diffraction patterns DFP_E arranged in even-numbered columns adjacent thereto are arranged with a seventh arrangement period d1 in a row direction. In this case, the third arrangement period a3 or the fifth arrangement period a5 may be two times greater than the seventh arrangement period d1. The diffraction patterns DFP_O arranged in odd-numbered rows and the diffraction patterns DFP_E arranged in even-numbered rows adjacent thereto are arranged with an eighth arrangement period d2 in a column direction. In this case, the fourth arrangement period a4 or the sixth arrangement period a6 may be two times greater than the eighth arrangement period d2.

Figure 13E:
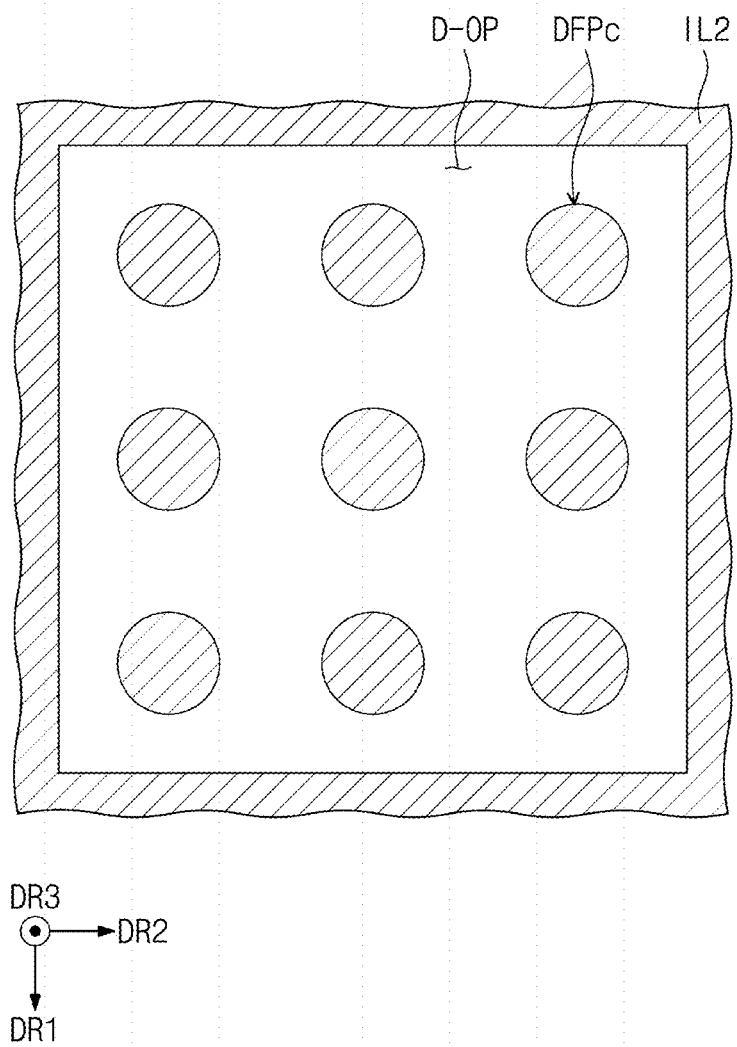
Figure 13F:
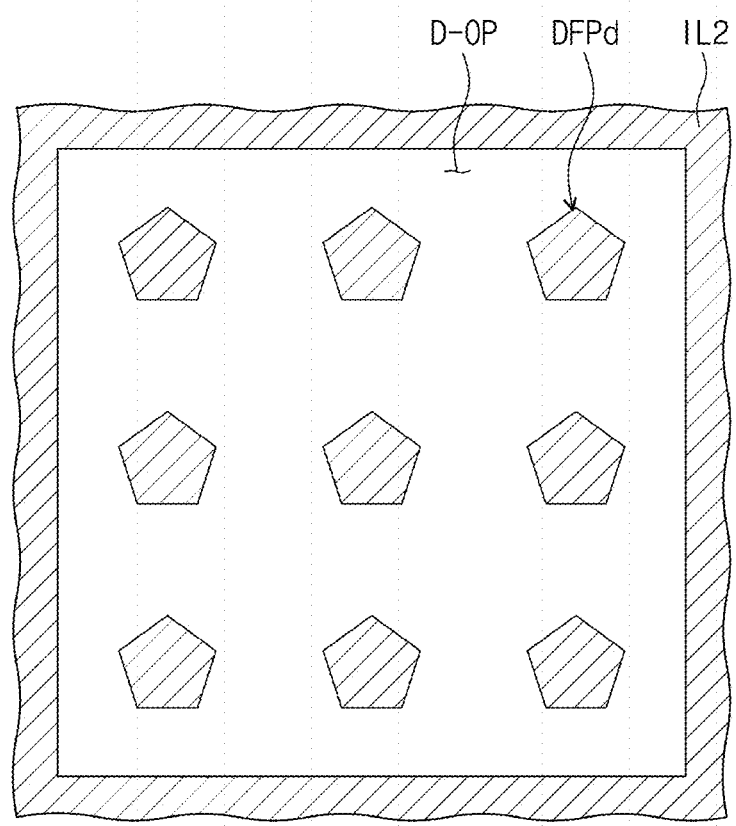
Figure 13F:
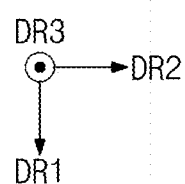

Referring to FIGS. 13E and 13F, diffraction patterns DFPc and DFPd may be in the form of a column. The diffraction patterns DFPc and DFPd according to an embodiment may be spaced apart from each other and provided in the form of an island. The second insulating layer IL2 is provided with a diffraction open portion D-OP in a size corresponding to the light emitting areas of each pixel, and the diffraction patterns DFPc and DFPd provided in the form of a column may be disposed in the diffraction open portion D-OP.

As shown in FIG. 13A, the diffraction patterns DFPc may be in the form of a cylindrical column. The diffraction patterns DFPc may be arranged in the form of a matrix.

As shown in FIG. 13F, the diffraction patterns DFPd may be in the form of a polygonal column, for example, a square, pentagonal, or hexagonal column. Further, the diffraction patterns DFPd may be in the form of a stripe-shaped column extending in a predetermined direction.

Figure 13G:
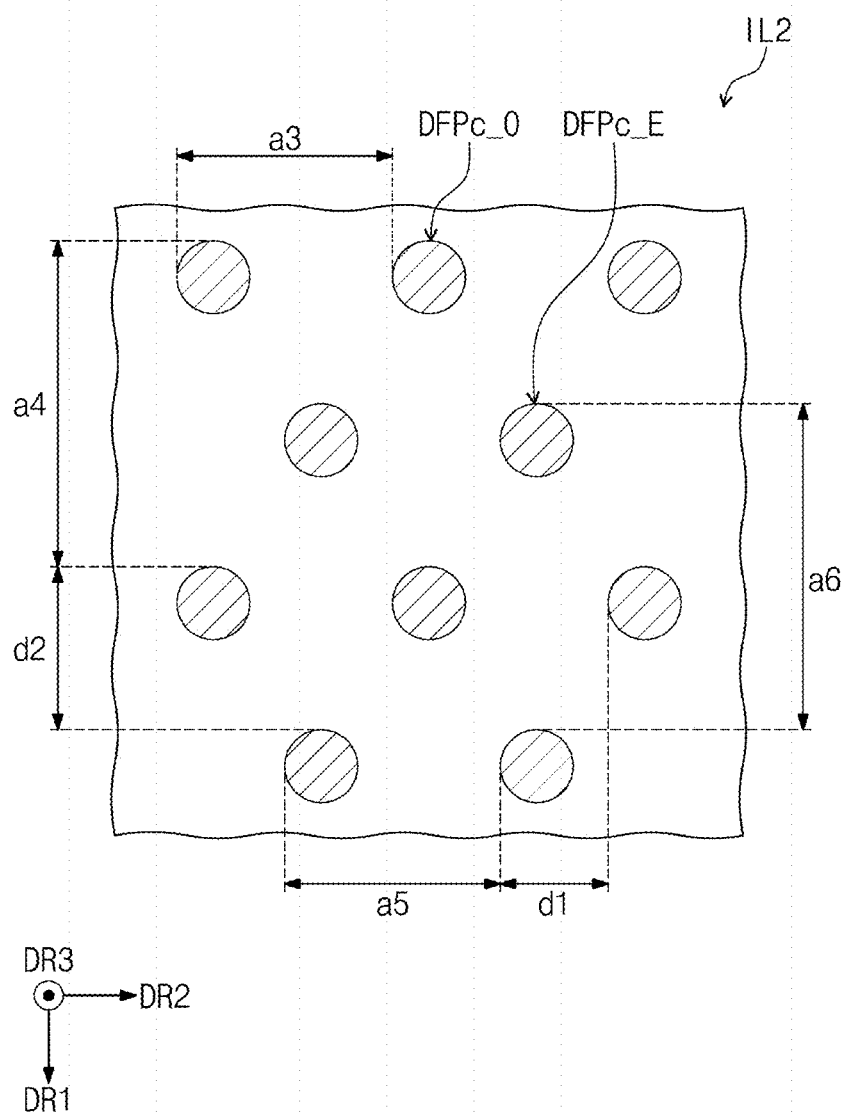

Referring to FIG. 13G, diffraction patterns DFPc_O and DFPc_E include diffraction patterns DFPc_O arranged in odd-numbered rows and diffraction patterns DFPc_E arranged in even-numbered rows. The diffraction patterns DFPc_O disposed in odd-numbered rows and the diffraction patterns DFPc_E disposed in even-numbered rows may be in the same form. For example, the diffraction patterns DFPc_O arranged in odd-numbered rows and the diffraction patterns DFPc_E arranged in even-numbered rows may be in the form of a cylindrical column.

The diffraction patterns DFPc_O arranged in odd-numbered rows are arranged with a third arrangement period a3 in a row direction and with a fourth arrangement period a4 in a column direction. The diffraction patterns DFPc_E arranged in even-numbered rows are arranged with a fifth arrangement period a5 in a row direction and with a sixth arrangement period a6 in a column direction. The number of diffraction patterns DFPc_O arranged in odd-numbered rows may be different from the number of diffraction patterns DFPc_E arranged in even-numbered rows. In an embodiment, the third arrangement period a3 may have a value equal to or different from the fifth arrangement period a5, and the fourth arrangement period a4 may have a value equal to or different from the sixth arrangement period a6.

The diffraction patterns DFPc_O arranged in odd-numbered columns and the diffraction patterns DFPc_E arranged in even-numbered columns adjacent thereto are arranged with a seventh arrangement period d1 in a row direction. In this case, the third arrangement period a3 and the fifth arrangement period a5 may be two times greater than the seventh arrangement period d1. The diffraction patterns DFPc_O arranged in odd-numbered rows and the diffraction patterns DFPc_E arranged in even-numbered rows adjacent thereto are arranged with an eighth arrangement period d2 in a column direction. In this case, the fourth arrangement period a4 and the sixth arrangement period a6 may be two times greater than the eighth arrangement period d2.

FIGS. 14A to 14I are cross-sectional views of a display module according to some embodiments. Hereinafter, in describing the display module according to some embodiments with reference to FIGS. 14A to 14I, the same reference numerals are given for the same components as those described above, and duplicative detailed descriptions are omitted.

Referring to FIGS. 3, 4B, and 14A, in the display module DM according to an embodiment, the input sensing unit ISP includes a first insulating layer IL1, first and second conductive layers SP1, SP2, CP1, and CP2, a second insulating layer IL2, and a protective layer PL.

The plurality of diffraction patterns DFP may be provided in the first insulating layer IL1 and the second insulating layer IL2. Compared to the display module DM shown in FIG. 12A, the plurality of diffraction patterns DFP in the display module DM shown in FIG. 14A include a plurality of first layer diffraction patterns DFP-a formed on (or in) the first insulating layer IL1 and a plurality of second layer diffraction patterns DFP-b formed on (or in) the second insulating layer IL2. The second layer diffraction patterns DFP-b may be disposed corresponding to the first layer diffraction patterns DFP-a. For instance, the second layer diffraction patterns DFP-b may be disposed on the first layer diffraction patterns DFP-a.

The first layer diffraction patterns DFP-a each are in the form of a hole passing through the first insulating layer IL1, and the second layer diffraction patterns DFP-b are in the form of a hole passing through the second insulating layer IL2. For example, the first insulating layer IL1 and the second insulating layer IL2 may include the plurality of diffraction patterns DFP defined by a plurality of holes passing through the first and second insulating layers IL1 and IL2 in the third direction DR3, and the plurality of diffraction patterns DFP may include first layer diffraction patterns DFP-a and second layer diffraction patterns DFP-b. The second encapsulation inorganic layer T-IL2 disposed on an uppermost side of the encapsulation layer TFE may be partially exposed through the plurality of diffraction patterns DFP.

The first layer diffraction patterns DFP-a and the second layer diffraction patterns DFP-b may have a similar structure to any one of the diffraction patterns DFP, DFPa, DFPb, DFPc, and DFPd shown in FIGS. 13A to 13G. Accordingly, detailed descriptions of the structures of each of the first layer diffraction patterns DFP-a and the second layer diffraction patterns DFP-b will be omitted.

The first layer diffraction patterns DFP-a and the second layer diffraction patterns DFP-b may overlap the light emitting areas PXA-R, PXA-B, and PXA-G. The first layer diffraction patterns DFP-a and the second layer diffraction patterns DFP-b may overlap the non-light emitting areas NPXA-G, NPXA-R, and NPXA-B.

The input sensing unit ISP further includes a protective layer PL. The protective layer PL covers the second insulating layer IL2 and the second conductive layers SP1, SP2, and CP2. In addition, the protective layer PL may cover the second encapsulation inorganic layer T-IL2 exposed through the plurality of diffraction patterns DFP. For instance, the protective layer PL is formed to fill a space in which the plurality of diffraction patterns DFP are defined.

The protective layer PL may include an organic material. The protective layer PL may include, for example, an acrylic-based resin. The protective layer PL may have a greater thickness than the first and second insulating layers IL1 and IL2. In addition, the protective layer PL may have a greater refractive index than the first and second insulating layers IL1 and IL2. For example, the protective layer PL may have a refractive index of about 1.6, and the first insulating layer IL1 and the second insulating layer IL2 may have a refractive index of about 1.9. Accordingly, the light supplied to the diffraction patterns DFP-a, and DFP-b may be diffracted due to a difference in refractive index between the diffraction patterns DFP-a and DFP-b and the protective layer PL filled in the portion in which the diffraction patterns DFP-a and DFP-b are formed, and the first insulating layer IL1 and the second insulating layer IL2.

Figure 14B:
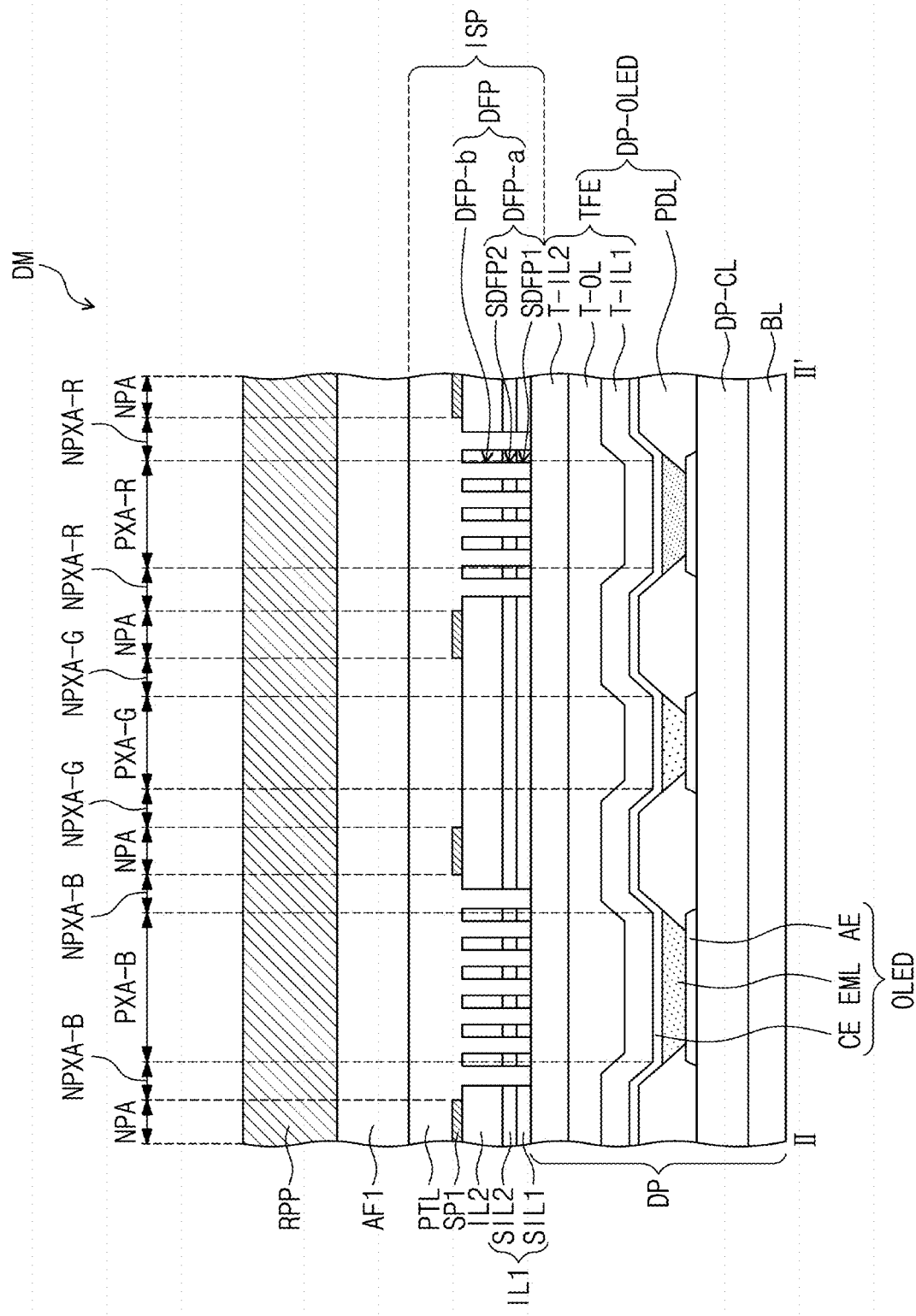

Referring to FIG. 14B, the first insulating layer IL1 may include a first sub insulating layer SIL1 and a second sub insulating layer SIL2. The first sub insulating layer SIL1 is disposed directly on the encapsulation layer TFE, and the second sub insulating layer SIL2 is disposed on the first sub insulating layer SIL1. The first sub insulating layer SIL1 and the second sub insulating layer SIL2 may include an inorganic material. The first sub insulating layer SIL1 and the second sub insulating layer SIL2 may include the same material. For example, the first sub insulating layer SIL1 and the second sub insulating layer SIL2 each may include at least one of a silicon nitride layer, a silicon oxide layer, and a silicon oxynitride layer, and the first sub insulating layer SIL1 and the second sub-insulating layer SIL2 may be formed under different deposition conditions.

The first layer diffraction patterns DFP-a provided in the first insulating layer IL1 may include a plurality of first sub layer diffraction patterns SDFP1 provided in the first sub insulating layer SIL1 and a plurality of second sub layer diffraction patterns SDFP2 provided in the second sub insulating layer SIL2. The second sub layer diffraction patterns SDFP2 may be disposed corresponding to the first sub layer diffraction patterns SDFP1. In addition, the second layer diffraction patterns DFP-b may be disposed corresponding to each of the first sub layer diffraction patterns SDFP1 and the second sub layer diffraction patterns SDFP2.

The first sub layer diffraction patterns SDFP1 each are in the form of a hole passing through the first sub insulating layer SIL1 and the second sub layer diffraction patterns SDFP2 are in the form of a hole passing through the second sub insulating layer SIL2. For example, the first insulating layer IL1 and the second insulating layer IL2 may include the plurality of diffraction patterns DFP defined by a plurality of holes passing through the first and second insulating layers IL1 and IL2 in the third direction DR3, and the plurality of diffraction patterns DFP may include first sub layer diffraction patterns SDFP1, second sub layer diffraction patterns SDFP2, and the second layer diffraction patterns DFP-b. The second encapsulation inorganic layer T-IL2 disposed on an uppermost side of the encapsulation layer TFE may be partially exposed through the plurality of diffraction patterns DFP.

The input sensing unit ISP further includes a protective layer PL. The protective layer PL covers the second insulating layer IL2 and the second conductive layers SP1, SP2, and CP2. In addition, the protective layer PL may cover the second encapsulation inorganic layer T-IL2 exposed through the plurality of diffraction patterns DFP. For example, the protective layer PL is formed to fill a space in which the plurality of diffraction patterns DFP are defined.

The light supplied to the diffraction patterns SDFP1, SDFP2, and DFP-b may be diffracted due to a difference in refractive index between the diffraction patterns SDFP1, SDFP2, and DFP-b and the protective layer PL filled in the portion in which the diffraction patterns SDFP1, SDFP2, and DFP-b are formed, and the first insulating layer IL1 and the second insulating layer IL2.

Figure 14C:
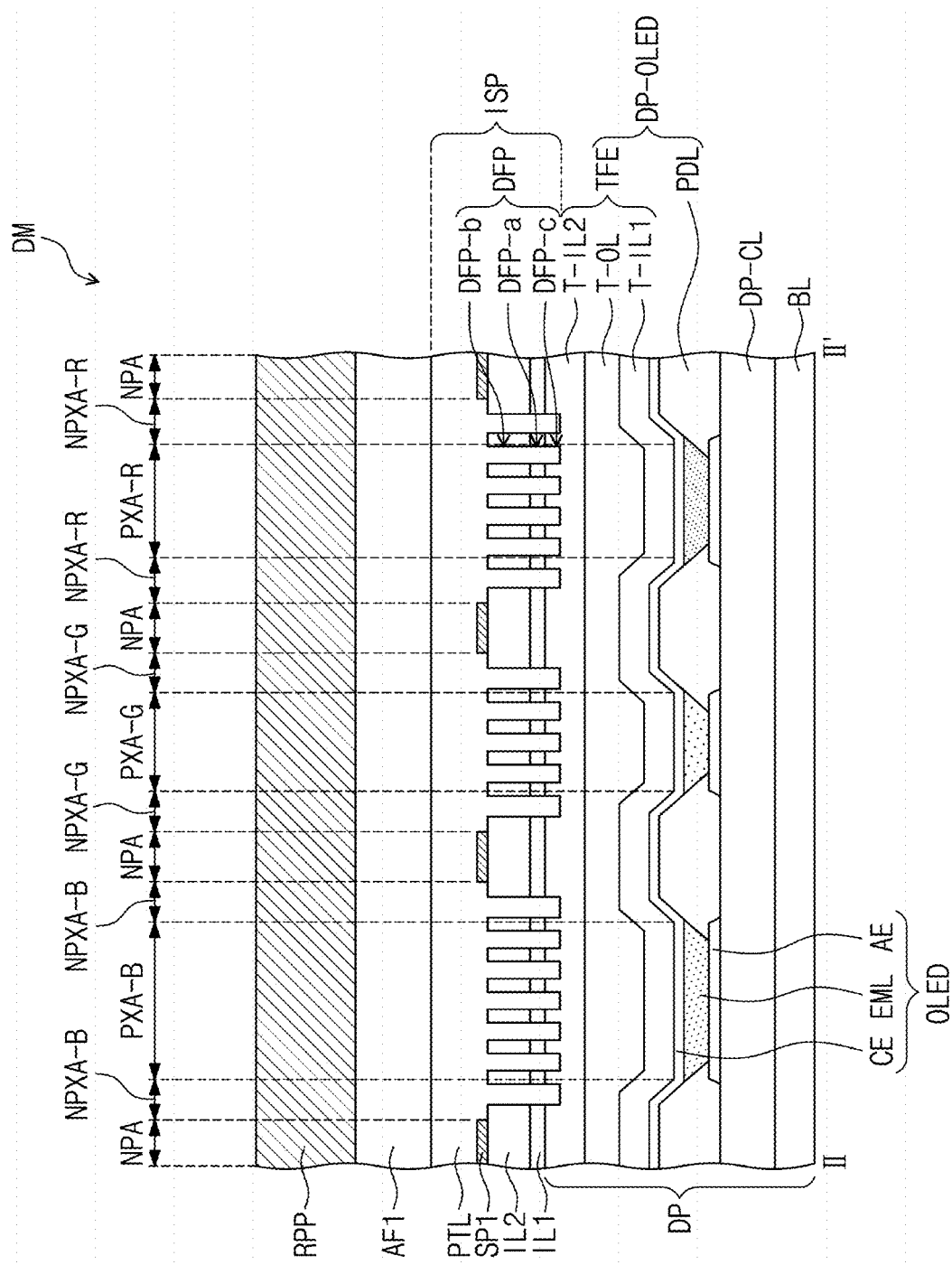

Referring to FIG. 14C, the plurality of diffraction patterns DFP are provided in the first insulating layer IL1 and the second insulating layer IL2. The plurality of diffraction patterns DFP may include a plurality of first layer diffraction patterns DFP-a formed in the first insulating layer IL1 and a plurality of second layer diffraction patterns DFP-b formed in the second insulating layer IL2. The first layer diffraction patterns DFP-a each are in the form of a hole passing through the first insulating layer IL1, and the second layer diffraction patterns DFP-b are in the form of a hole passing through the second insulating layer IL2.

In an embodiment, the encapsulation layer TFE may include third layer diffraction patterns DFP-c disposed corresponding to each of the first layer diffraction pattern DFP-a and the second layer diffraction pattern DFP-b. For example, the third layer diffraction patterns DFP-c may be provided in the second encapsulation inorganic layer T-IL2 disposed on the uppermost side of the encapsulation layer TFE. The third layer diffraction patterns DFP-c may be in the form of a groove recessed from an upper surface of the second encapsulation inorganic layer T-IL2. However, embodiments are not limited thereto. For instance, the third layer diffraction patterns DFP-c may be in the form of a hole passing through the second encapsulation inorganic layer T-IL2.

The first layer diffraction patterns DFP-a to third layer diffraction patterns DFP-c each may be formed in the first insulating layer IL1, the second insulating layer IL2, and the second encapsulation inorganic layer T-IL2, and the protective layer PL may be filled in the portion in which the first layer diffraction patterns DFP-a to the third layer diffraction patterns DFP-c are formed. Accordingly, the light output from the emission layer EML may be diffracted due to a difference in refractive index between the second encapsulation inorganic layer T-IL2, the first insulating layer IL1, the second insulating layer IL2, and the protective layer PL.

Figure 14D:
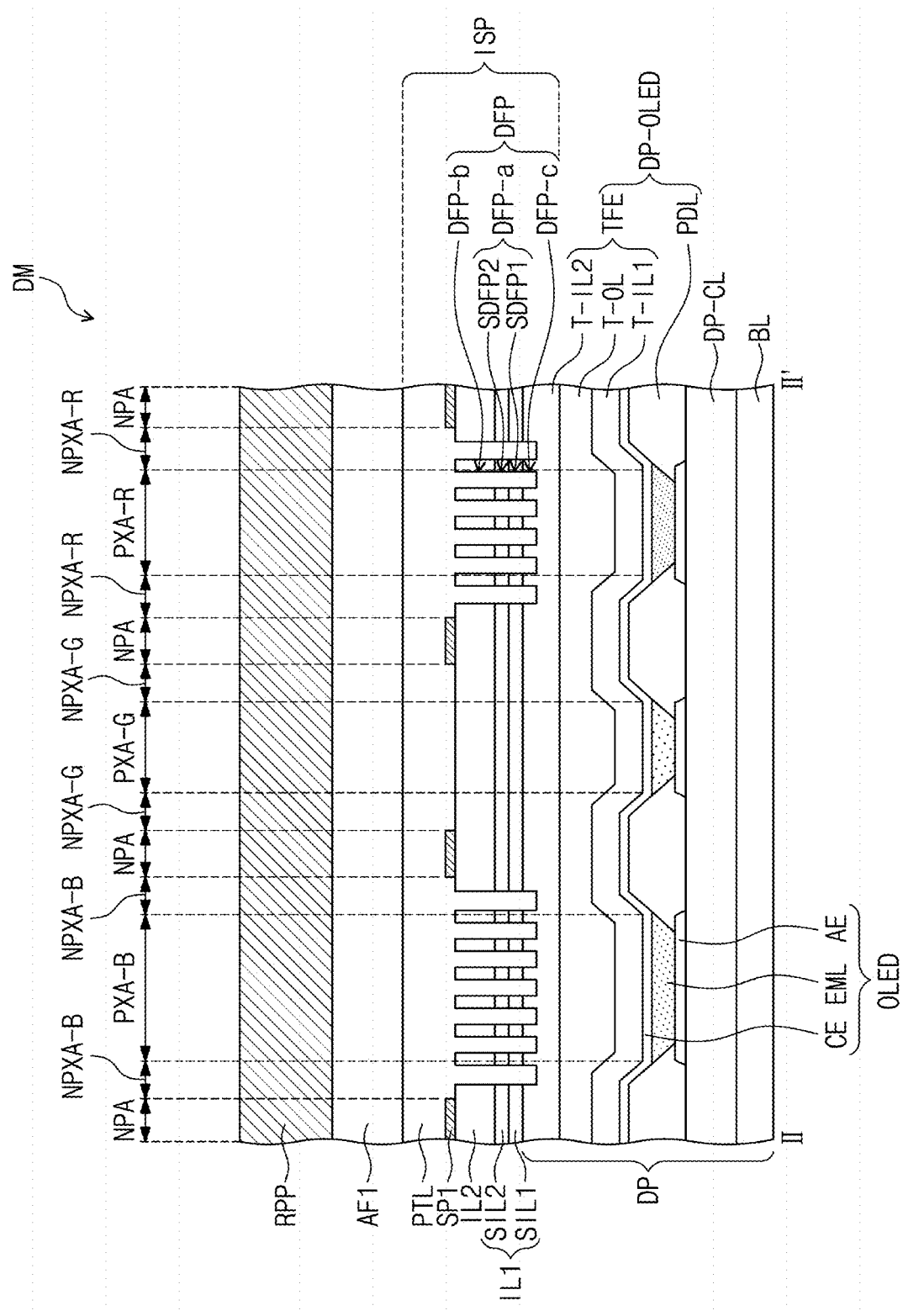

Referring to FIG. 14D, the encapsulation layer TFE may include the third layer diffraction patterns DFP-c disposed corresponding to the first sub layer diffraction pattern SDFP1 and the second sub-layer diffraction pattern SDFP2. Specifically, the third layer diffraction patterns DFP-c may be provided on the second encapsulation inorganic layer T-IL2 disposed on the uppermost side of the encapsulation layer TFE. The third layer diffraction patterns DFP-c may be in the form of a groove recessed from an upper surface of the second encapsulation inorganic layer T-IL2. However, embodiments are not limited thereto. That is, the third layer diffraction patterns DFP-c may be in the form of a hole passing through the second encapsulation inorganic layer T-IL2.

Figure 14E:
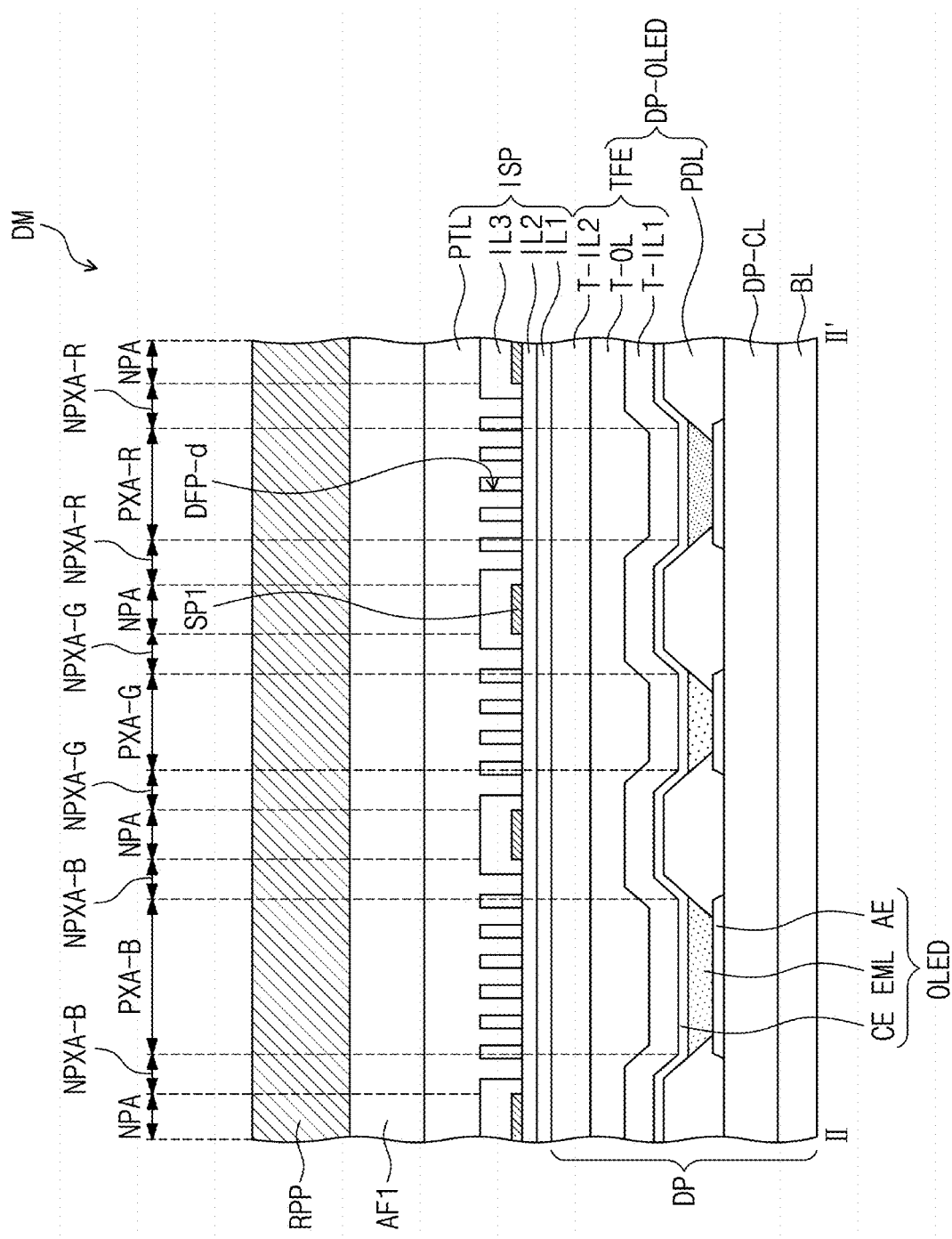

Referring to FIG. 14E, the input sensing unit ISP may further include a third insulating layer IL3 disposed between the protective layer PL and the second insulating layer IL2. The third insulating layer IL3 may include an inorganic material. For example, the third insulating layer IL3 may include at least one of a silicon nitride layer, a silicon oxide layer, and a silicon oxynitride layer. In an embodiment, the third insulating layer IL3 may have a greater thickness than the first insulating layer IL1 and the second insulating layer IL2.

In an embodiment, the plurality of diffraction patterns DFP-d may be provided in the third insulating layer IL3. The plurality of diffraction patterns DFP-d may have a similar structure to any one of the diffraction patterns shown in FIGS. 13A to 13G. The plurality of diffraction patterns DFP-d diffracts at least a portion of the light output from the emission layer EML. For instance, the diffraction patterns DFP-d diffract at least a portion of the light incident on the input sensing unit ISP.

In an embodiment, the diffraction patterns DFP-d each are in the form of a hole passing through the third insulating layer IL3. For example, the third insulating layer IL3 includes a plurality of diffraction patterns DFP-d defined by a plurality of holes passing through the third insulating layer IL3 in the third direction DR3. The second insulating layer IL2 may be partially exposed through the diffraction patterns DFP-d.

The protective layer PL may be disposed on the third insulating layer IL3. The diffraction patterns DFP-d may be filled by the protective layer PL. Accordingly, light output from each emission layer EML may be diffracted due to a difference in refractive index between the third insulating layer IL3 and the protective layer PL.

Figure 14F:
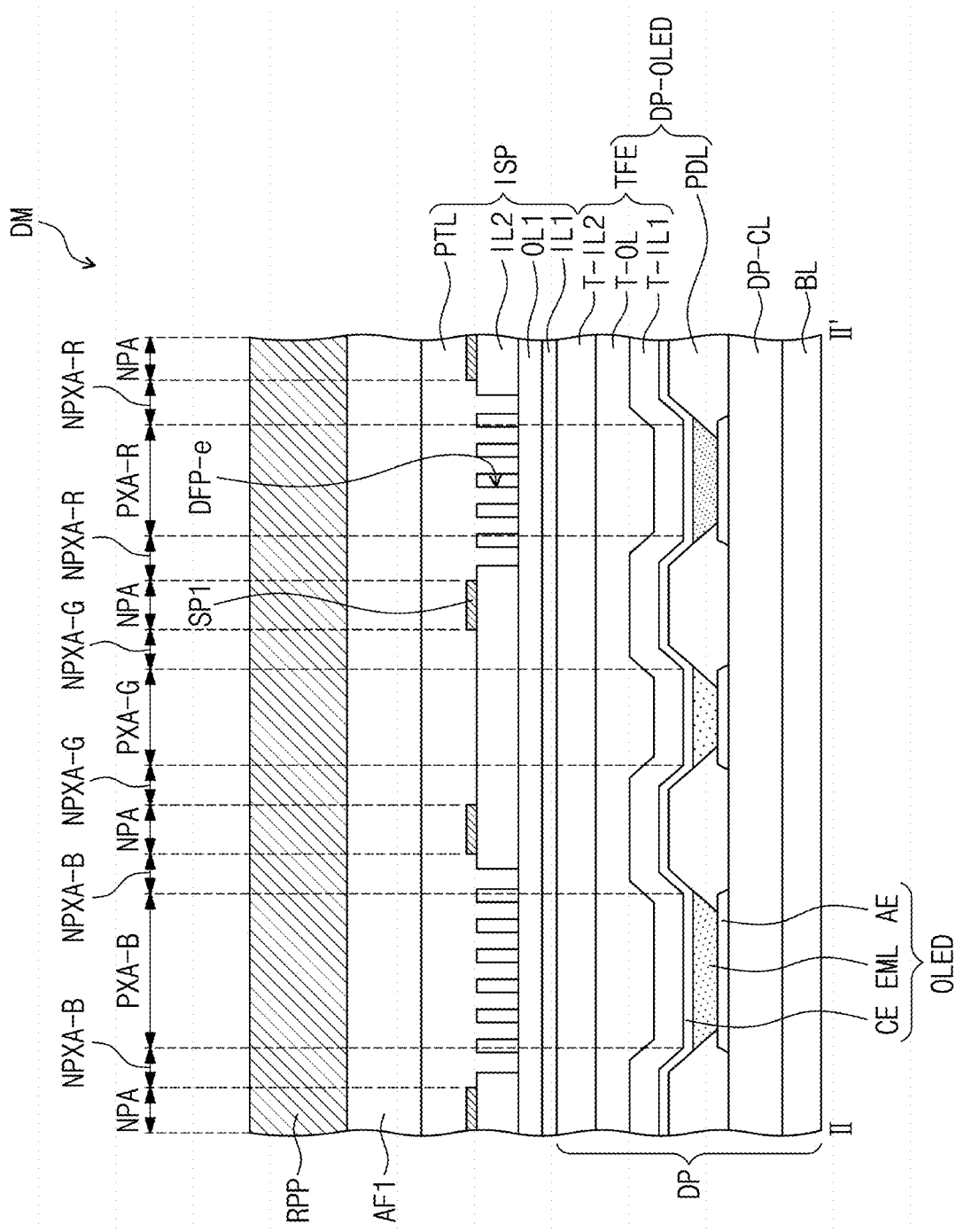

Referring to FIG. 14F, the input sensing unit ISP includes a plurality of diffraction patterns DFP-e formed in the second insulating layer IL2. The input sensing unit ISP further includes a fourth insulating layer OL1 disposed below the second insulating layer IL2. The fourth insulating layer OL1 may be disposed between the first insulating layer IL1 and the second insulating layer IL2. The fourth insulating layer OL1 may include an organic material. In an embodiment, the fourth insulating layer OL1 may include an acrylic-based resin. The fourth insulating layer OL1 may be formed of the same organic material as the protective layer PL, but the fourth insulating layer OL1 may be formed under different process conditions from the protective layer PL. The fourth insulating layer OL1 and the protective layer PL each may include a negative photoresist material, and a photocuring temperature of the fourth insulating layer OL1 may be higher than a photocuring temperature of the protective layer PL.

The fourth insulating layer OL1 may have a greater thickness than the first insulating layer IL1 and the second insulating layer IL2. In an embodiment, the fourth insulating layer OL1 may have a thickness of about 1.0 µm to about 10 µm. The fourth insulating layer OL1 is interposed between the first insulating layer IL1 and the second insulating layer IL2, and the distance between the diffraction patterns DFP-e provided in the second insulating layer IL2 and the organic light emitting diode OLED may increase.

Figure 14G:
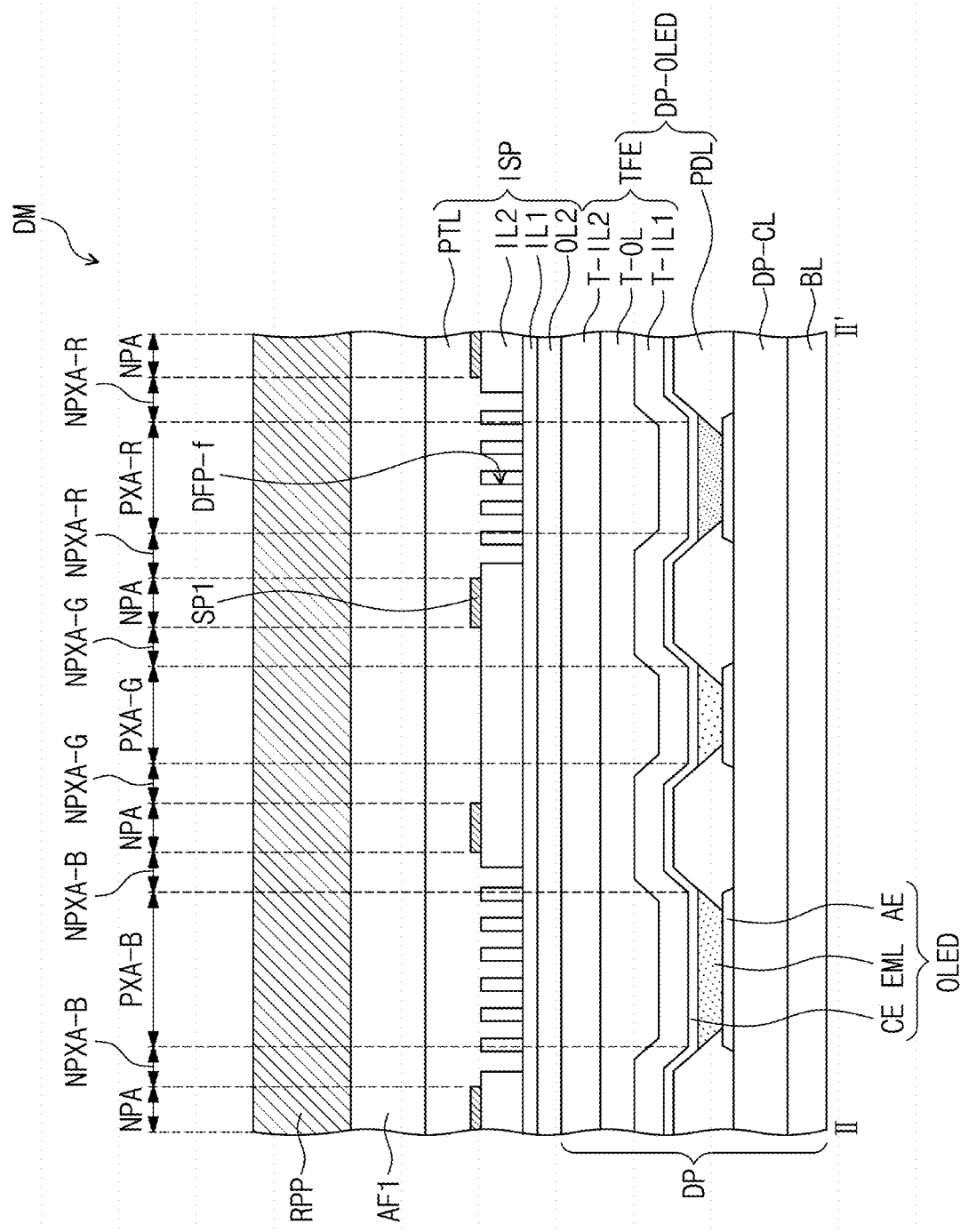

Referring to FIG. 14G, the input sensing unit ISP further includes a fifth insulating layer OL2 disposed below the second insulating layer IL2 in which diffraction patterns DFP-f are formed and the first insulating layer IL1. The fifth insulating layer OL2 may be disposed between the first insulating layer IL1 and the encapsulation layer TFE. For example, the fifth insulating layer OL2 is disposed between the first insulating layer IL1 and the second encapsulation inorganic layer T-IL2. The fifth insulating layer OL2 may include an organic material. In an embodiment, the fifth insulating layer OL2 may include an acrylic-based resin, but embodiments are not limited thereto. The fifth insulating layer OL2 may be formed of the same organic material as the protective layer PL, but the fifth insulating layer OL2 may be formed under different process conditions from the protective layer PL. The fifth insulating layer OL2 and the protective layer PL each may include a negative photoresist material, and a photocuring temperature of the fifth insulating layer OL2 may be higher than a photocuring temperature of the protective layer PL.

As in FIGS. 14F and 14G, to secure a desired value or the distance between the diffraction patterns DFP-e and DFP-f and the organic light emitting diode OLED, the thicknesses of each of the fourth insulating layer OL1 and the fifth insulating layer OL2 may be adjusted, or with/without the provision of the fourth insulating layer OL1 and the fifth insulating layer OL2 may be determined.

Figure 14H:
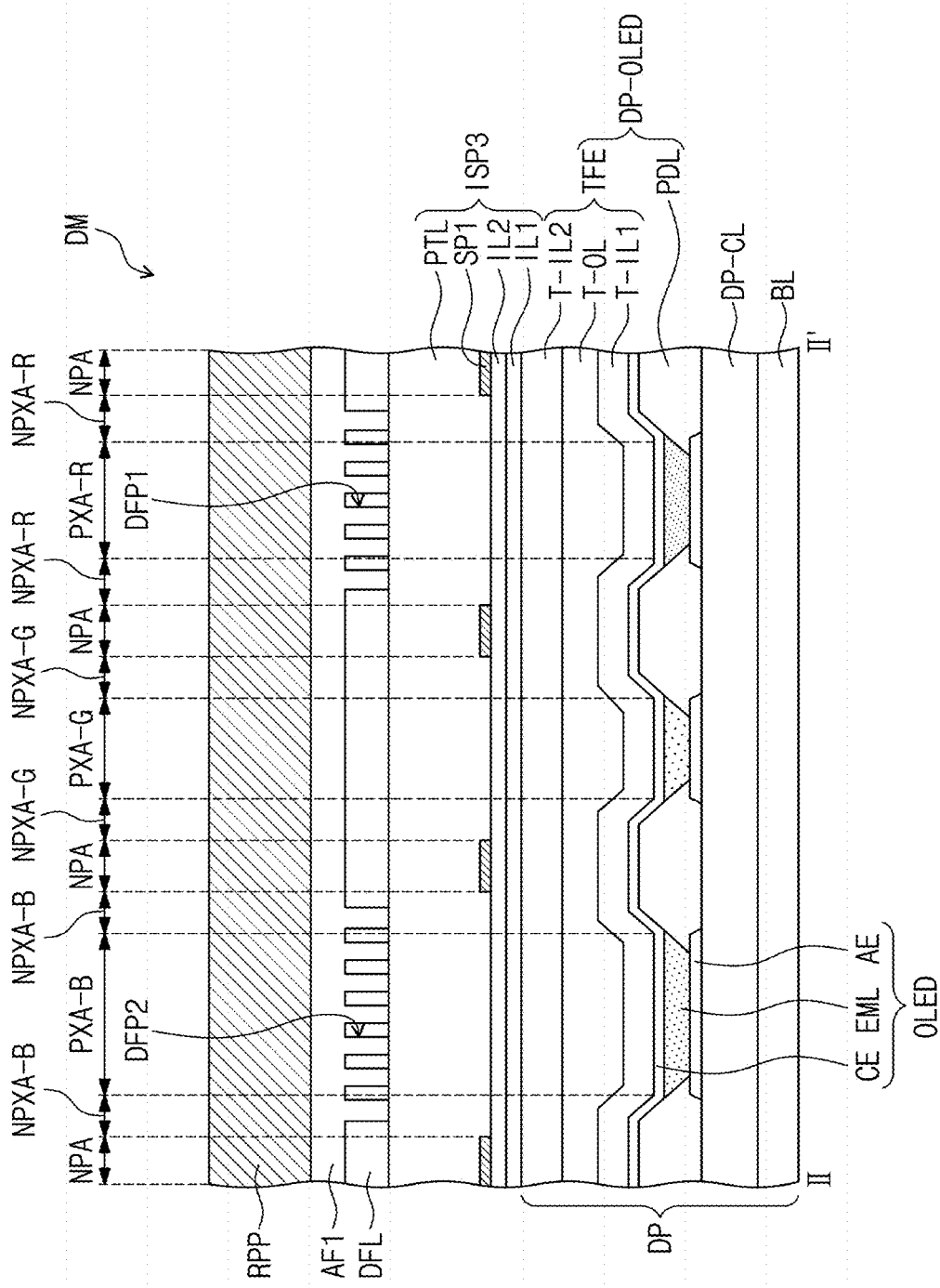

Referring to FIG. 14H, the display module DM according to an embodiment includes a diffraction pattern layer DFL diffracting at least a portion of light output from the display panel DP. The diffraction pattern layer DFL may include any one of an inorganic material or an organic material.

The diffraction pattern layer DFL includes a plurality of diffraction patterns DFP1 and DFP2 arranged to have a certain period. As an example, the diffraction pattern layer DFL may be disposed directly on the input sensing unit ISP3. For example, the diffraction pattern layer DFL may be disposed on the protective layer PL of the input sensing unit ISP3.

The plurality of diffraction patterns DFP1 and DFP2 may be arranged in accordance with some of the first to third pixels PX-R, PX-G, and PX-B, for example, first diffraction patterns DFP1 arranged corresponding to the first pixel PX-R. The plurality of diffraction patterns DFP1 and DFP2 may include second diffraction patterns DFP2 disposed to correspond to the second pixel PX-B.

The first and second diffraction patterns DFP1 and DFP2 each are in the form of a hole passing through the diffraction pattern layer DFL. For instance, the diffraction pattern layer DFL includes first diffraction patterns DFP1 and second diffraction patterns DFP2 defined by a plurality of holes passing through the diffraction pattern layer DFL. The protective layer PL disposed on the uppermost side of the input sensing unit ISP3 may be partially exposed through the first diffraction patterns DFP1 and the second diffraction patterns DFP2.

The first diffraction patterns DFP1 may overlap the first light emitting area PXA-R among the light emitting areas PXA-R, PXA-B, and PXA-G. In addition, the first diffraction patterns DFP1 may partially overlap the first non-light emitting area NPXA-R surrounding the first light emitting area PXA-R. The second diffraction patterns DFP2 may overlap the second light emitting area PXA-B among the light emitting areas PXA-R, PXA-B, and PXA-G. In addition, the second diffraction patterns DFP2 may partially overlap the second non-light emitting area NPXA-B surrounding the second light emitting area PXA-B.

A first adhesive film AF1 and an anti-reflection unit RPP may be disposed on the diffraction pattern layer DFL. The anti-reflection unit RPP may be bonded to the diffraction pattern layer DFL through the first adhesive film AF1. The first adhesive film AF1 may be formed to fill a space in which a plurality of diffraction patterns DFP-R are defined. However, embodiments are not limited thereto. As another example, the first adhesive film AF1 may be omitted, and an air layer may be formed in the plurality of diffraction patterns DFP-R.

As another example, a cover layer may be further disposed between the diffraction pattern layer DFL and the first adhesive film AF1. The cover layer may include an organic material or an inorganic material. In this case, the organic material may include at least one among an acrylic-based resin, a methacrylate-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin. In addition, the inorganic material may include at least one among aluminum oxide, titanium oxide, silicon oxide, silicon oxynitride, zirconium oxide, and hafnium oxide.

Figure 14I:
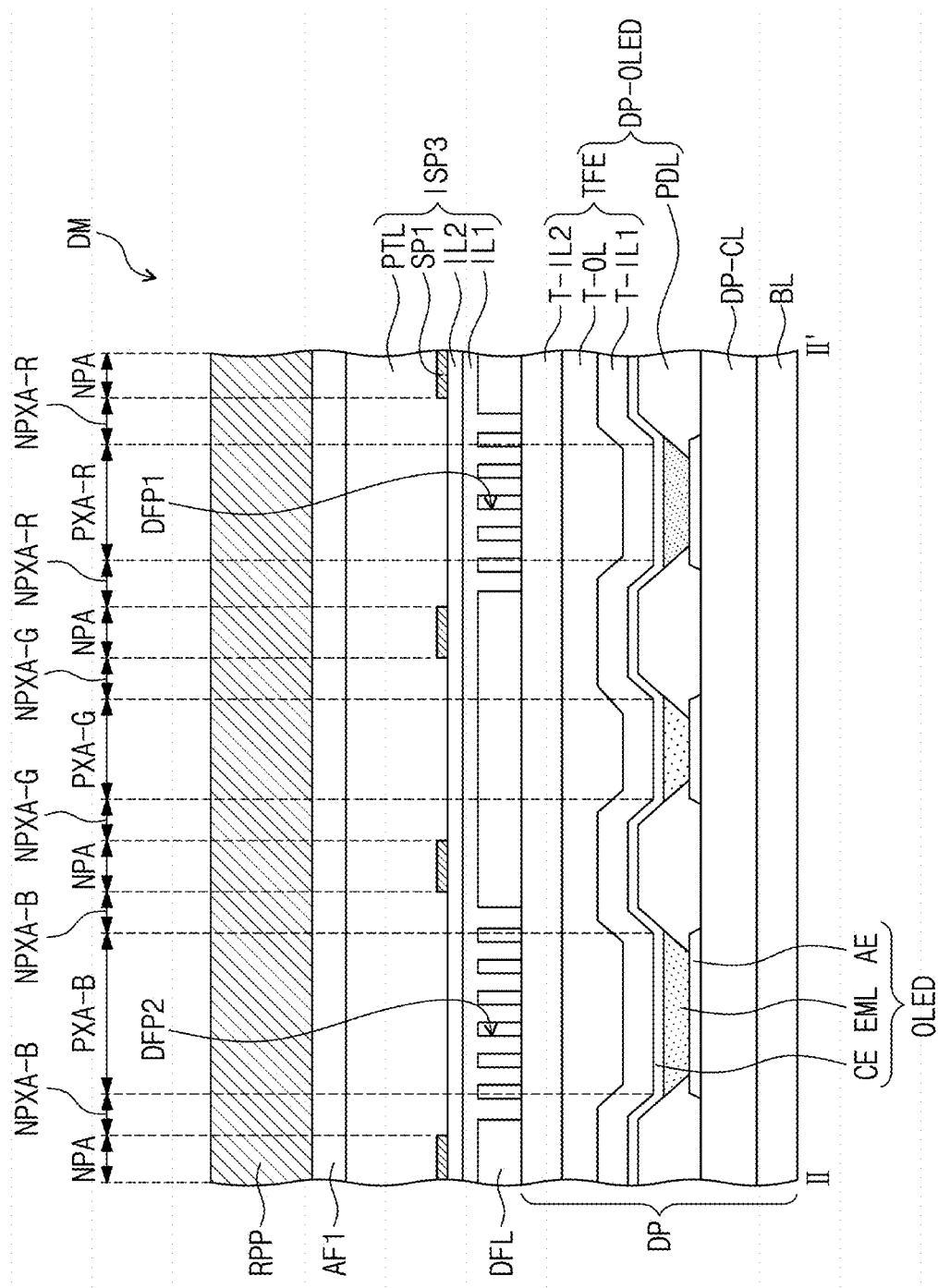

Referring to FIG. 14I, the diffraction pattern layer DFL may be disposed between the display panel DP and the input sensing unit ISP3. The diffraction pattern layer DFL may be disposed directly on the display panel DP. For example, the diffraction pattern layer DFL may be disposed directly on the encapsulation layer TFE of the display panel DP. In this case, the second encapsulation inorganic layer T-IL2 disposed on the uppermost side of the encapsulation layer TFE may be partially exposed through the first diffraction patterns DFP1 defined by a plurality of holes. In addition, in this case, the first insulating layer IL1 of the input sensing unit ISP3 may be formed to fill a space defined by the plurality of first diffraction patterns DFP1.

According to various embodiments, a color difference caused, at least in part, from an increase in viewing angles of a display device is enhanced, thereby improving overall viewing angle properties of the display device, and preventing a pattern having significant variations in color difference values according to azimuth from being caused. The display device may thus have improved azimuth properties.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
a display panel comprising pixels; and
a diffraction pattern layer comprising diffraction patterns arranged on the display panel and configured to diffract at least a portion of light from the pixels,
wherein the pixels comprise a first unit pixel and a second unit pixel, and
wherein the diffraction patterns comprise:
first unit diffraction patterns arranged on the first unit pixel and provided as a plurality of first holes passing through the diffraction pattern layer, the plurality of first holes being arranged at equal distances along first rows and first columns perpendicular to the first rows; and
second unit diffraction patterns arranged on the second unit pixel and provided as a plurality of second holes passing through the diffraction pattern layer, the plurality of second holes being arranged at equal distances along second rows and second columns perpendicular to the second rows, the second unit diffraction patterns having a different planar arrangement than the first unit diffraction patterns,
wherein an imaginary reference line crosses each of the pixels along a same direction, and
wherein the first rows have a different tilted angle relative to the imaginary reference line than each of the second rows and the second columns.

2. The display device of claim 1, wherein:
each of the first unit diffraction patterns has a first width; and
each of the second unit diffraction patterns has a second width different from the first width.

3. The display device of claim 1, wherein:
the first unit diffraction patterns are arranged with a first period; and
the second unit diffraction patterns are arranged with a second period different from the first period.

4. The display device of claim 1, wherein:
the pixels comprise:
first pixels configured to generate first light, the first pixels comprising a $1\text{-}1^{st}$ sub-pixel and a $1\text{-}2^{nd}$ sub-pixel; and
second pixels configured to generate second light having a different wavelength range than the first light, the second pixels comprising a $2\text{-}1^{st}$ sub-pixel and a $2\text{-}2^{nd}$ sub-pixel;
the diffraction patterns comprise:
$1\text{-}1^{st}$ sub-diffraction patterns arranged on the $1\text{-}1^{st}$ sub-pixel;
$1\text{-}2^{nd}$ sub-diffraction patterns arranged on the $1\text{-}2^{nd}$ sub-pixel;
$2\text{-}1^{st}$ sub-diffraction patterns arranged on the $2\text{-}1^{st}$ sub-pixel; and
$2\text{-}2^{nd}$ sub-diffraction patterns arranged on the $2\text{-}2^{nd}$ sub-pixel; and
at least two among the $1\text{-}1^{st}$ sub-diffraction patterns, the $1\text{-}2^{nd}$ sub-diffraction patterns, the $2\text{-}1^{st}$ sub-diffraction patterns, and the $2\text{-}2^{nd}$ sub-diffraction patterns have different planar arrangements.

5. The display device of claim 1, further comprising:
an input sensing unit disposed on the display panel, wherein:
the diffraction pattern layer is between the display panel and the input sensing unit; or
the input sensing unit is between the diffraction pattern layer and the display panel.

6. The display device of claim 5, wherein:
the display panel further comprises an encapsulation layer covering the pixels; and
the input sensing unit is disposed on the encapsulation layer.

7. The display device of claim 6, wherein the input sensing unit comprises:
a first insulating layer disposed on the encapsulation layer;
a first conductive layer disposed on the first insulating layer;
a second insulating layer covering the first conductive layer;
a second conductive layer disposed on the second insulating layer; and
a protective layer covering the second conductive layer and the second insulating layer.

8. The display device of claim 7, wherein the diffraction pattern layer is disposed on the protective layer.

9. The display device of claim 7, wherein the diffraction pattern layer is disposed between the encapsulation layer and the first insulating layer.

10. The display device of claim 7, wherein:
at least one of the first conductive layer and the second conductive layer comprises sensor units;
each of the sensor units comprises a mesh electrode disposed in the form of a mesh; and
the diffraction patterns do not overlap the mesh electrode in a plan view.

11. The display device of claim 1, wherein:
the pixels are respectively disposed in pixel areas on the display panel;
each of the pixel areas comprises:
a light emitting area in which a light emitting element is disposed, the light emitting element being configured to generate light; and
a non-light emitting area adjacent to the light emitting area; and
the diffraction patterns are disposed corresponding to at least the light emitting areas.

12. A display device comprising:
a display panel comprising pixels; and
an input sensing unit disposed on the display panel,
wherein the input sensing unit comprises:
a first insulating layer disposed on the display panel;
a first conductive layer disposed on the first insulating layer;
a second insulating layer covering the first conductive layer; and
a second conductive layer disposed on the second insulating layer,
wherein the pixels comprise a first unit pixel and a second unit pixel, and
wherein at least one of the first conductive layer and the second conductive layer comprises diffraction patterns, the diffraction patterns comprising:
first unit diffraction patterns arranged on the first unit pixel and provided as a plurality of first holes passing through the second insulating layer, the plurality of first holes being arranged at equal distances along first rows and first columns perpendicular to the first rows; and
second unit diffraction patterns arranged on the second unit pixel, the second unit diffraction patterns having a different planar arrangement than the first unit diffraction patterns, and provided as a plurality of second holes passing through the second insulating layer, the plurality of second holes being arranged at equal distances along second rows and second columns perpendicular to the second rows,
wherein an imaginary reference line crosses each of the pixels along a same direction, and
wherein the first rows have a different tilted angle relative to the imaginary reference line than each of the second rows and the second columns.

13. The display device of claim 12, wherein:
the pixels further comprise a third unit pixel and a fourth unit pixel; and
at least one of the first insulating layer and the second insulating layer further comprises:
third unit diffraction patterns arranged on the third unit pixel, the third unit diffraction patterns having a different planar arrangement than the first unit diffraction patterns and the second unit diffraction patterns; and
fourth unit diffraction patterns arranged on the fourth unit pixel, the fourth unit diffraction patterns having a different planar arrangement than the first unit diffraction patterns, the second unit diffraction patterns, and the third unit diffraction patterns.

14. The display device of claim 12, wherein the diffraction patterns comprise:
first layer diffraction patterns provided in the first insulating layer; and second layer diffraction patterns provided in the second insulating layer.

15. A display device comprising:
a display panel comprising:
  first pixels configured to generate first light; and
  second pixels configured to generate second light, the second light having a different wavelength range than the first light; and
a diffraction pattern layer comprising:
  first diffraction patterns arranged on the display panel, the first diffraction patterns being configured to diffract at least a portion of the first light, and
  second diffraction patterns arranged on the display panel, the second diffraction patterns being configured to diffract at least a portion of the second light,
wherein the first pixels comprise a $1\text{-}1^{st}$ sub-pixel and a $1\text{-}2^{nd}$ sub-pixel,
wherein the second pixels comprise a $2\text{-}1^{st}$ sub-pixel and a $2\text{-}2^{nd}$ sub-pixel,
wherein the first diffraction patterns comprise:
  $1\text{-}1^{st}$ sub-diffraction patterns arranged on the $1\text{-}1^{st}$ sub-pixel; and
  $1\text{-}2^{nd}$ sub-diffraction patterns arranged on the $1\text{-}2^{nd}$ sub-pixel,
wherein the second diffraction patterns comprise:
  $2\text{-}1^{st}$ sub-diffraction patterns arranged on the $2\text{-}1^{st}$ sub-pixel; and
  $2\text{-}2^{nd}$ sub-diffraction patterns arranged on the $2\text{-}2^{nd}$ sub-pixel,
wherein at least two among the $1\text{-}1^{st}$ sub-diffraction patterns, the $1\text{-}2^{nd}$ sub-diffraction patterns, the $2\text{-}1^{st}$ sub-diffraction patterns, and the $2\text{-}2^{nd}$ sub-diffraction patterns have different planar arrangements,
wherein the first diffraction patterns are provided as a plurality of first holes passing through the diffraction pattern layer, the plurality of first holes being arranged at equal distances along first rows and first columns perpendicular to the first rows,
wherein the second diffraction patterns are provided as a plurality of second holes passing through the diffraction pattern layer, the plurality of second holes being arranged at equal distances along second rows and second columns perpendicular to the second rows,
wherein an imaginary reference line crosses each of the pixels along a same direction, and
wherein the first rows have a different tilted angle relative to the imaginary reference line than each of the second rows and the second columns.

16. The display device of claim 15, wherein:
the first light is red light; and
the second light is blue light.

17. The display device of claim 15, wherein:
the display panel further comprises third pixels configured to generate third light having a different wavelength range from the first light and the second light; and
the diffraction pattern layer further comprises third diffraction patterns disposed on the display panel, the third diffraction patterns being configured to diffract at least a portion of the third light.

* * * * *